US008565298B2

(12) United States Patent
Schwartz

(10) Patent No.: US 8,565,298 B2
(45) Date of Patent: Oct. 22, 2013

(54) ENCODER RATE CONTROL

(75) Inventor: Edward L. Schwartz, Sunnyvale, CA (US)

(73) Assignee: Ricoh Co., Ltd., Tokyo (JP)

(*) Notice: Subject to any disclaimer, the term of this patent is extended or adjusted under 35 U.S.C. 154(b) by 1449 days.

(21) Appl. No.: 11/928,217

(22) Filed: Oct. 30, 2007

(65) Prior Publication Data

US 2008/0063070 A1 Mar. 13, 2008

Related U.S. Application Data

(60) Division of application No. 10/318,962, filed on Dec. 12, 2002, now Pat. No. 7,321,695, which is a division of application No. 09/435,313, filed on Nov. 5, 1999, now Pat. No. 6,549,666, which is a division of application No. 08/847,074, filed on May 1, 1997, now abandoned, which is a continuation-in-part of application No. 08/643,268, filed on May 3, 1996, now Pat. No. 5,966,465, which is a continuation-in-part of application No. 08/498,036, filed on Jun. 30, 1995, now Pat. No. 5,867,602, which is a continuation-in-part of application No. 08/310,146, filed on Sep. 21, 1994, now Pat. No. 5,748,786.

(51) Int. Cl.
*H04N 11/02* (2006.01)

(52) U.S. Cl.
USPC .............................. 375/240; 341/67; 382/239

(58) Field of Classification Search
USPC .................. 341/67; 375/240; 382/166–251
See application file for complete search history.

(56) References Cited

U.S. PATENT DOCUMENTS

| 3,580,655 A | 5/1971 | Leith et al. |
| 3,950,103 A | 4/1976 | Schmidt-Weinmar |
| 4,136,954 A | 1/1979 | Jamieson |
| 4,155,097 A | 5/1979 | Lux |
| 4,190,861 A | 2/1980 | Lux |
| 4,223,354 A | 9/1980 | Noble et al. |
| 4,393,456 A | 7/1983 | Marshall, Jr. |
| 4,437,087 A | 3/1984 | Petr |
| 4,569,075 A | 2/1986 | Nussbaumer |
| 4,599,567 A | 7/1986 | Goupillaud et al. |

(Continued)

FOREIGN PATENT DOCUMENTS

| DE | 195 49 491 C2 | 8/1995 |
| DE | 195 34 943 A1 | 3/1996 |

(Continued)

OTHER PUBLICATIONS

"Efficient context-based entropy coding for lossy wavelet image compression" by Chrysafis et al.*

(Continued)

*Primary Examiner* — William C Vaughn, Jr.
*Assistant Examiner* — Luis M Perez
(74) *Attorney, Agent, or Firm* — Blakely, Sokoloff, Taylor & Zafman LLP

(57) ABSTRACT

A method and apparatus for performing compression and/or decompression is described. In one embodiment, the present invention comprises a system having a buffer, a wavelet transform unit, and a coder. The wavelet transform unit has an input coupled to the buffer to perform a wavelet transform on pixels stored therein and to generate coefficients at an output. The coder is coupled to the wavelet transform unit to code the transformed pixels received from the buffer.

12 Claims, 46 Drawing Sheets

(56) References Cited

U.S. PATENT DOCUMENTS

| | | | |
|---|---|---|---|
| 4,652,881 A | 3/1987 | Lewis |
| 4,663,660 A | 5/1987 | Fedele et al. |
| 4,674,125 A | 6/1987 | Carlson et al. |
| 4,701,006 A | 10/1987 | Perlmutter |
| 4,751,742 A | 6/1988 | Meeker |
| 4,760,563 A | 7/1988 | Beylkin |
| 4,785,348 A | 11/1988 | Fonsalas et al. |
| 4,785,349 A | 11/1988 | Keith et al. |
| 4,799,179 A | 1/1989 | Masson et al. |
| 4,805,129 A | 2/1989 | David |
| 4,815,023 A | 3/1989 | Arbeiter |
| 4,817,182 A | 3/1989 | Adelson et al. |
| 4,821,223 A | 4/1989 | David |
| 4,827,336 A | 5/1989 | Acampora et al. |
| 4,829,378 A | 5/1989 | Le Gall |
| 4,837,517 A | 6/1989 | Barber |
| 4,839,889 A | 6/1989 | Gockler |
| 4,858,017 A | 8/1989 | Torbey |
| 4,864,398 A | 9/1989 | Avis et al. |
| 4,868,868 A | 9/1989 | Yazu et al. |
| 4,881,075 A | 11/1989 | Weng |
| 4,894,713 A | 1/1990 | Delogne et al. |
| 4,897,717 A | 1/1990 | Hamilton et al. |
| 4,899,147 A | 2/1990 | Schiavo et al. |
| 4,904,073 A | 2/1990 | Lawton et al. |
| 4,918,524 A | 4/1990 | Ansari et al. |
| 4,922,544 A | 5/1990 | Stansfield et al. |
| 4,929,223 A | 5/1990 | Walsh |
| 4,929,946 A | 5/1990 | O'Brien et al. |
| 4,936,665 A | 6/1990 | Whitney |
| 4,972,484 A | 11/1990 | Theile et al. |
| 4,973,961 A | 11/1990 | Chamzas et al. |
| 4,974,187 A | 11/1990 | Lawton |
| 4,982,283 A | 1/1991 | Acampora |
| 4,985,927 A | 1/1991 | Norwood et al. |
| 4,987,480 A | 1/1991 | Lippman et al. |
| 4,999,705 A | 3/1991 | Puri |
| 5,000,183 A | 3/1991 | Bonnefous |
| 5,001,764 A | 3/1991 | Wood et al. |
| 5,014,134 A | 5/1991 | Lawton et al. |
| 5,018,210 A | 5/1991 | Merryman et al. |
| 5,049,992 A | 9/1991 | Citta et al. |
| 5,049,993 A | 9/1991 | Le Gall et al. |
| 5,068,911 A | 11/1991 | Resnikoff et al. |
| 5,072,308 A | 12/1991 | Lin et al. |
| 5,073,964 A | 12/1991 | Resnikoff |
| 5,081,645 A | 1/1992 | Resnikoff et al. |
| 5,095,447 A | 3/1992 | Manns et al. |
| 5,097,261 A | 3/1992 | Langdon, Jr. et al. |
| 5,097,331 A | 3/1992 | Chen et al. |
| 5,101,280 A | 3/1992 | Moronaga et al. |
| 5,101,446 A | 3/1992 | Resnikoff et al. |
| 5,103,306 A | 4/1992 | Weiman et al. |
| 5,109,451 A | 4/1992 | Aono et al. |
| 5,121,191 A | 6/1992 | Cassereau et al. |
| 5,124,930 A | 6/1992 | Nicolas et al. |
| 5,128,757 A | 7/1992 | Citta et al. |
| 5,128,791 A | 7/1992 | LeGall et al. |
| 5,148,498 A | 9/1992 | Resnikoff et al. |
| 5,152,953 A | 10/1992 | Ackermann |
| 5,156,943 A | 10/1992 | Whitney |
| 5,173,880 A | 12/1992 | Duren et al. |
| 5,182,645 A | 1/1993 | Breeuwer et al. |
| 5,223,926 A | 6/1993 | Stone et al. |
| 5,235,434 A | 8/1993 | Wober |
| 5,241,395 A | 8/1993 | Chen |
| 5,262,958 A | 11/1993 | Chui et al. |
| 5,276,525 A | 1/1994 | Gharavi |
| 5,315,670 A | 5/1994 | Shapiro |
| 5,321,776 A | 6/1994 | Shapiro |
| 5,335,016 A | 8/1994 | Nakagawa |
| 5,347,479 A | 9/1994 | Miyazaki |
| 5,349,348 A | 9/1994 | Anderson et al. |
| 5,379,355 A | 1/1995 | Allen |
| 5,381,145 A | 1/1995 | Allen et al. |
| 5,384,869 A | 1/1995 | Wilkinson et al. |
| 5,400,075 A * | 3/1995 | Savatier ............... 375/240.23 |
| 5,412,741 A | 5/1995 | Shapiro |
| 5,414,780 A | 5/1995 | Carnahan |
| 5,416,604 A | 5/1995 | Park |
| 5,420,891 A | 5/1995 | Akansu |
| 5,436,626 A * | 7/1995 | Fujiwara et al. ............. 341/67 |
| 5,442,458 A | 8/1995 | Rabbani et al. |
| 5,453,945 A | 9/1995 | Tucker et al. |
| 5,455,874 A | 10/1995 | Ormsby et al. |
| 5,471,207 A * | 11/1995 | Zandi et al. ................ 341/107 |
| 5,481,308 A | 1/1996 | Hartung et al. |
| 5,495,292 A | 2/1996 | Zhang et al. |
| 5,497,435 A | 3/1996 | Berger |
| 5,511,151 A | 4/1996 | Russell et al. |
| 5,534,925 A | 7/1996 | Zhong |
| 5,537,493 A | 7/1996 | Wilkinson |
| 5,541,594 A | 7/1996 | Huang et al. |
| 5,546,477 A | 8/1996 | Knowles et al. |
| 5,563,960 A | 10/1996 | Shapiro |
| 5,563,961 A * | 10/1996 | Rynderman et al. ......... 382/239 |
| 5,566,089 A | 10/1996 | Hoogenboom |
| 5,602,589 A | 2/1997 | Vishwanath et al. |
| 5,631,977 A | 5/1997 | Koshi |
| 5,638,498 A | 6/1997 | Tyler et al. |
| 5,644,305 A * | 7/1997 | Inoue et al. .................... 341/67 |
| 5,657,085 A | 8/1997 | Katto |
| 5,701,367 A | 12/1997 | Koshi et al. |
| 5,717,789 A | 2/1998 | Anderson et al. |
| 5,748,786 A | 5/1998 | Zandi et al. |
| 5,754,793 A | 5/1998 | Eom et al. |
| 5,761,343 A * | 6/1998 | Haruma et al. ............... 382/236 |
| 5,808,683 A | 9/1998 | Tong et al. |
| 5,809,176 A | 9/1998 | Yajima |
| 5,850,482 A | 12/1998 | Meany et al. |
| 5,867,602 A | 2/1999 | Zandi et al. |
| 5,880,856 A | 3/1999 | Ferriere |
| 5,966,465 A | 10/1999 | Keith et al. |
| 6,002,718 A * | 12/1999 | Roth ............................ 375/240 |
| 6,020,975 A | 2/2000 | Chen et al. |
| 6,026,198 A | 2/2000 | Okada |
| 6,088,062 A | 7/2000 | Kanou et al. |
| 6,101,279 A | 8/2000 | Nguyen et al. |
| 6,118,902 A | 9/2000 | Knowles |
| 6,121,970 A | 9/2000 | Guedalia |
| 6,128,413 A | 10/2000 | Benamara |
| 6,160,846 A | 12/2000 | Chiang |
| 6,195,465 B1 | 2/2001 | Zandi et al. |
| 6,201,897 B1 | 3/2001 | Nixon |
| 6,229,929 B1 | 5/2001 | Lynch et al. |
| 6,236,765 B1 | 5/2001 | Acharya |
| 6,237,010 B1 | 5/2001 | Hui et al. |
| 6,263,109 B1 | 7/2001 | Ordentlich et al. |
| 6,263,120 B1 | 7/2001 | Matsuoka |
| 6,327,392 B1 | 12/2001 | Li |
| 6,330,666 B1 | 12/2001 | Wise et al. |
| 6,339,658 B1 | 1/2002 | Moccagatta et al. |
| 6,350,989 B1 | 2/2002 | Lee et al. |
| 6,356,668 B1 | 3/2002 | Honsinger et al. |
| 6,466,698 B1 | 10/2002 | Creusere |
| 6,483,946 B1 | 11/2002 | Martucci et al. |
| 6,546,143 B1 | 4/2003 | Taubman et al. |
| 6,625,321 B1 | 9/2003 | Li et al. |
| 6,650,782 B1 | 11/2003 | Joshi et al. |
| 6,668,090 B1 | 12/2003 | Joshi et al. |
| 6,865,291 B1 * | 3/2005 | Zador ........................... 382/166 |
| 7,016,545 B1 * | 3/2006 | Schwartz et al. ............. 382/239 |
| 2001/0021223 A1 | 9/2001 | Andrew |
| 2001/0047517 A1 | 11/2001 | Christopoulos et al. |
| 2003/0110299 A1 | 6/2003 | Larsson et al. |

FOREIGN PATENT DOCUMENTS

| | | |
|---|---|---|
| DE | 195 34 730 A1 | 5/1996 |
| DE | 196 26 600 A1 | 1/1997 |
| DE | 196 26 615 A1 | 1/1997 |
| EP | 0510933 A1 | 10/1992 |
| EP | 0593013 A2 | 4/1994 |
| EP | 0611051 A1 | 8/1994 |

(56) References Cited

FOREIGN PATENT DOCUMENTS

| | | |
|---|---|---|
| EP | 0622741 A2 | 11/1994 |
| EP | 701375 A2 | 3/1996 |
| EP | 0967556 A2 | 12/1999 |
| EP | 1035511 A2 | 9/2000 |
| EP | 1164781 A1 | 12/2001 |
| GB | 2 211 691 A | 7/1989 |
| GB | 2 284 121 A | 5/1995 |
| GB | 2 285 374 A | 7/1995 |
| GB | 2 293 733 A | 4/1996 |
| GB | 2 293 734 A | 4/1996 |
| GB | 2 303 030 A | 2/1997 |
| GB | 2 303 031 A | 2/1997 |
| GB | 2 341 035 A | 3/2000 |
| JP | 406038193 A | 7/1992 |
| JP | 06-245077 | 9/1994 |
| JP | 6-350989 | 12/1994 |
| JP | 7-79350 | 3/1995 |
| WO | WO 88/04117 | 6/1988 |
| WO | WO 88/10049 | 12/1988 |
| WO | WO 91/03902 | 3/1991 |
| WO | WO 91/18361 | 11/1991 |
| WO | WO 93/10634 | 11/1991 |
| WO | WO 91/18361 | 5/1993 |
| WO | WO 93/10634 | 5/1993 |
| WO | WO 94/17492 | 8/1994 |
| WO | WO 94/23385 | 10/1994 |
| WO | WO 95/19683 | 7/1995 |
| WO | WO 96/09718 | 3/1996 |
| WO | WO 00/49571 | 8/2000 |
| WO | WO 01/16764 A1 | 3/2001 |

OTHER PUBLICATIONS

Antonini, et al., "Image Coding Using Wavelet Transform", *IEEE Transactions on Image Processing*, vol. 1, No. 2, Apr. 1992, pp. 205-220.

Blumberg, et al., "Visual Realism and Interativity for the Internet", IEEE, 1997, pp. 269-273.

Boliek, et al., "Decoding compression with reversible embedded wavelets (CREW) codestreams", Journal of Electronic Imaging, Jul. 1998, vol. 7 (3), pp. 402-409.

Boliek, et al., "JPEG 2000 for Efficient Imaging in a Client/Server Environment", Proceeding of the PIE, SPIE, Bellingham, VA, US, vol. 4472, Jul. 31, 2001, pp. 212-223, XP008010308.

Boliek, et al., "JPEG 2000 Next Generation Image Compression System", IEEE 0-7803-6297, 45-48.

Calderbank, et al., "Wavelet Transforms That Map Integers to Integers", Aug. 1996.

Carey, et al: "Regularity-Preserving Image Interpolation", IEEE Transactions on Image Processing, vol. 8., No. 9, Sep. 1999, pp. 1293-1297, XP002246254.

Carrato, et al: "A Simple Edge-Sensitive Image Interpolation Filter", Proceedings of the International Confrence on Image Processing (ICIP) Lausanne, Sep. 16-19, 1996, New York, IEEE, US, vol. 1, pp. 711-714, XP010202493.

Chen, et al., "Wavelet Pyramid Image Coding with Predictable and Controllable Subjective Picture Quality", *IEICE Trans. Fundamentals*, vol. E76-A., No. 9, Sep. 1993, pp. 1458-1468.

Cheong, et al., "Subband Image Coding with Biorthogonal Wavelets", *IEICE Trans. Fundamentals*, vol. E75-A., No. 7, Jul. 1992, pp. 871-881.

Chrysafis, et al., "An Algorith for Low Memory Wavelet Image Compression", IEEE 0-7803-5467-2/99, p. 354-358.

Chrysafis, et al., "Line Based Reduced Memory, Wavelet Image Compression," Data Compression Conference, 1998, DCC '98, Proceedings Snowbird, UT, Mar. 1998, pp. 398-407.

Chui, et al., "Wavelets on a Bounded Interval", *Numerical Methods of Approximation Theory*, vol. 9, 1992, p. 53-75.

Crochiere, et al., "Digital Coding of Speech in Sub-bands", 1976, American Telephone and Telegraph Company, The Bell System Technical Journal, vol. 55, No. 8, Oct. 1976, p. 1069-1085.

Denk, et al., "Architectures for Lattice Structure Based Orthonormal Discrete Wavelet Transforms", IEEE, 1994, pp. 259-270.

Deshpande, et al., "HTTP Streaming of JPEG2000 Images", IEEE, 2001, pp. 15-19.

Dutch Search Report, 133082, Nov. 26, 1996.

Esteban, et al., "1977 IEEE International Conference on Acoustics, Speech & Signal Processing", "Application of Quadrature Mirror Filters to Split Band Voice Coding Schemes", p. 191-195.

French Search Report, FR9511023, Nov. 26, 1996.

French Search Report, FR9511024, Nov. 26, 1996.

German Search Report, Dated Mar. 21, 1997, 3 pages.

Gharavi, et al., "Proceedings: ICASSP 87", 1987 International Conference on Acoustics, Speech, and Signal Processing, Apr. 6, 7, 8, 9, 1987, vol. 4 of 4, "Application of Quadrature Mirror Filtering to the Coding of Monochrome and Color Images", p. 2384-2387.

Gharavi, et al., "Sub-band Coding of Digital Images Using Two-Dimensional Quadrature Mirror Filtering:, SPIE vol. 707 Visual Communications and Image Processing", 1986, p. 51-61.

Gordon, Benjamin M., et al., "A 1.2 mW Video-Rate 2-D Color Subband Decoder," IEEE Journal of Solid-State Circuits, IEEE Inc. New York, vol. 30, No. 12, Dec. 1, 1995, pp. 1510-1516.

Hauf, et al., "The FlashPix™ Image File Format", The Fourth Color Imaging Conference: Color Science, Systems and Application, 1996, pp. 234-238.

Howard, et al., "Fast and Efficient Lossless Image Compression", *IEEE*, 1993, pp. 351-360.

Information Technology—JPEG 2000 Image Coding System—Part 1: Core Coding System, ISO/IEC 15444-1, Dec. 15, 2000, p. 5, 14, 22.

International Search Report for Application No. GB 9518298.6, dated Nov. 8, 1995.

JPEG 2000 Part 1 Final Committee Draft Version 1.0, Image Compression Standard described in ISO/IEC 1/SC 29/WG 1 N1646, Mar. 16, 2000.

Komatsu, et al., "Reversible Subband Coding of Images", SPIE vol. 2501, pp. 676-648.

Langdon, Jr., "Sunset: A Hardware-Oriented Algorithm for Lossless Compression of Gray Scale Images", *SPIE vol. 1444, Image Capture, Formatting, and Display*, 1991, pp. 272-282.

Le Gall, et al., "Sub-band coding of Digital Images Using Symmetric Short Kernal Filters and Arithmetic Coding Techniques", 1988, International Conference on Acoustics, Speech and Signal Processing, pp. 761-764.

Lewis, et al., "Image Compression Using the 2-D Wavelet Transform", *IEEE Transactions on Image Processing*, vol. 1, No. 2, Apr. 1992, pp. 244-250.

Lux, P., "A Novel Set of Closed Orthogonal Functions for Picture Coding", 1977, pp. 267-274.

Marcellin, et al., "An Overview of JPEG-2000", Proceedings. DCC 2000 Snowbird, UT, USA, Mar. 28-30, 2000, pp. 523-541, XP010377392.

Meng, Teresa H., "A Wireless Portable Video-on-Demand System," VLSI Design, 1998, Proceedings Eleventh International Conference on Chennai, India 407, Jan. 1998, California, pp. 4-9.

Ohta, et al., "Wavelet Picture Coding with Transform Coding Approach", Jul. 1992, No. 7, pp. 776-784.

Padmanabhan, et al., "Feedback-Based Orthogonal Digital Filters", *IEEE Transactions on Circuits and Systems*, Aug. 1993, No. 8, pp. 512-525.

Pollara et al., "Rate-distortion Efficiency of Subband Coding with Integer Coefficient Filters", Jul. 1994, p. 419, Information Theory, 1994, IEEE.

Reeves, et al: "Multiscale-Based Image Enhancement", Electrical and Computer Engineering, 1997. Engineering Innovation: Voyage of Discovery. IEEE 1997 Canadian Conference on St. Johns, NFLD., Canada May 25-28, 1997, New York, NY. (pp. 500-503), XP010235053.

Reusens, "New Results in Subband/Wavelet Image Coding", May 1993, p. 381-385.

Said, et al., "Image Compression Using the Spatial-Orientation Tree", *IEEE*, 1993, pp. 279-282.

Said, et al., "Reversible Image Compression Via Multiresolution representation and Predictive Coding", Aug. 11, 1993, pp. 664-674.

(56) References Cited

OTHER PUBLICATIONS

Shah, et al., "A Chip Set for Lossless Image Compression", *IEEE Journal of Solid-State Circuits*, vol. 26, No. 3, Mar. 1991, pp. 237-244.

Shapiro, J. M., "An Embedded Hierarchical Image Coder Using Zerotrees of Wavelet Coefficients", *IEEE*, 1993, pp. 214-223.

Shapiro, J. M., "Embedded Image Coding Using Zerotrees of Wavelet Coefficients", *IEEE Transactions on Signal Processing*, Dec. 1993, No. 12, pp. 3445-3462.

Smith, et al., "Exact Reconstruction Techniques for Tree-Structured Subband Coders", IEEE Transactions on Acoustics, Speech, and Signal Processing, vol. ASSP-34, No. 3, Jun. 1986, p. 434-441.

Stoffel, et al: "A Survey of Electronic Techniques for Pictorial Image Reproduction," IEEE Transactions on Communications, vol. COM-29, No. 12, Dec. 1981, pp. 1898-1925, XP000560531 IEEE, New York (US).

Szu, et al., "Image Wavelet Transforms Implemented by Discrete Wavelet Chips", *Optical Engineering*, Jul. 1994, vol. 33, No. 7, pp. 2310-2325.

Vetterli, Martin, "Filter Banks Allowing Perfect Reconstruction", Signal Processing 10 (1986), p. 219-244.

Vetterli, Martin, "Multi-Dimensional Sub-band Coding: Some Theory and Algorithms", Signal Processing 6 (1984) p. 97-112.

Villasenor, et al., "Filter Evaluation and Selection in Wavelet Image Compression", *IEEE*, 1994, pp. 351-360.

Westernick, et al., "Proceedings: ICASSP 87", 1987 International Conference on Acoustics, Speech, and Signal Processing, Apr. 6, 7, 8, 9, 1987, vol. 3 of 4, "Sub-band coding of Images Using Predictive Vector Quantization", p. 1378-1381.

Woods, "Subband Image Coding", 1991, pp. 101-108, 163-167, and 180-189.

Woods, et al., "Subband Coding of Images", *IEEE Transactions on Acoustics, Speech, and Signal Processing*, vol. 1 ASSP-34, No. 5, Oct. 1986, pp. 1278-1288.

Woods, et al., "Sub-band coding of Images", Proceedings ICASSP 86, Tokyo, Japan, Apr. 1986, p. 1005-1008.

Wu, et al., "New Compression Paradigms in JPEG2000", Applications of Digital Image Processing XXIII, San Diego, CA USA, Jul. 31-Aug 3, 2000, vol. 4115, pp. 418-429, XP008013391, Proceedings of the DPIE—The International Society for Optical Engineering, 2000, SPIE-Int. Soc. Opt. Eng., USA.

Xiong, et al., "Joint Optimization of Scalar and Tree-structured Quantization of Wavelet Image Decompositions", Jan. 11, 1993, pp. 891-895.

Wu, et al., On Optimal Multi-resolution Scalar Quantization, Proceedings DCC 2002, Data Compression Conference, Apr. 2-4, 2002, Snowbird, Utah, IEEE Computer Society, Los Alamitos, California, Washington, Brussels, Tokyo, pp. 322-331.

U.S. Appl. No. 08/310,141, Sep. 20, 1994, Zandi et al.

"ISO/IEC 11172-3: 1993 (E)", C.1.5.3-C.1.5.4.4.8, pp. 80-110.

European International Search Report for European Appln No. US09/823,733, mailed May 19, 2006 (4 pages).

Taubman, D., et al.: "Embedded Block Coding in JPEG2000," International Conference on Image Processing, Sep. 10-13, 2000, pp. 33-36, XP10529916.

\* cited by examiner

| | | | | | | | | | | |
|---|---|---|---|---|---|---|---|---|---|---|
| ss | | ss | ps | ss | ps | ss | ps | ss | ps | sB |
| sp | | sp | pp | sp | pp | sp | pp | sp | pp | dB |
| ss | | ss | ps | ss | ps | ss | ps | ss | ps | sB |
| sp | | sp | pp | sp | pp | sp | pp | sp | pp | dB |
| ss | | ss | ps | ss | ps | ss | ps | ss | ps | sB |
| sp | | sp | pp | sp | pp | sp | pp | sp | pp | dB |
| ss | | ss | ps | ss | ps | ss | ps | ss | ps | sB |
| sp | | sp | pp | sp | pp | sp | pp | sp | pp | dB |

FIG. 3D

| s | | s | d | s | d | s | B |
|---|---|---|---|---|---|---|---|
| s | | s | d | s | d | s | B |
| s | | s | d | s | d | s | B |
| s | | s | d | s | d | s | B |

FIG. 3E

| ds | ss | ds | ss | |
|---|---|---|---|---|
| | | | | |
| ds | ss | ds | ss | |
| dd | sd | dd | sd | |
| ds | ss | ds | ss | |
| dd | sd | dd | sd | |
| ds | ss | ds | ss | |
| dB | sB | dB | sB | |

FIG. 3F

| s | | s | d | s | d | s | B |
|---|---|---|---|---|---|---|---|
| s | | s | d | s | d | s | B |

FIG. 3G

| ds | ss | |
|---|---|---|
| | | |
| ds | ss | |
| dd | sd | |
| ds | ss | |
| dB | sB | |

| s |  | s |  | s | d | s | d | s | d | s | d | s | B | s | B |
|---|---|---|---|---|---|---|---|---|---|---|---|---|---|---|---|
| s |  | s |  | s | d | s | d | s | d | s | d | s | B | s | B |
| s |  | s |  | s | d | s | d | s | d | s | d | s | B | s | B |
| s |  | s |  | s | d | s | d | s | d | s | d | s | B | s | B |
| s |  | s |  | s | d | s | d | s | d | s | d | s | B | s | B |
| s |  | s |  | s | d | s | d | s | d | s | d | s | B | s | B |
| s |  | s |  | s | d | s | d | s | d | s | d | s | B | s | B |
| s |  | s |  | s | d | s | d | s | d | s | d | s | B | s | B |

FIG. 7D

| ds |  | ds | ss | ds | ss | ds | ss |  | ss |  |
|---|---|---|---|---|---|---|---|---|---|---|
|  |  |  |  |  |  |  |  |  |  |  |
| ds |  | ds | ss | ds | ss | ds | ss |  | ss |  |
|  |  |  |  |  |  |  |  |  |  |  |
| ds |  | ds | ss | ds | ss | ds | ss |  | ss |  |
| dd |  | dd | sd | dd | sd | dd | sd |  | sd |  |
| ds |  | ds | ss | ds | ss | ds | ss |  | ss |  |
| dd |  | dd | sd | dd | sd | dd | sd |  | sd |  |
| ds |  | ds | ss | ds | ss | ds | ss |  | ss |  |
| dd |  | dd | sd | dd | sd | dd | sd |  | sd |  |
| ds |  | ds | ss | ds | ss | ds | ss |  | ss |  |
| dd |  | dd | sd | dd | sd | dd | sd |  | sd |  |
| ds |  | ds | ss | ds | ss | ds | ss |  | ss |  |
| dB |  | dB | sB | dB | sB | dB | sB |  | sB |  |
| ds |  | ds | ss | ds | ss | ds | ss |  | ss |  |
| dB |  | dB | sB | dB | sB | dB | sB |  | sB |  |

FIG. 7E

| s |  | s |  | s | d | s | d | s | B | s | B |
|---|---|---|---|---|---|---|---|---|---|---|---|
| s |  | s |  | s | d | s | d | s | B | s | B |
| s |  | s |  | s | d | s | d | s | B | s | B |
| s |  | s |  | s | d | s | d | s | B | s | B |

| ds |  | ds | ss |  | ss |  |
|----|----|----|----|----|----|----|
|    |    |    |    |    |    |    |
| ds |    | ds | ss |    | ss |    |
|    |    |    |    |    |    |    |
| ds |    | ds | ss |    | ss |    |
| dd |    | dd | sd |    | sd |    |
| ds |    | ds | ss |    | ss |    |
| dd |    | dd | sd |    | sd |    |
| ds |    | ds | ss |    | ss |    |
| dB |    | dB | sB |    | sB |    |
| ds |    | ds | ss |    | ss |    |
| dB |    | dB | sB |    | sB |    |

FIG. 7F

| s |  | s |  | s | d | s | (B) | s | B |
|---|---|---|---|---|---|---|-----|---|---|
| s |   | s |   | s | d | s | (B) | s | B |

FIG. 7G

| ds |  | (B) | ss |  |
|------|----|-----|------|----|
|      |    |     |      |    |
| ds   |    | (B) | ss   |    |
|      |    |     |      |    |
| ds   |    | (B) | ss   |    |
| dd   |    | (B) | sd   |    |
| ds   |    | (B) | ss   |    |
| (dB) |    | (B) | (sB) |    |
| ds   |    | (B) | ss   |    |
| dB   |    | (B) | sB   |    |

FIG. 7H

| b | b+2 | b+2 |
|---|---|---|
| b+2 | b+4 | |
| b+2 | | b+4 |

FIG. 11

| NW | N | NE |
|----|---|----|
| W  | P | E  |
| SW | S | SE |

FIG. 37

ENCODER RATE CONTROL

This application is a divisional of U.S. patent application Ser. No. 10/318,962 entitled "Encoder Rate Control," filed on Dec. 12, 2002, which is a divisional of application Ser. No. 09/435,313 entitled "Reversible Embedded Wavelet System Implementation", filed Nov. 5, 1999 which is a divisional of application Ser. No. 08/847,074 entitled" Reversible Embedded Wavelet System Implementation", filed May 1, 1997 which is a continuation-in-part of application Ser. No. 08/643,268, entitled "Compression/Decompression Using Reversible Embedded Wavelets", filed May 3, 1996, which is a continuation-in-part of application Ser. No. 08/498,036, entitled Reversible Wavelet Transform and Embedded Codestream Manipulation, filed Jun. 30, 1995, which is a continuation-in-part of application Ser. No. 08/310,146, entitled Apparatus for Compression Using Reversible Embedded Wavelets, filed Sep. 20, 1994.

FIELD OF THE INVENTION

The present invention relates to the field of data compression and decompression systems; particularly, the present invention relates to a method and apparatus for lossless and lossy encoding and decoding of data in compression/decompression systems.

BACKGROUND OF THE INVENTION

Data compression is an extremely useful tool for storing and transmitting large amounts of data. For example, the time required to transmit an image, such as a facsimile transmission of a document, is reduced drastically when compression is used to decrease the number of bits required to recreate the image.

Many different data compression techniques exist in the prior art. Compression techniques can be divided into two broad categories, lossy coding and lossless coding. Lossy coding involves coding that results in the loss of information, such that there is no guarantee of perfect reconstruction of the original data. The goal of lossy compression is that changes to the original data are done in such a way that they are not objectionable or detectable. In lossless compression, all the information is retained and the data is compressed in a manner which allows for perfect reconstruction.

In lossless compression, input symbols or intensity data are converted to output codewords. The input may include image, audio, one-dimensional (e.g., data changing spatially or temporally), two-dimensional (e.g., data changing in two spatial directions (or one spatial and one temporal dimension)), or multi-dimensional/multi-spectral data. If the compression is successful, the codewords are represented in fewer bits than the number of bits required for the uncoded input symbols (or intensity data). Lossless coding methods include dictionary methods of coding (e.g., Lempel-Ziv), run length encoding, enumerative coding and entropy coding. In lossless image compression, compression is based on predictions or contexts, plus coding. The JBIG standard for facsimile compression (ISO/IEC 11544) and DPCM (differential pulse code modulation—an option in the JPEG standard (ISO/IEC 10918)) for continuous-tone images are examples of lossless compression for images. In lossy compression, input symbols or intensity data are quantized prior to conversion to output codewords. Quantization is intended to preserve relevant characteristics of the data while eliminating unimportant characteristics. Prior to quantization, lossy compression system often use a transform to provide energy compaction. JPEG is an example of a lossy coding method for image data.

Recent developments in image signal processing continue to focus attention on a need for efficient and accurate forms of data compression coding. Various forms of transform or pyramidal signal processing have been proposed, including multi-resolution pyramidal processing and wavelet pyramidal processing. These forms are also referred to as subband processing and hierarchical processing. Wavelet pyramidal processing of image data is a specific type of multi-resolution pyramidal processing that may use quadrature mirror filters (QMFs) to produce subband decomposition of an original image. Note that other types of non-QMF wavelets exist. For more information on wavelet processing, see Antonini, M., et al., "Image Coding Using Wavelet Transform", *IEEE Transactions on Image Processing*, Vol. 1, No. 2, April 1992; Shapiro, J., "An Embedded Hierarchical Image Coder Using Zerotrees of Wavelet Coefficients", *Proc. IEEE Data Compression Conference*, pgs. 214-223, 1993. For information on reversible transforms, see Said, A. and Pearlman, W. "Reversible Image Compression via Multiresolution Representation and Predictive Coding", Dept. of Electrical, Computer and Systems Engineering, Renssealaer Polytechnic Institute, Troy, N.Y. 1993.

Compression is often very time consuming and memory intensive. It is desirable to perform compression faster and/or with reduced memory when possible. Some applications have never used compression because either the quality could not be assured, the compression rate was not high enough, or the data rate was not controllable. However, the use of compression is desirable to reduce the amount of information to be transferred and/or stored.

Digital copiers, printers, scanners and multifunction machines are greatly enhanced with a frame store. A compressed frame store reduces memory and thus the costs required for a frame store in these products. However, many frame stores are implemented with random access memories (RAMs). RAM is fast but generally expensive. Hard disks may also be used as memories, and are generally considered inexpensive (or less expensive generally than RAM). Therefore, any system manufacturer would find an advantage in producing a lesser expensive system using a hard disk, for purposes such as a frame store, instead of RAM.

One problem with using hard disks for time sensitive applications is that it is difficult to directly access information from a hard disk as fast as the same information could be accessed from a RAM. Also, many hard disks utilize compression when storing information onto the disk to increase the amount of information that may be stored onto the disk. The time necessary to perform the compression may also be a deterrent to using hard disks in time sensitive applications. Both the slow speed inherent in the use of hard disks and the use of compression make utilizing hard disks in time sensitive applications a difficult implementation issue.

The present invention provides for fast lossy/lossless compression. The present invention sets forth system implementations that permit usage of inexpensive hard disk technology instead of expensive RAM. Furthermore, the present invention provides for rate matching to a hard disk and for using compression to match the hard disk to bandwidths of other portions of the system implementation, such as a print engine. The present invention also provides for using RAM where the time to compress and decompress is not much slower than the RAM speed. In this way, the present invention performs rate matching to RAM.

SUMMARY OF THE INVENTION

A method and apparatus for performing compression and/or decompression is described. In one embodiment, the present invention comprises a system having a buffer, a wavelet transform unit, and a coder. The wavelet transform unit has an input coupled to the buffer to perform a wavelet transform on pixels stored therein and to generate coefficients at an output. The coder is coupled to the wavelet transform unit to code the transformed pixels received from the buffer.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

Figure 3B:
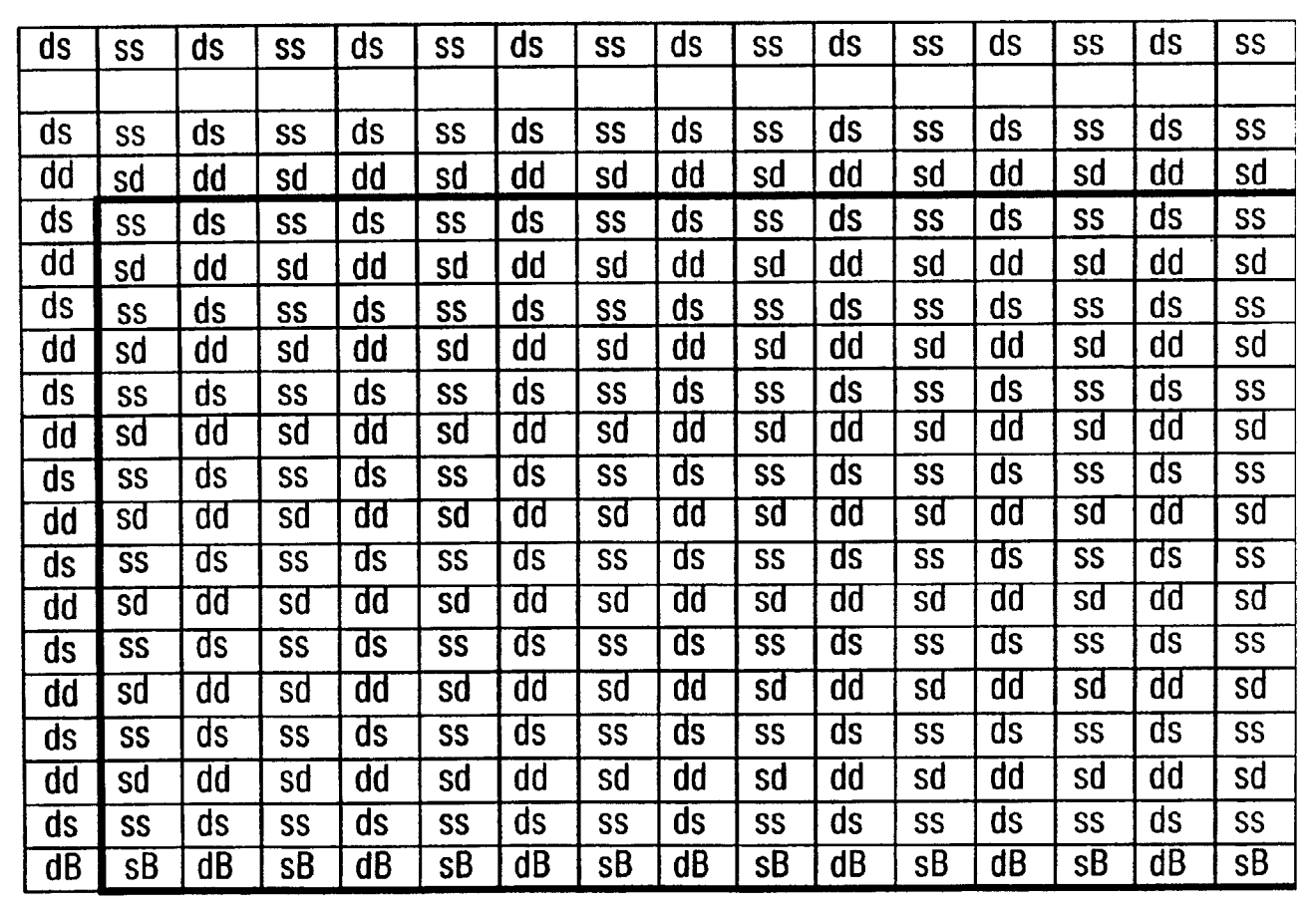
Figure 3C:
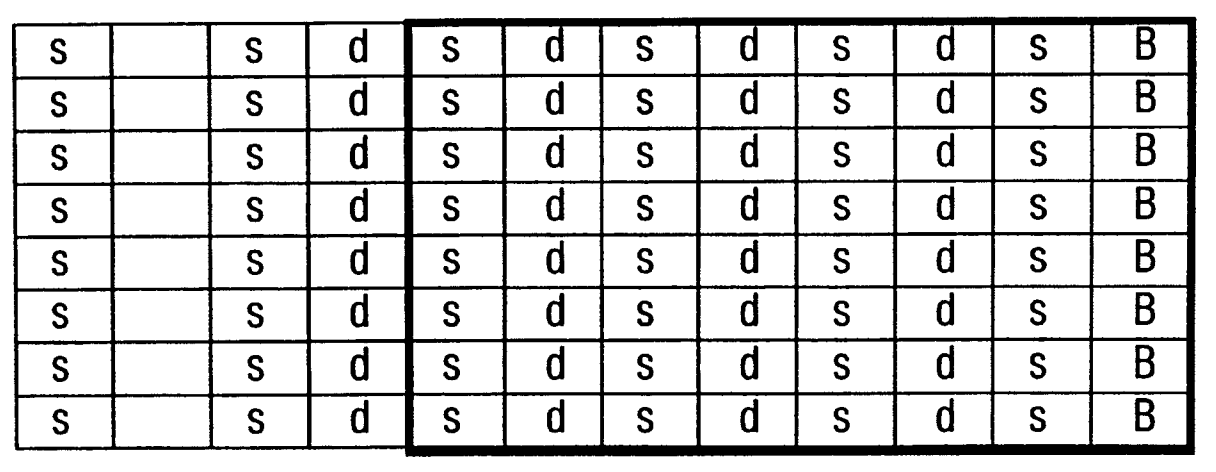

FIG. 3A through 3H illustrate the result of each application of the TS-transform filter for a four level transform on a wavelet tree of the present invention.

Figure 7B:
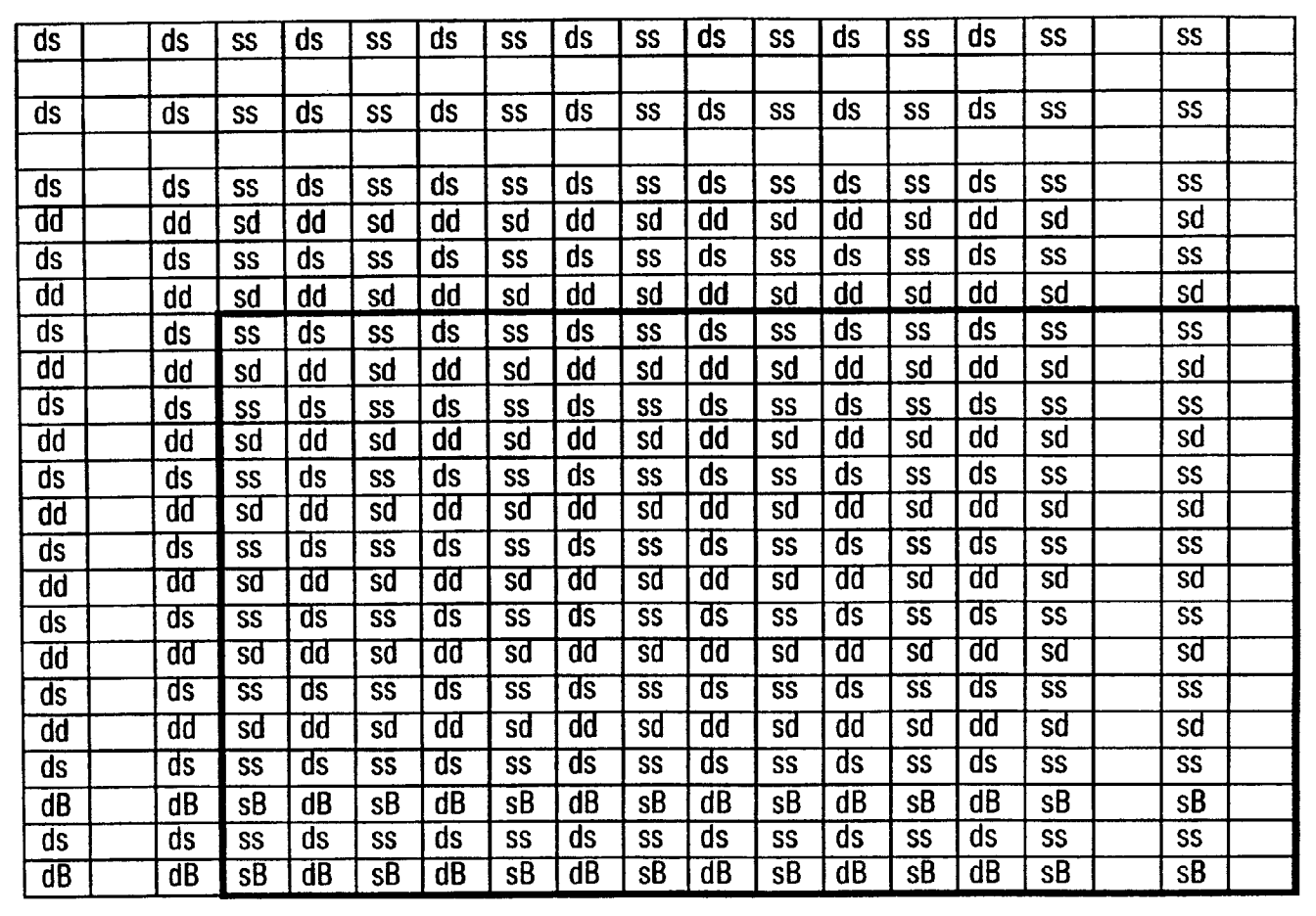

FIG. 7A through 7H show the results (outputs) of each one dimensional filtering operation for the TT-transform.

FIG. 11 illustrates the bit depths of the various coefficients in a two-level TS-transform and TT-transform decomposition from an input image with b bits per pixel.

FIG. 37 shows the neighborhood coefficients for every coefficient of a coding unit.

DETAILED DESCRIPTION OF THE PRESENT INVENTION

Figure 1A:
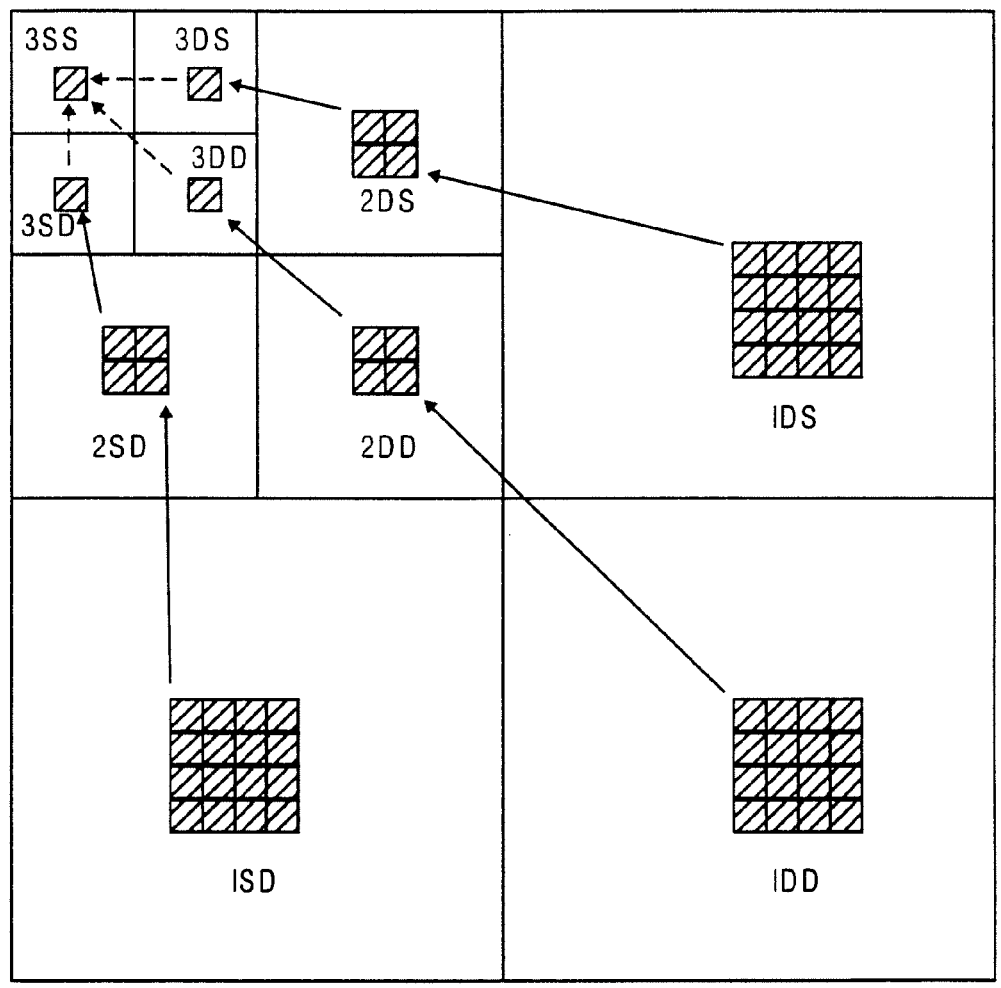
FIG. 1A shows the context dependent relationships. Children are conditioned on their parents.

A method and apparatus for compression and decompression are described. In the following description, numerous details are set forth, such as types of delays, bit rates, types of filters, etc. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magneto-optical disks, read-only memories (ROMs), random access memories (RAMs), EPROMs, EEPROMs, magnet or optical cards, or any type of media suitable for storing electronic instructions, and each coupled to a computer system bus. The algorithms and displays presented herein are not inherently related to any particular computer or other apparatus. Various general purpose machines may be used with programs in accordance with the teachings herein, or it may prove convenient to construct more specialized apparatus to perform the required method steps. The required structure for a variety of these machines will appear from the description below. In addition, the present invention is not described with reference to any particular programming language. It will be appreciated that a variety of programming languages may be used to implement the teachings of the invention as described herein.

The following terms are used in the description that follows. A definition has been included for these various terms. However, the definition provided should not be considered limiting to the extent that the terms are known in the art. These definitions are provided to help in the understanding of the present invention.

| | |
|---|---|
| ABS coding: | A method of parallel entropy coding using simple codes (e.g., run codes) for bit generation and probability estimation based on the codewords used (e.g., tabular probability estimation). In one embodiment, ABS coding also includes a method for multiplexing and demultiplexing streams from several coders. |
| alignment: | The degree of shifting of the transform coefficients in a frequency band with respect to the other frequency bands. |
| Arithmetic coding: | Shannon/Elias Coding with finite precision arithmetic, not necessarily a binary entropy coder. |
| B-coding: | A binary entropy coder that uses a finite state machine for compression. Unlike Huffman coding, using the finite state machine does well with binary symbols, and is useful for a range of input probabilities. |
| Binary entropy coder: | A noiseless coder which acts on binary (yes/no) decisions, often expressed as the most probable symbol (mps) and least probable symbol (lps). |
| binary-style: | Coding style with edge-fill Gray encoding of the pixels and a particular context model. |
| binary-style context model: | A context model for bi-level and limited-level image data. |
| bit-significance: | A number representation, similar to sign magnitude, with head bits, followed by the sign bit, followed by tail bits, if any. The embedding encodes in bit-plane order with respect to this representation. |
| child-based order: | A scan order through a two dimensional image. It is similar to raster order except that the scan works on two by two blocks. Consider scanning a "parent" frequency band in raster order. Each coefficient will have four children. These children are ordered from top-left, top-right, bottom-left, and bottom-right followed by the next parent and the next set of four children and so on until the end of the line. Then processing returns to the next two lines and eventually ends in the lower right corner. No lines are skipped. Child-based order is also referred to as 2 × 2 block order. |
| coefficient: | Components after the transform. |
| components: | Constituent parts of the image. The components make up the pixels. For example, the red, green, and blue bands are component bands. Each individual pixel is made up of a red, green, and blue component. Components and component bands can contain any type of information that has a spatial mapping to the image. |

| | |
|---|---|
| context model: | Causally available information relative to the current bit to be coded that gives historically-learned information about the current bit, enabling conditional probability estimation for entropy coding. In binary images, a possible context for a pixel is the previous two pixels in the same row and three pixels from the previous row. |
| decomposition level: | Place in the wavelet decomposition pyramid. This is directly related to resolution. |
| efficient transform: | Transform that achieves the best energy compaction into the coefficients while using the minimum number of bits to represent those coefficients. |
| Embedded context model: | A context model which separates the context bins and results into levels of importance in such a way that effective lossy compression is obtained if the more important values are retained. |
| Embedded with ordering: | A special case of embedded context models where there is not an explicit labeling of importance, but rather the compressed data is ordered with the most important data in the front. |
| embedded quantization: | Quantization that is implied by the codestream. For example, if the importance levels are placed in order, from the most important to the least, then quantization is performed by simple truncation of the codestream. The same functionality is available with tags, markers, pointers, or other signaling. Multiple quantizations can be performed on an image at decode, but only one embedded quantization can be performed at encode time. |
| entropy coder: | A device that encodes or decodes a current bit based on a probability estimation. An entropy coder may also be referred to herein as a multi-context binary entropy coder. The context of the current bit is some chosen configuration of "nearby" bits and allows probability estimation for the best representation of the current bit (or multiple bits). In one embodiment, an entropy coder may include a binary coder, a parallel run-length coder or a Huffman coder. |
| entry point: | A point in the coded data that starts with a known coding state. The decoder can start decoding at this point without decoding the previous data. In most cases, this requires that the context and the binary entropy coder be reset into an initial state. The coded data for each coding unit begins at an entry point. |
| fixed-length: | A system that converts a specific block of data to a specific block of compressed data, e.g., BTC (block truncation coding) and some forms of VQ (vector quantization). Fixed-length codes serve fixed-rate and fixed-size applications, but the rate-distortion performance is often poor compared with variable-rate systems. |
| fixed-rate: | An application or system that maintains a certain pixel rate and has a limited bandwidth channel. In one embodiment, to attain this goal, local average compression is achieved rather than a global average compression. For example, MPEG requires a fixed-rate. |
| fixed-size: | An application or system that has a limited size buffer. In one embodiment, to attain this goal, a global average compression is achieved, e.g., a print buffer. (An application can be fixed-rate, fixed-size, or both.) |
| frequency band: | Each frequency band describes a group of coefficients resulting from the same sequence of filtering operations. |
| head bits: | In bit-significance representation, the head bits are the magnitude bits from the most significant up to and including the first non-zero bit. |
| Huffman Coder: | Generally, a fixed length code which produces an integral number of bits for each symbol. |
| importance levels: | The unit of coded data which corresponds, before compression, to an entire bit-plane of the embedded data. The importance level includes |

| | |
|---|---|
| LPS (Least Probable Symbol): | all appropriate bit-planes from the different coefficient frequency bands.<br>The outcome in a binary decision with less than 50% probability. When the two outcomes are equally probable, it is unimportant which is designated mps or lps as long as both the encoder and decoder make the same designation. |
| Lossless/Noiseless/Reversible coding: | Compressing data in a manner which allows perfect reconstruction of the original data. |
| Lossy Coding: | Coding of data which does not guarantee perfect reconstruction of the original data. The changes to the original data may be performed in such a way as to not be visually objectionable or detectable. Often fixed rate is possible. |
| MPS (Most Probable Symbol): | The outcome of a binary decision with more than 50% probability. |
| overlapped transform: | A transform where a single source sample point contributes to multiple coefficients of the same frequency. Examples include many wavelets and the Lapped Orthogonal Transform. |
| parent coefficient: | The coefficient or pixel in the next higher pyramidal level that covers the same image space as the current coefficient or pixel. For example, the parent of the 1SD coefficients is the 2SD coefficients which is the parent of the 3SD coefficients in FIG. 1A. |
| Probability Estimation Machine/Module: | Part of a coding system which tracks the probability within a context. |
| progressive pixel depth: | A codestream that is ordered with deepening bit-planes of data at full image resolution. |
| progressive pyramidal: | Succession of resolutions where each lower resolution is a linear factor of two in each dimension (a factor of four in area). |
| Q-Coder | A binary arithmetic coder where additions have been substituted for multiplications and probabilities limited to discrete values and probability estimates are updated when bits are output. |
| raster order: | A scan order through a two dimensional image. It starts in the upper left corner, moves left to right, then returns to the left side of the next line, finally ending in the lower right corner. No lines are skipped. |
| reversible transform: | In one embodiment, a reversible transform is an efficient transform implemented with integer arithmetic whose compressed results can be reconstructed into the original. |
| tail-bits (or tail): | In bit-significance representation, the tail bits are the magnitude bits with less significance than the most significant non-zero bit. |
| tile data segment: | Portion of the codestream fully describing one coding unit. |
| TS-transform: | Two-Six transform, a specific reversible wavelet filter pair with a 2-tap low pass analysis and a 6-tap high pass analysis filter. The synthesis filters are quadrature mirror of the analysis filters. |
| TT-transform: | Two-Ten transform, a specific reversible wavelet filter pair with a 2-tap low pass analysis and a 10-tap high pass analysis filter. The synthesis filters are quadrature mirror of the analysis filters. |
| unified lossless/lossy: | The same compression system provides a codestream capable of lossless or lossy reconstruction. In one embodiment of the present invention, this codestream is capable of both without settings or instructions to the encoder. |
| wavelet filters: | The high and low pass synthesis and analysis filters used in wavelet transform. |
| wavelet transform: | A transformation with both "frequency" and "time (or space)" domain constraints. In one embodiment, it is a transform comprising a high pass filter and a low pass filter. The resulting coefficients are decimated by two (critically filtered) and the filters are applied to the low pass coefficients. |
| wavelet trees: | The coefficients, and the pixels, that are related to a single coefficient in the SS section of the highest level wavelet decomposition. The number of | coefficients is a function of the number of levels. FIG. 1A illustrates the coefficients included in a wavelet tree. The span of a wavelet tree is dependent on the number of decomposition levels. For example, with one level of decomposition, a wavelet tree spans four pixels, with two levels it spans 16, etc. Table 1 below illustrates the number of pixels affected by a wavelet tree for different levels. In two dimensions, each wavelet tree comprises three subtrees called SD, DD and DS.

TABLE 1

Span of a Wavelet Tree for Different Levels of Decompression

|  | Width | Height | Total |
| --- | --- | --- | --- |
| 1 level | 2 | 2 | 4 |
| 2 levels | 4 | 4 | 16 |
| 3 levels | 8 | 8 | 64 |
| 4 levels | 16 | 16 | 256 |
| 5 levels | 32 | 32 | 1024 |
| 6 levels | 64 | 64 | 4096 |

Overview of the Present Invention

The present invention provides a compression/decompression system having an encoding portion and a decoding portion. The encoding portion is responsible for encoding input data to create compressed data, while the decoding portion is responsible for decoding previously encoded data to produce a reconstructed version of the original input data. The input data may comprise a variety of data types, such as image (still or video), audio, etc. In one embodiment, the data is digital signal data; however, analog data digitized, text data formats, and other formats are possible. The source of the data may be a memory or channel for the encoding portion and/or the decoding portion.

In the present invention, elements of the encoding portion and/or the decoding portion may be implemented in hardware or software, such as that used on a computer system. The present invention provides a lossless compression/decompression system. The present invention may also be configured to perform lossy compression/decompression.

The system of the present invention employs fast lossy/lossless compression by reversible wavelets, which is described in greater detail below. The system may include a printer, such as, for example, a laser printer. In one embodiment, the printer uses an inexpensive hard disk to store a rendered page, greatly reducing the amount of expensive random access memory (RAM) required. Compression is used to match the limited bandwidth of the hard disk or other storage device to the greater bandwidth required by the print engine. The coding technology of the present invention meets the high speed, real-time requirements of the print engine, while the present invention provides either excellent lossless or lossy compression as required by image characteristics and the bursty nature of the hard disk.

The following detailed description sets forth a general overview of compression by reversible wavelets, a compressed frame store application, a color laser printer, and embodiments of a printer chip. The printer's rendering engine uses a hard disk for storage. Because the hard disk is slower than the print engine, compression is used to provide rate matching. Display list technology may also be used to decrease the memory required while rendering. A display-list based rendering engine allows the compression system to handle bands of the image independently. Note that although the present invention is described in terms of a printer system, the present invention is applicable to other systems that include compression and/or decompression subsystems as portions thereof.

Also discussed herein is an embedded unified lossless/lossy compression system. The embedded characteristic of the system allows quality to be determined by the transfer rate of the disk. For easily compressed images (e.g., most documents with text and/or line art), lossless compression is achieved. For difficult to compress images (e.g., documents with noisy natural images and/or halftones), high quality lossy compression is achieved.

For a description of a system(s) that supports both lossless compression and high quality lossy compression of color images, see U.S. patent application Ser. No. 08/642,518, filed May 3, 1996 and entitled "Compression and Decompression with Wavelet Style and Binary Style Including Quantization by Device-Dependent Parser" and U.S. patent application Ser. No. 08/436,662, filed May 8, 1995 and entitled "Method and Apparatus for Reversible Color Conversion".

Reversible Wavelets

The present invention employs compression by reversible wavelets.

Wavelet Decomposition

The present invention initially performs decomposition of an image (in the form of image data) or another data signal using reversible wavelets. In the present invention, a reversible wavelet transform comprises an implementation of an exact-reconstruction system in integer arithmetic, such that a signal with integer coefficients can be losslessly recovered. An efficient reversible transform is one with transform matrix of determinant equals 1 (or almost 1).

By using reversible wavelets, the present invention is able to provide lossless compression with finite precision arithmetic. The results generated by applying the reversible wavelet transform to the image data are a series of coefficients.

The reversible wavelet transform of the present invention may be implemented using a set of filters. In one embodiment, the filters are a Two-tap low-pass filter and a Six-tap high-pass filter to implement a transform referred to herein as the TS transform, or 2,6 transform. In another embodiment, the filters are a Two-tap low-pass filter and a Ten-tap high-pass filter to implement a transform referred to herein as the TT transform, or 2,10 transform. These filters may be implemented using only addition and subtraction operations (plus hardwired bit shifting). The TT-transform has at least one advantage and at least one disadvantage with respect to the TS-transform. One advantage is that it provides better compression that the TS-transform. The disadvantage of the TT-transform is that the longer 10-tap filter requires a higher hardware cost.

Two-Dimensional Wavelet Decomposition

Using the low-pass and high-pass filters of the present invention, a multi-resolution decomposition is performed. The number of levels of composition is variable and may be any number; however, currently the number of decomposition levels equals from two to eight levels. The maximum number of levels is the $\log_2$ of the maximum of the length or width of the input.

The most common way to perform the transform on two-dimensional data, such as an image, is to apply the one-dimensional filters separately, i.e., along the rows and then along the columns. The first level of decomposition leads to four different bands of coefficients, referred to herein as SS, DS, SD, and DD. The letters refer to the smooth (S) and detail (D) filters defined above, which correspond to low (L) and high (H) pass filters respectively. Hence, the SS band consist of coefficients from the smooth filter in both row and column directions.

Each frequency subband in a wavelet decomposition can be further decomposed. The most common practice is to only decompose the SS frequency subband further, and may include further decomposing of the SS frequency subband in each decomposition level as each is generated. Such a multiple decomposition is referred to as a pyramidal decomposition. The designations SS, SD, DS, DD and the decomposition level number denote each decomposition.

Note that with either the TS or TT transforms of the present invention, the pyramidal decomposition does not increase the coefficient size.

If the reversible wavelet transform is recursively applied to an image, the first level of decomposition operates on the finest detail, or resolution. At a first decomposition level, the image is decomposed into four sub-images (e.g., subbands). Each subband represents a band of spatial frequencies. The first level subbands are designated 1SS, 1SD, 1DS, and 1DD. The process of decomposing the original image involves subsampling by two in both horizontal and vertical dimensions, such that the first level subbands 1SS, 1SD, 1DS and 1DD each have one-fourth as many coefficients as the input has pixels (or coefficients) of the image.

Subband 1SS contains simultaneously low frequency horizontal and low frequency vertical information. Typically a large portion of the image energy is concentrated in this subband. Subband 1SD contains low frequency horizontal and high frequency vertical information (e.g., horizontal edge information). Subband 1DS contains high frequency horizontal information and low frequency vertical information (e.g., vertical edge information). Subband 1DD contains high frequency horizontal information and high frequency vertical information (e.g., texture or diagonal edge information).

Each of the succeeding second, third and fourth lower decomposition levels is produced by decomposing the low frequency SS subband of the preceding level. This subband 1SS of the first level is decomposed to produce subbands 2SS, 2SD, 2DS and 2DD of the moderate detail second level. Similarly, subband 2SS is decomposed to produce coarse detail subbands 3SS, 3SD, 3DS and 3DD of the third level. Also, subband SS2 is decomposed to produce coarser detail subbands 4SS, 4SD, 4DS and 4DD of the third level. Due to subsampling by two, each second level subband is one-sixteenth the size of the original image. Each sample (e.g., pixel) at this level represents moderate detail in the original image at the same location. Similarly, each third level subband is 1/64 the size of the original image. Each pixel at this level corresponds to relatively coarse detail in the original image at the same location. Also, each fourth level subband is 1/256 the size of the original image.

Since the decomposed images are physically smaller than the original image due to subsampling, the same memory used to store the original image can be used to store all of the decomposed subbands. In other words, the original image and decomposed subbands 1SS and 2SS are discarded and are not stored in a three level decomposition.

Although only four subband decomposition levels are described, additional levels could be developed in accordance with the requirements of a particular system. Also, with other transformations such as DCT or linearly spaced subbands, different parent-child relationships may be defined.

Note that pyramidal decomposition does not increase the coefficient size with the wavelet filters of the present invention.

In other embodiments, other subbands in addition to the SS may be decomposed also.

Tree Structure of Wavelets

There is a natural and useful tree structure to wavelet coefficients in a pyramidal decomposition. A result of the subband decomposition is a single SS frequency subband corresponding to the last level of decomposition. On the other hand, there are as many SD, DS, and DD bands as the number of levels. The tree structure defines the parent of a coefficient in a frequency band to be a coefficient in a same frequency band at a lower resolution and related to the same spatial locality.

In the present invention, each tree comprises the SS coefficients and three subtrees, namely the DS, SD and DD subtrees. The processing of the present invention is typically performed on the three subtrees. The root of each tree is a purely smooth coefficient. For a two-dimensional signal such as an image, there are three subtrees, each with four children. The tree hierarchically is not limited to two dimensional signals. For example, for a one dimensional signal, each subtree has one child. Higher dimensions follow from the one-dimensional and two-dimensional cases.

The process of multi-resolution decomposition may be performed using a filtering system. For examples of a two-dimensional, two-level transform, a two-dimensional, two-level transform implemented using one-dimensional exemplary filters, see U.S. patent application Ser. No. 08/498,695, filed Jun. 30, 1995 and entitled "Method and Apparatus For Compression Using Reversible Wavelet Transforms and an Embedded Codestream" and U.S. patent application Ser. No. 08/498,036, filed Jun. 30, 1995, entitled "Reversible Wavelet Transform and Embedded Codestream Manipulation".

Performing the Forward Wavelet Transform

In the present invention, the wavelet transform is performed with two 1-D operations, horizontal then vertical. In one embodiment, one piece of hardware performs the horizontal operation while another performs the vertical operations.

The number of levels determine the number of iterations. In one embodiment, a four level decomposition is performed using the TT transform in both the horizontal and vertical directions. In another embodiment, a four level decomposition is performed using four TS-transforms instead.

The transform of the present invention is extremely computationally efficient. In one embodiment, the present invention orders the computations performed by the transform to reduce the amount of both on-chip and off-chip memory and bandwidth required.

Computation Orders and Data Flow for the Transform

As discussed above in the present invention, the basic unit for computing the transform is the wavelet tree. Assuming a four level transform, each wavelet tree is a 16×16 block of pixels. A 16×16 block of pixels (all four components for CMYK images) are input to the transform of the present invention, and all of the possible calculations to generate coefficients are performed. (The inverse is similar, a 16×16 block of coefficients for each component is input and all possible calculations are performed). Since the present invention employs an overlapped transform, information from previous, neighboring trees is stored and used in calculations. The boundary between the current wavelet tree and the previous, neighboring information is referred to herein as a seam. The information that is preserved across a seam to perform the transform of the present invention is described in detail below.

Ordering of Wavelet Trees

The ordering of wavelet trees for computing the transform is important because, in certain applications (e.g., printing), coding units of the present invention have a large width and a small height. In one embodiment, each coding unit contains 4096×256 pixels.

Figure 2A:
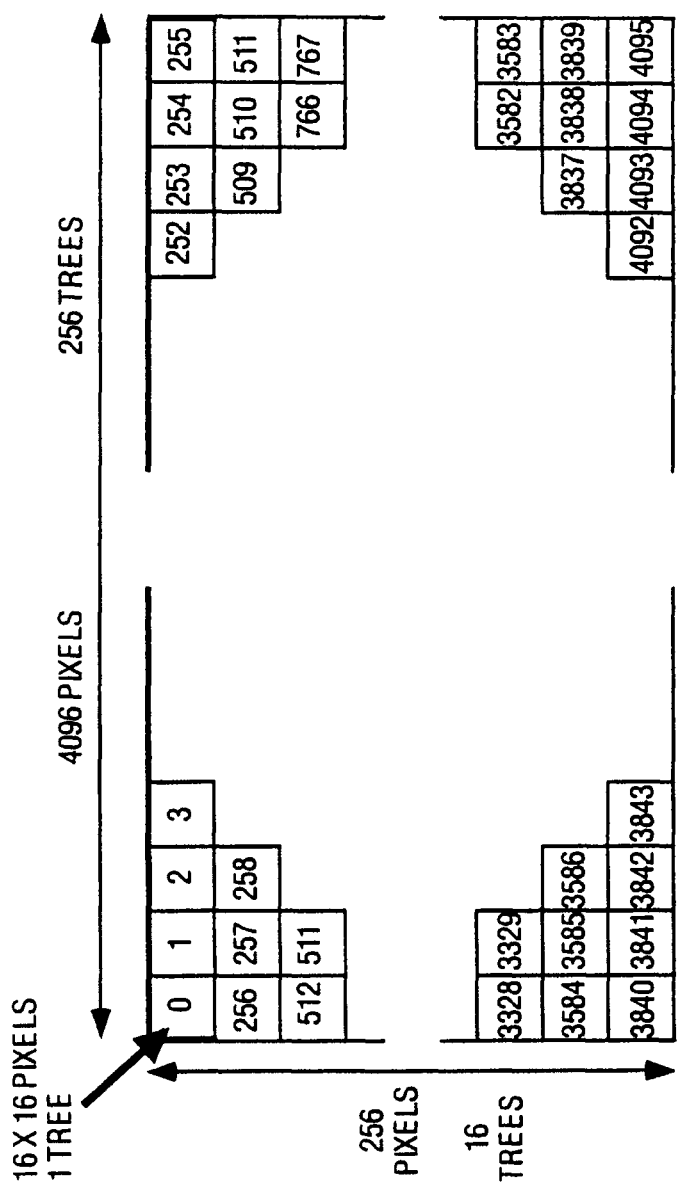
FIG. 2A illustrates an order that is similar to raster order.

In the following discussion, each of the coding units contains 4096×256 pixels. However, it should be noted that the ordering described below is applicable to coding units of other sizes. FIG. 2A illustrates an order that is similar to raster order. This order is referred to herein as the long seam transform order. Referring to FIG. 2A, the thick lines indicate the amount of data that is preserved across seams, and is indicative of how much storage is required to compute the transform. This data is proportional to one wavelet tree for the horizontal transform, but to the width of the image (4096 in this example) for the vertical transform. The amount of storage for this data may require the use of external memory. However, because of the closeness to raster order, during the inverse transform, data can be output from the transform (to, for instance, a printer in a printer application) as soon as a horizontal row of wavelet trees has to be converted to pixels.

Figure 2B:
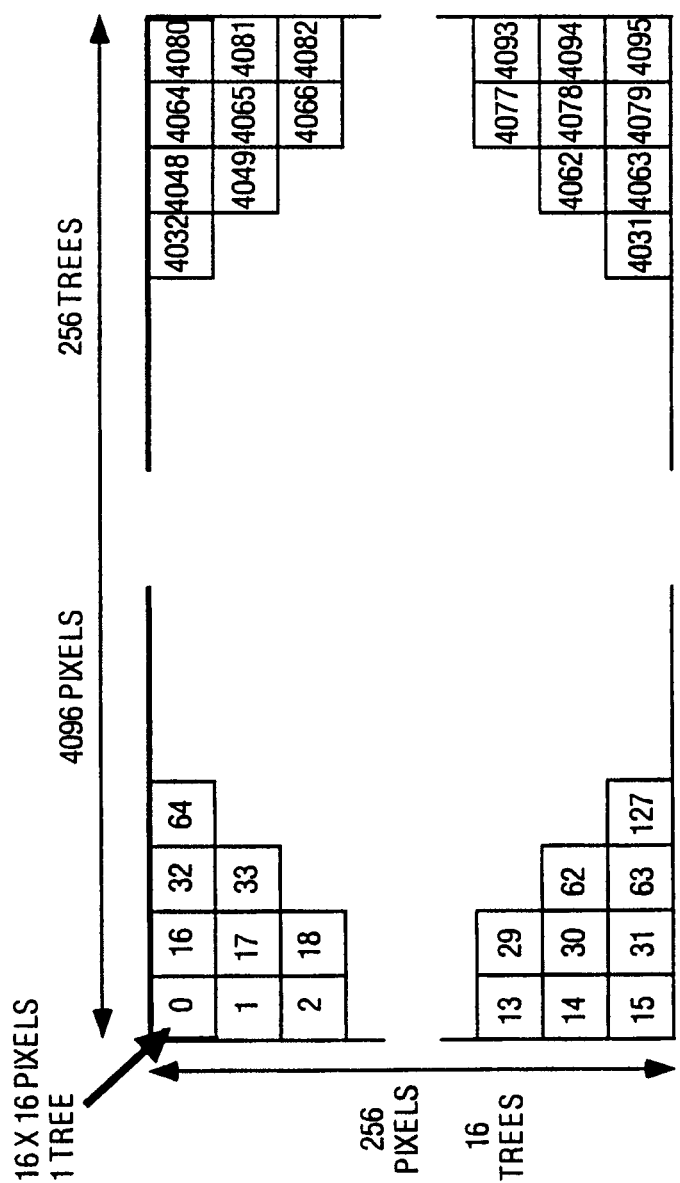
FIG. 2B illustrates an alternative embodiment of an order, which is referred to herein as the short seam order.

FIG. 2B illustrates an alternative embodiment of an order, which is referred to herein as the short seam order. The storage for seams is proportional to the height of the coding unit (256 in this example) for the horizontal transform and one wavelet tree for the vertical transform. This greatly reduces the amount of memory required, making on-chip storage practical.

Figure 2C:
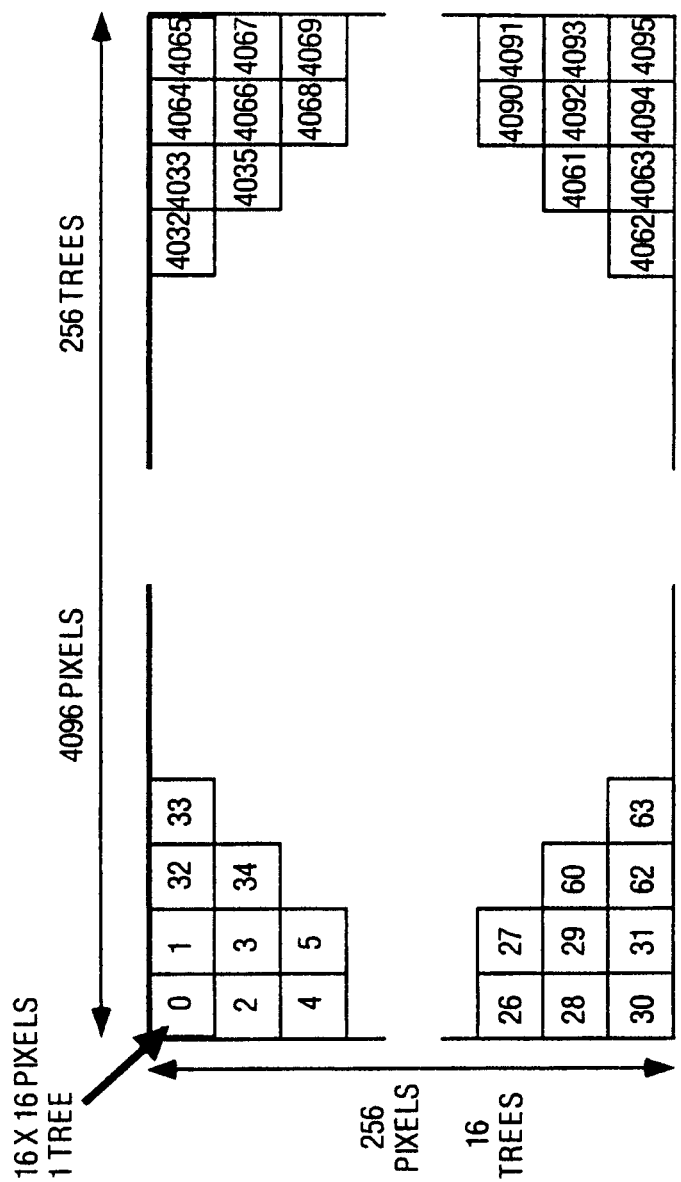
FIG. 2C shows an alternative short seam order.
Figure 3A:
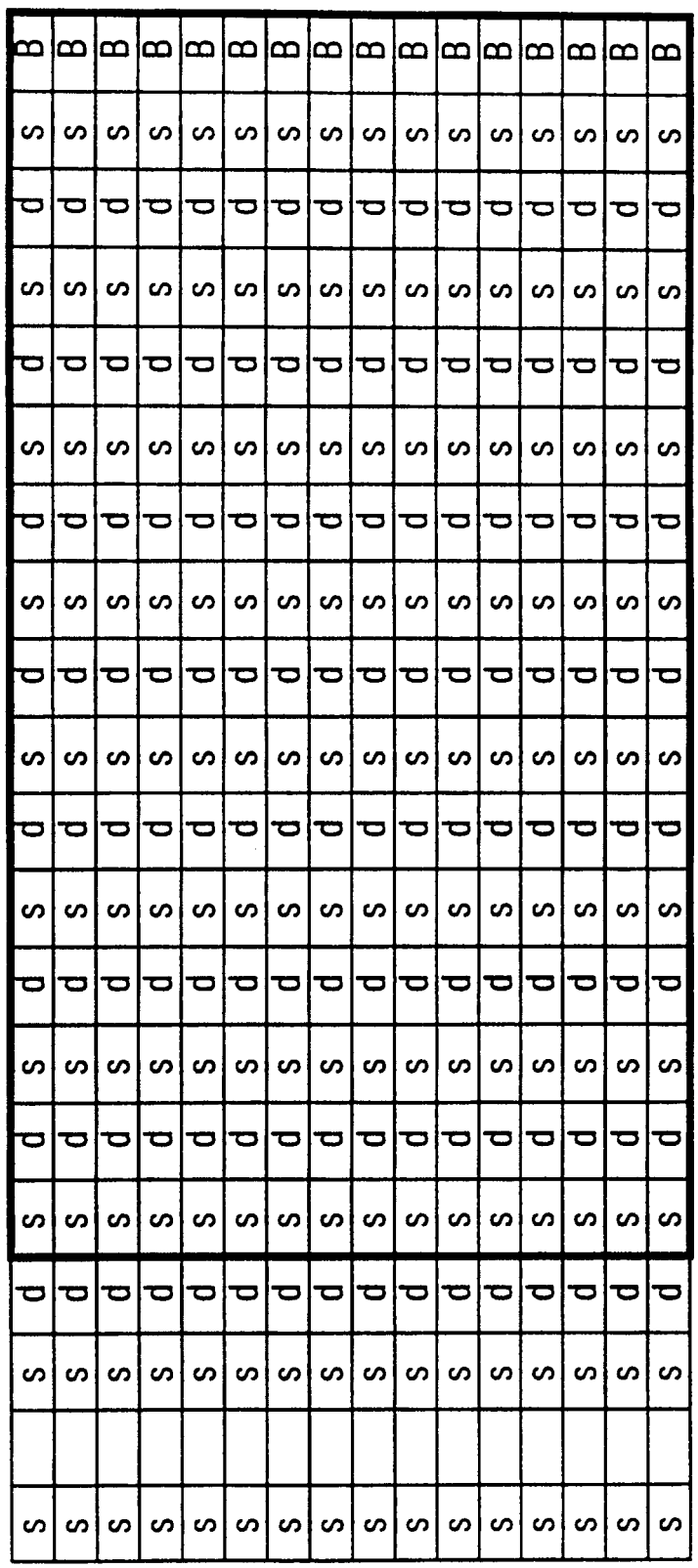

FIG. 2C shows an alternative short seam order. At the cost of storage proportional to one more wavelet tree, the number of consecutive pixels processed in raster order is increased. This alternative or similar alternatives may allow for more efficient use of fast page mode or extended data out (EDO) RAM in the band buffer with little extra cost in seam memory. The efficient is gained by the fact that most memories are desired or optimized for accesses to adjacent memory locations. Therefore, any increase in the use of adjacent memory accesses due to the seam order results in more efficient memory usage.

Computation for One Wavelet Tree

The following equations define both the TS-transform and the TT-transform. For an input x(n), the output of the low pass filter, the smooth signal s(n), and the high pass filter, the detail signal d(n) are computed as shown in the equation below.

$$\begin{cases} s(n) = \left\lfloor \dfrac{x(2n) + x(2n+1)}{2} \right\rfloor \\ d(n) = x(2n) - x(2n+1) + t(n) \end{cases}$$

The inverse transform is shown in the equation below.

$$\begin{cases} x(2n) = s(n) + \left\lfloor \dfrac{p(n)+1}{2} \right\rfloor \\ x(2n+1) = s(n) - \left\lfloor \dfrac{p(n)}{2} \right\rfloor \end{cases}$$

where p(n) is computed by:

$$p(n) = d(n) - t(n).$$

The TS-transform and the TT-transform differ in the definition of t(n). For the TS-transform.

$$t(n) = \left\lfloor \dfrac{-s(n-1) + s(n+1) + 2}{4} \right\rfloor.$$

For the TT-transform, $$t(n) = \left\lfloor \dfrac{3s(n-2) - 22s(n-1) + 22s(n+1) - 3s(n+2) + 32}{64} \right\rfloor$$

Note that in the following discussion the notation $\lfloor . \rfloor$ means to round down or truncate and is sometimes referred to as the floor function.

The TS-Transform

The effect of using the six tap filter and a two tap filter at even locations is that three pieces of information must be stored. The six tap filter requires two delays. The two tap filter requires one delay so its result can be centered with respected to the six tap filter's result. Specifically, two s(·) values and one d(·) value or a partial result from the d(·) calculation must be stored. Storage of these values is identical regardless of whether or not a particular filtering operation crosses a seam or not.

FIGS. 3A through 3H illustrate the result of each application of the TS-transform filter for a four level transform on a wavelet tree of the present invention. In these figures, the output of the low pass filter is denoted as "s" for smooth. The output of the high pass filter is denoted "d" for detail. The "B" denotes an intermediate value used to compute a "d"; it is a x(2n)−x(2n+1) value. The "B" values are used during the forward transform; for the inverse transform, a "d" value that is not used in any computations is stored in its place. The notation "sd" indicates that a coefficient is the result of first a horizontal low pass filter and then a vertical high pass filter. The meanings of "ds", "dd", "ss", "dB" and "sB" are similar. The bold square corresponds to the 256 input pixels. The shaded "s", "ds" and "ss" values are computed with a previous wavelet tree and stored for use in the current wavelet tree.

For the forward transform, the inputs to levels 2, 3 and 4 of the transform are the "ss" coefficients from the previous level. The "sd", "ds" and "dd" coefficients are finished, so they can be output when computed. The inverse transform does all the computations in reverse order with respect to level (the 4th level first, then, 3, 2, and finally 1), and vertical (first) and horizontal (second). Within a pass of the transform, the data flow of the forward and inverse are identical, just the computation is different.

TS-Transform Hardware

Figure 4A:
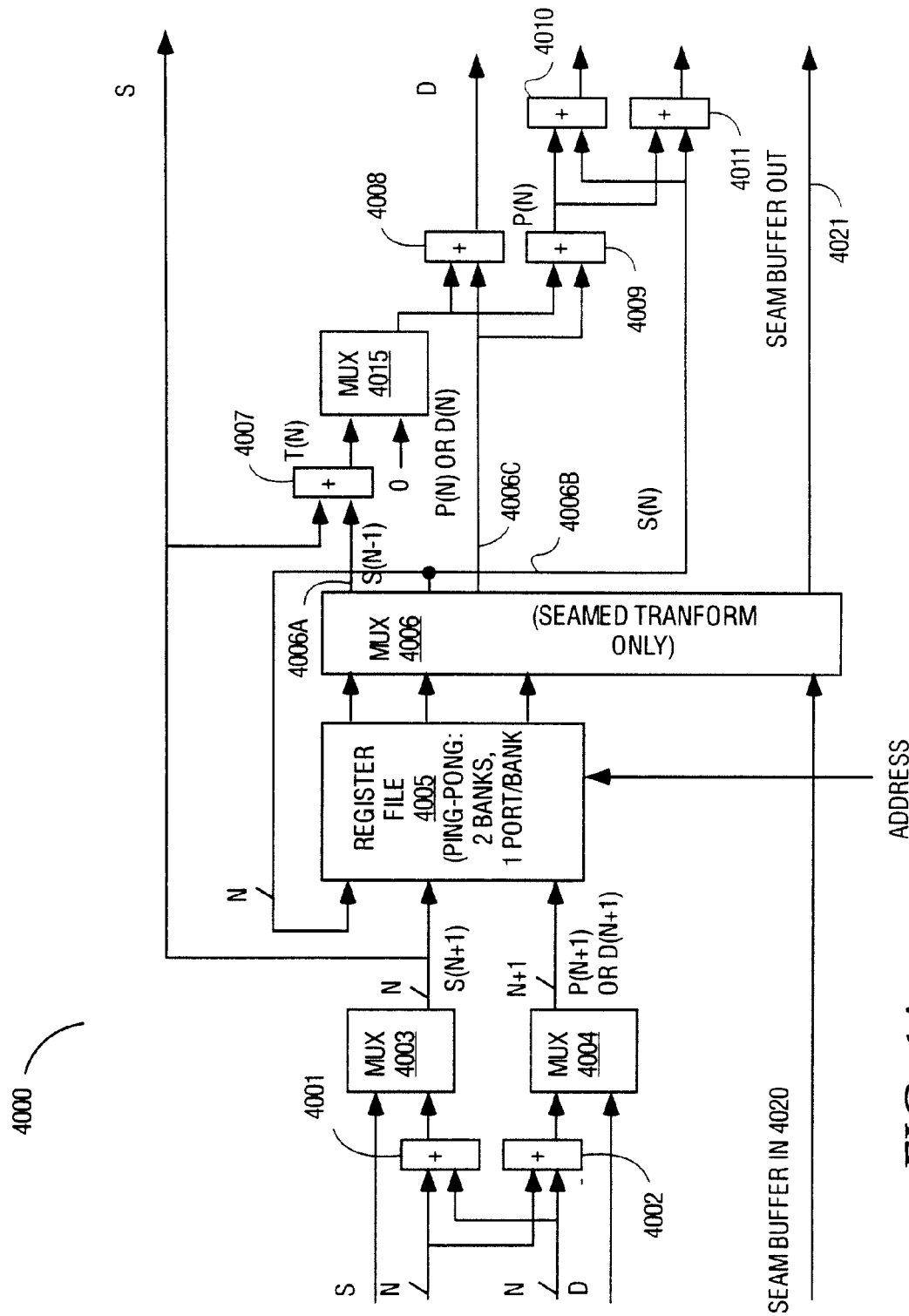
FIG. 4A is a block diagram of one embodiment of a forward/inverse filter unit for use in implementing the one dimensional filters.

FIG. 4A is a block diagram of one embodiment of a forward/inverse filter unit for use in implementing the one dimensional filters. Only memory and computational units are shown, hardwired shifts are not shown. Referring to FIG.

4A, filter unit 4000 handles both the forward and inverse transform. Alternate embodiments may use separate units for the forward and inverse transforms. For the forward transform, the size "n" inputs are used, and the "s" and "d" outputs are generated. For the inverse transform, the "s" and "d" inputs are used and the other outputs are generated.

Adder 4001 is coupled to receive the n bit inputs and add them together to produce an output of x(2n+2)+x(2n+3). Adder 4002 subtracts one n bit input from the other and outputs a quantity of x(2n+2)−x(2n+3). The outputs of adders 4001 and 4002 are coupled to one input of muxes 4003 and 4004 respectively. The other input of to muxes 4003 and 4004 are coupled to receive the s and d inputs respectively. In one embodiment, the s input is n bits, while the d input is greater than n bits.

The output of muxes 4003 and 4004 is controlled by a forward/inverse control signal indicative of whether the filter is in the forward or inverse mode. In either the forward or inverse mode, the output of mux 4003 is equal to s(n+1). On the other hand, the output of mux 4004 is equal to p(n+1) in the forward mode and d(n+1) in the inverse mode. The outputs of mux 4003 and 4004 along with a feedback of s(n) output from mux 4006 are coupled to the inputs of register file 4005. Register file 4005 contains the entries for each component for the length of one wavelet tree. The data typically passes through register file 4005. Based on the spatial location, the inputs to register 4005 are delayed to the output. An address input controls the outputs of register file 4005. In one embodiment, register file 4005 comprises two banks of memory with one port per bank and is used in a ping-pong style accesses back and forth between the two banks of memory.

The output of mux 4003 is also the s output of the filter unit.

The outputs of register file 4005 are coupled to inputs of mux 4006 along with externally buffered data at seam buffer in 4020. The output 4006A comprises the s(n−1) which is a twice delayed version of the output of mux 4003. The output 4006B comprises s(n) which is a delayed version of s(n+1). The output 4006C comprises p(n) for the forward mode and d(n) for the inverse mode. Mux 4006 is also controlled to provide seam data to be externally buffered at seam buffer out 4021.

The output of 4006C is coupled to one input of adders 4008 and 4009. The other input of adders 4008 and 4009 is the output of mux 4015. Mux 4015 handles boundary conditions. On a boundary, mux 4015 outputs as zero that is hardwired to one of its inputs. The hardwired zero may be changed to use other values in some embodiments. In a non-boundary condition, mux 4015 outputs t(n) which is output from adder 4007 which is coupled to add s(n+1) on one input to s(n−1) on another input by subtracting s(n−1) from s(n+1).

Adder 4008 adds the output 4006C of mux 4006 to the output of mux 4015 to generate the d output of the filter unit.

Adder 4009 subtracts the output of 4006C of mux 4006 from the output of mux 4015. The output of adder 4009 is added to s(n) on output 4006B of mux 4006 by adder 4010 to generate an n bit output of the filter unit. The output of 4009 is also subtracted from s(n) of output 4006B of mux 4006 by adder 4011, which outputs the other n bit output of the filter unit in the inverse direction.

For seams longer than one wavelet tree, seam data may be stored in on-chip static RAM (SRAM) or external memory instead of in register file 4005. Mux 4006 provides access to and from this additional seam memory.

Most of the hardware cost of filter unit 4000 is due to register file 4005. The total amount of memory required is dependent of the number of filter units. In one embodiment, a total of 60 locations for storing three values (s, s, d or ss, ss, sd) is required. When more filter units are used, the memory required for each is less. Therefore, the hardware cost of using multiple filter units is low.

A fast inverse transform allows less latency between the end of decoding and the start of the data output operation, such as printing. This reduces the workspace memory required for decompression and allows larger coding units. A fast forward transform allows the filter to handle bursts of data when more bandwidth is available, which, in turn, allows the transform to supply more data to the context model when a look-ahead allows the context model to processes data quickly. If the forward transform cannot keep up with context model during encoding, disk bandwidth during encoding is wasted, delaying the time to start printing. Also, the control and dataflow may be simplified by having multiple filters.

Figure 4B:
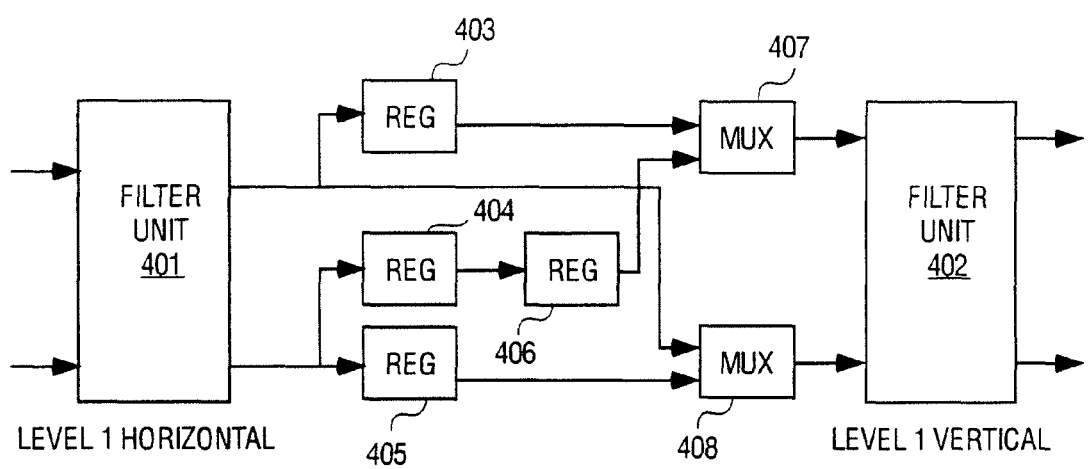
FIG. 4B is a block diagram of one embodiment of a first level forward transform according to the present invention.

FIG. 4B is a block diagram of one embodiment of a first level forward transform according to the present invention. Referring to FIG. 4B, two filter units 401 and 402, such as those described in FIG. 4A, perform the first level of the transform. Filter unit 401 performs a level 1 horizontal transform, while filter unit 402 performs a level 1 vertical transform. In one embodiment, the first level of the transform operates on 2×2 blocks of input. Four registers 403-406 operate as delay units to delay outputs of filter unit 401. This is referred to as child-based order. Register 403 receives the S output of filter unit 401, while registers 404 and 405 receive the d output. The output of register 404 is coupled to the input of register 406. The outputs of registers 403 and 406 are coupled to inputs of mux 407, while the s output of the filter unit 401 and the output of register 405 are coupled to the inputs of mux 408. Two muxes 407 and 408 select inputs for filter unit 402 from those of the delayed coefficients output from filter unit 401.

Filter unit 401 operates consecutively on two vertically adjacent pairs of inputs. This creates four coefficients that can, with the proper delay provided by registers 403-406 for each component, be input to filter unit 402. Three of the four results can be output immediately, the "ss" output is processed further.

The first level forward transfer operates on groups of four pixels which are in 2×2 groupings. For the purposes of discussion, the first row should contain pixels a and b while the second row contains pixels c and d. The operation of the first level 4 transform in FIG. 4B is as follows. During the first cycle, the horizontal transform is applied to a and b pixels which are processed by filter unit 401. Filter unit 401 generates the $S_{ab}$ which is stored in register 403 and $D_{ab}$ which is stored in registers 404 and 405. In the next cycle, pixels c and d are processed by filter unit 401 to perform the horizontal transform. The results of applying filter unit 4001 is to generate $S_{cd}$ which is stored in register 403 and $D_{cd}$ which is stored in registers 404 and 405. At this cycle, the $S_{ab}$ from register 403 and the $S_{cd}$ from register 405 are processed by filter unit 402 which performs a vertical pass of the transform and generates SS and SD. Also, during the second cycle, the value $D_{ab}$ moves from register 404 to register 406. In the next cycle, the value $D_{ab}$ from register 406 and $D_{cd}$ from 405 are processed by filter unit 402, which generates the outputs of DS and DD. In the same cycle, filter unit 401 process the a and b pixels from the next 2×2 block.

Figure 5:
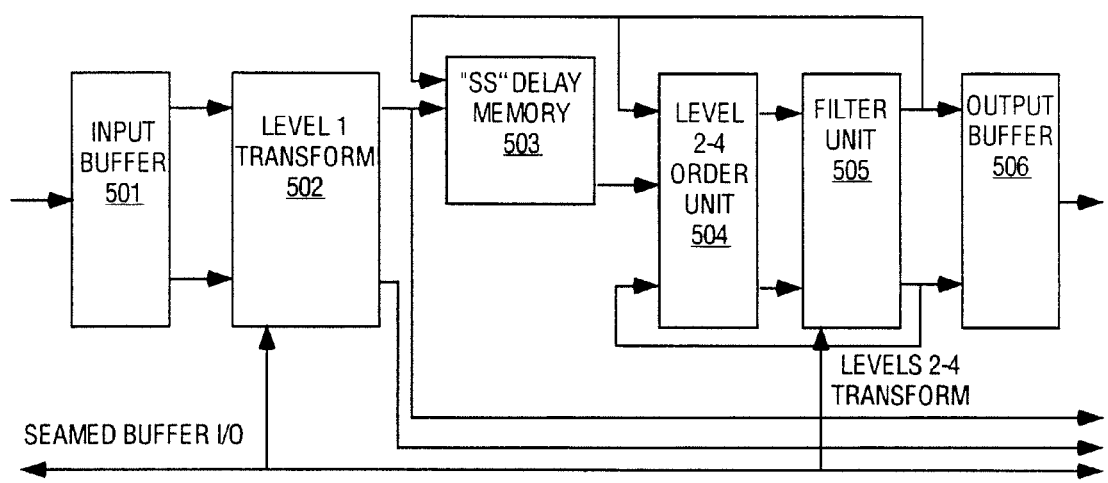
FIG. 5 is a block diagram of one embodiment of a complete forward transform according to the present invention.

FIG. 5 is a block diagram of one embodiment of a forward transform according to the present invention. Referring to FIG. 5, level 1 transform 502 performs the level 1 transform. In one embodiment, level 1 transform comprises the level 1 transform of FIG. 4B. Filter unit 505 handles levels 2, 3 and 4 of the transform. A memory 503 stores "ss" coefficients until sufficient coefficients are available to perform the transform. The number of coefficients which need to be stored is shown in Table 2 below. (Each location stores a coefficient for each component).

TABLE 2

"ss" delay memory

| between levels | memory needed |
|---|---|
| 1 and 2 | 9 locations |
| 2 and 3 | 8 locations |
| 3 and 4 | 4 locations |

Order unit 504 multiplexes the proper inputs into filter unit 505. Input buffer 501 and output buffer 506 may be required to match between the transfer order required by the transform and the order required by the band buffer or context model.

For the inverse transform, the dataflow is reversed with the level 4 inverse transform being performed followed by the level 3, level 2 and level 1 transforms in order. The output of the level 2 transform is fed into the first level transform hardware of level 1 transform 502. Also, vertical filtering is performed before horizontal filtering. Because of the horizontal and vertical filtering is identical except that one direction requires access to additional memory for seams, reversing the dataflow can be performed with a small amount of multiplexing. Before the inverse transform, the two byte coefficients need to be converted from the embedded form with two signaling bits into normal two's complement numbers.

The elements described in FIGS. 4B and 5 may also be used for the TT-Transforms as well.

Transform Timing

The transform timing of the forward transform of FIG. 5 is based on the timing of the individual filter units. The first filter unit, filter unit 401, computes horizontal level 1 transforms, while the second filter unit, filter unit 402, computes vertical level 1 transforms. The third filter unit, filter unit 505, computes transforms for levels 2 through 4 or is idle.

In one embodiment, the third filter unit (505), when not idle, computes horizontal transforms during even clock cycles and vertical transforms during odd clock cycles. The timing for the inverse transform is similar (but reversed).

In the following example, 2×2 blocks within a wavelet tree are processed in the transpose of raster order. Note that less input/output (I/O) buffering might be required to support fast page mode/extended data out (EDO) DRAM if 2×2 blocks within a wavelet tree are processed in raster order instead.

Figure 6:
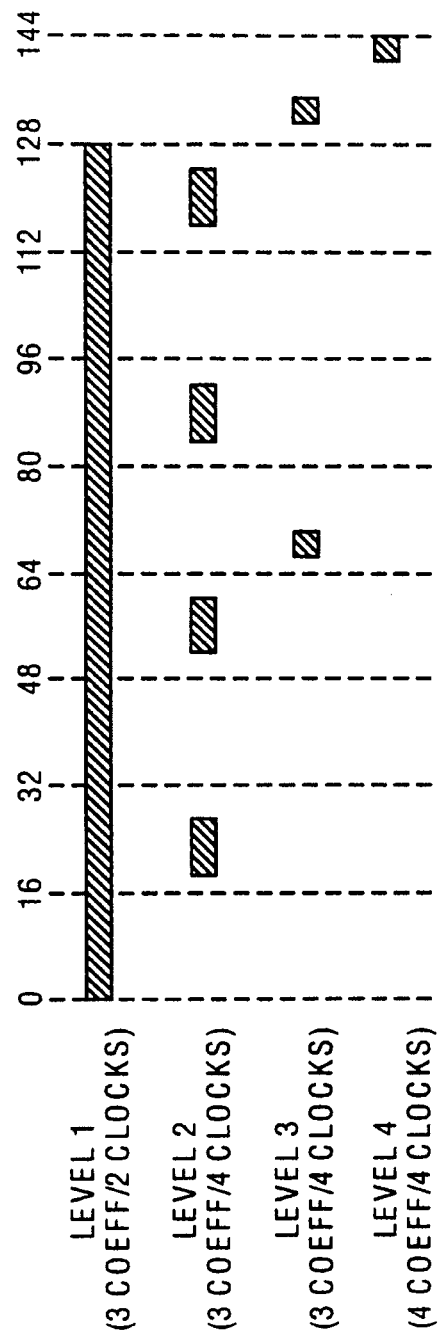
FIG. 6 is a timing diagram of when coefficients are output.
Figure 7A:
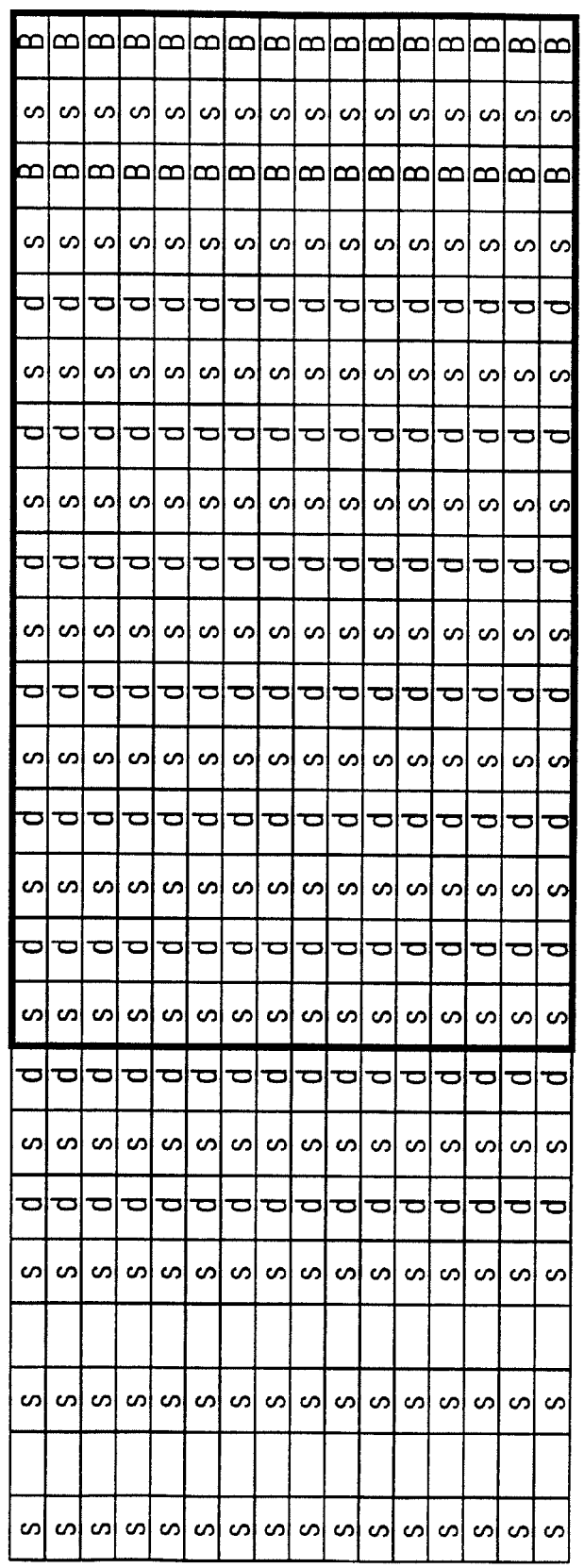

FIG. 6 is a timing diagram of when coefficients are output. The following timing is for each pixel. There are four components per pixel.

```
starting at time 0 do:
    for (x+0;x<16/2;x++)
        for (y=0;y<16;y++)
            apply level 1 horizontal filter at x,y
starting at time 1 do:
    for (x=0;x<16/2;x++)\
        for (y=0;y<16/2;y++)
            for (xx=-1;xx<1;xx++) /* 0=smooth, -1=previous detail
*/
                apply level 1 vertical filter at 2*x+xx,y
for (x=0;x<8/2;x++)
    starting at time 18+x*32, at even times do:
        for (y=0;y<8;y++)
            apply level 2 horizontal filter at x,y
for (x=0;x<8/2;x++)
```

```
starting at time 21+x*32, at odd times do:
    for (y=0;y<8/2;y++)
        for (xx=-1;xx<1;xx++) /* 0=smooth, -1=previous
detail */
            apply level 2 vertical filter at 2*x+xx,y
for (x=0;x<4/2;x++)
    starting at time 66+x*64 at even times do:
        for (y=0;y<4;y++)
            apply level 3 horizontal filter at x,y
for (x=0;x<4/2;x++)
    starting at time 69+x*64, at odd times do:
        for (y=0;y<4/2;y++)
            for (xx=-1;xx<1;xx++) /* 0=smooth, -1=previous detail
*/
                apply level 3 vertical filter at 2*x+xx,y
at time 138
    apply level 4 horizontal filter at 0,0
at time 140
    apply level 4 horizontal filter at 0,1
at time 141
    apply level 4 vertical filter at 0,0 /* smooth */
at time 143
    apply level 4 vertical filter at -1,0 /* previous detail */
```

TT-Transform

FIGS. 7A-7H show the results (outputs) of each one dimensional filtering operation of the TT transform. A rectangle indicates coefficients in a single wavelet tree that corresponds to the input pixels currently being processed, shading indicates coefficients that are stored from the previous tree. Values labeled "B" are intermediate results that are stored (and are the different between adjacent samples). The TT-transform is similar to the TS-transform, but requires more storage.

Figure 8:
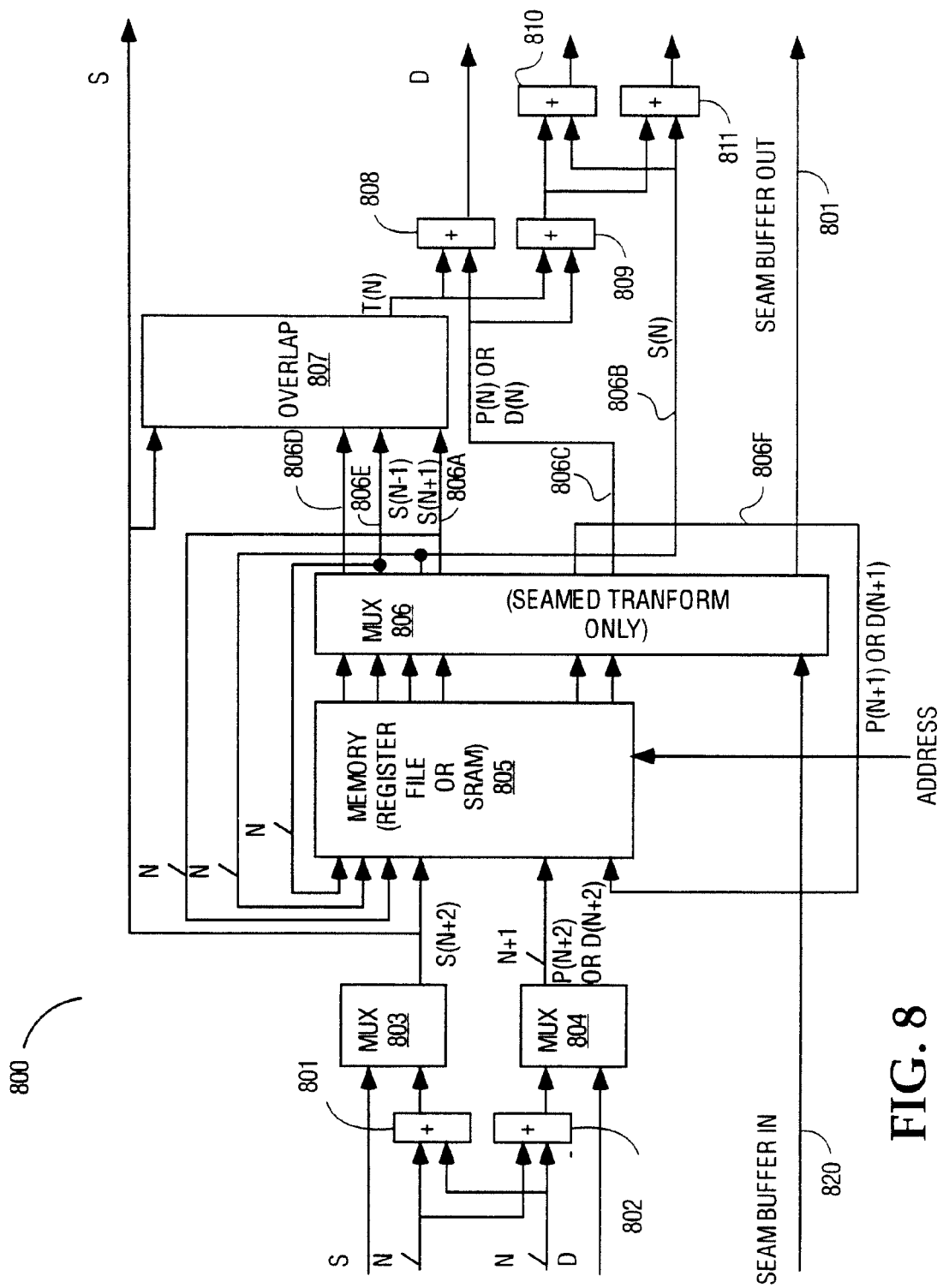
FIG. 8 is a block diagram of a 10 tap forward/inverse filter unit.

FIG. 8 is a block diagram of a 10 tap forward/inverse filter unit. Note that hardwired shifts and rounding offsets are not shown to avoid obscuring the present invention. Note that mux 806 in FIG. 8 can also be used for mirroring at transform boundaries. For one implementation of mirroring, zeroing the "d" input and multiplexing the s(n+2) input of the overlap unit is also required.

Referring to FIG. 8, adders 801 and 802 are coupled to receive the 2 n bit inputs during the forward pass of the filter unit. Adder 801 adds the 2 n bit inputs and outputs a value coupled to one input of mux 803. Adder 802 subtracts one input from the other, generating its output to one input of mux 804. Muxes 803 and 804 are also coupled to receive the s and d inputs respectively for the inverse mode operation of the filter unit. The outputs of mux 803 is an n bit input equal to s(n+2), while the output of mux 804 is an n+1 bit input that is p(n+2) for the forward pass and d(n+2) for the inverse pass.

Both outputs of muxes 803 and 804 are coupled to inputs of memory 805. Also coupled to inputs of memory 805 are the outputs 806A and 806D-F output from mux 806. Memory 805 delays the inputs to its outputs based on spatial location. In one embodiment, memory 805 comprises a register file or an SRAM which is operated in a ping pong fashion with two banks and one port per bank. An address is coupled to an input of memory to control the outputs which are generated to mux 806. In one embodiment, the address stores 16 or 28 locations per component.

The outputs of memory 805 are coupled to inputs of mux 806 along with external buffer data received from the seam buffer in 820. The output 806A of mux 806 comprises s(n+1), which is a once delayed version of s(n+2) at the output from mux 803. The output 806B of mux 806 comprises s(n), which is a twice delayed version of the output of mux 803. The output 806C of mux 806 comprises p(n) for the forward pass, which is a twice delayed version of the output of mux 806 and d(n) in the inverse pass, which is a twice delayed version of the output of mux 804. The output 806D comprises s(n−2), which is a four times delayed version of the output of mux 803. The output 806E of mux 806 comprises s(n−1), which is three times delayed of output of mux 803. Lastly, the output 806F comprises p(n+1) in the forward pass, which is a once delayed version of the output of mux 804, and d(n+1) for the inverse pass, which is a once delayed version of the output of mux 804.

Overlap unit 807 is coupled to receive the output of mux 803 along with the outputs 806A, D and E from mux 806. In response to these inputs, overlap unit 807 generates t(n). One embodiment of the overlap unit is described in FIG. 9.

The output of overlap unit 807, t(n), is coupled to one input of adders 808 and 809. Adder 808 adds t(n) to the output 806C of mux 806 to generate the D output of the filter unit. Adder 809 subtracts the output 806C of mux 806 from t(n). The output of adder 809 is coupled to an input of each of adders 810 and 811. Adder 810 adds the output of adder 809 to the output 806B of mux 806 to produce one of the n bit outputs of the filter when operating as an inverse filter unit. Adder 811 subtracts the output of adder 809 from the output 806B of mux 806 to generate the other output of the filter unit when operating as an inverse filter.

Figure 9:
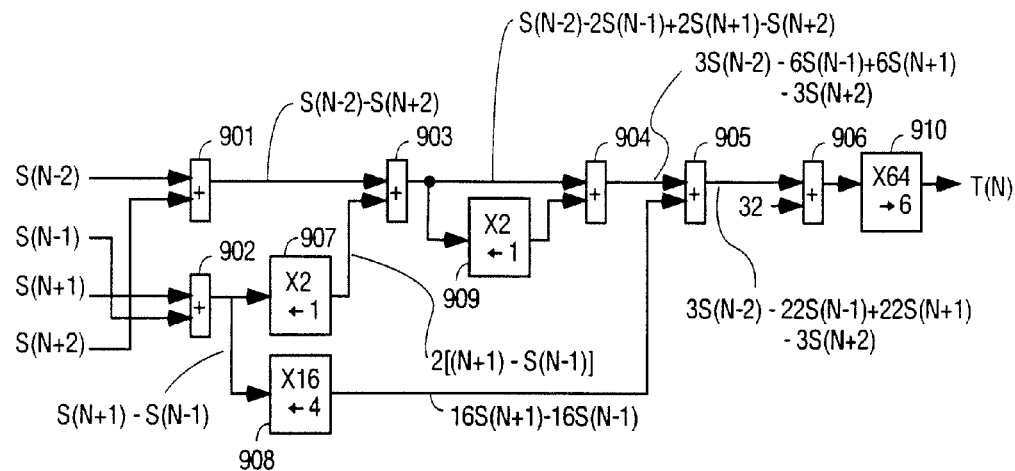
FIG. 9 is a block diagram of one embodiment of the overlap unit for the forward/inverse filter of FIG. 8.

FIG. 9 is a block diagram of one embodiment of the overlap unit for the forward/inverse filter of FIG. 8. Referring to FIG. 9, the overlap unit comprises adders 901-906, multipliers 907-909 and divider 910. Multipliers and dividers may be hardwired shifts.

The overlap unit of FIG. 9 computes t(n) for the TT transform described above. Referring to FIG. 9, adder 901 is coupled to receive the s(n+2) input and subtract it from the s(n−2) input and generates an output which is coupled to one input of adder 903. Adder 902 is coupled to receive the s(n−1) input and subtract from it the s(n+1) input. The output of adder 902 is coupled to the input of multiplier 907 and multiplier 908. Multiplier 907 multiplies its input by two. In one embodiment the multiplication is performed by shifting the bits of the input to the left one position. The output of multiplier 907 is coupled to the other input of adder 903.

Multiplier 908 multiplies the output of adder 902 by sixteen. In one embodiment, the multiplication is performed by shifting the bits that are output from adder 902 to the left four bit positions. The output of multiplexer 908 is coupled to one input of adder 905. The output of adder 903 is coupled to one input of adder 904 and also to the input of multiplexer 909.

Multiplier 909 multiplies the output of adder 903 by two. In one embodiment, this multiplication is performed by shifting the bits that are output from adder 903 to the left one bit position. The output of multiplier 909 is coupled to the other input of adder 904. The output of adder 904 is coupled to the other input of adder 905. The output of adder 905 is coupled to an input of adder 906 which adds it to 32, which is a hardwired input. The output of adder 906 is coupled to the input of the divider 910. The divider 910 divides the input by 64. In one embodiment, this division is accomplished by shifting the bits of the input to the right six bit positions. The output of divider 910 comprises the t(n) output. Note also that FIG. 9 shows each of the outputs with the current value on the lines.

Note that in both the reversible TS-transform and TT transform, like the S-transform, the low-pass filter is implemented so that the range of the input signal x(n) is the same as the output signal s(n). That is, there is no growth in the smooth output. If the input signal is b bits deep, then the smooth output is also b bits. For example, if the signal is an 8-bit image, the output of the low-pass filter is also 8 bits. This is an important property for a pyramidal system where the smooth output is decompressed further by, for example, successively applying the low-pass filter. In prior art systems, the range of the output signal is greater than that of the input signal, thereby making successive applications of the filter difficult. Also, there is no systemic error due to rounding in the integer implementation of the transform, so all error in a lossy system can be controlled by quantization. In addition, the low-pass filter has only two taps which makes it a non-overlapping filter. This property is important for the hardware implementation.

Embedded Ordering

In the present invention, the coefficients generated as a result of the wavelet decomposition are entropy coded. In the present invention, the coefficients initially undergo embedded ordering in which the coefficients are ordered in a visually significant order or, more generally, ordered with respect to some error metric (e.g., distortion metric). Error or distortion metrics include, for example, peak error and mean squared error (MSE). Additionally, ordering can be performed to give preference to bit-significance spatial location, relevance for database querying, and directionality (vertical, horizontal, diagonal, etc.).

The ordering of the data is performed to create the embedded quantization of the codestream. In the present invention, two ordering systems are used: a first for ordering the coefficients and a second for ordering the binary values within a coefficient. The ordering of the present invention produces a bitstream that is thereafter coded with a binary entropy coder.

Bit-Significance Representation

Most transform coefficients are signed numbers even when the original components are unsigned (any coefficients output from at least one detail filter are signed). In one embodiment, the embedded order used for binary values within a coefficient is by bit-plane. The coefficients are expressed in bit-significance representation prior to coding. Bit-significance is a sign-magnitude representation where the sign bit, rather than being the most significant bit (MSB), is encoded with the first non-zero magnitude bit. That is, the sign bit follows the first non-zero magnitude bit rather than preceding all of the magnitude bits. Also, the sign bit is considered to be in the same bit-plane as the most significant non-zero magnitude bit.

Bit-significance format represents a number using three sets of bits: head, tail, and sign. The head bits are all the zero bits from the MSB up to and including the first non-zero magnitude bit. The bit-plane in which the first non-zero magnitude bit occurs defines the significance of the coefficient. The set of tail bits comprises the magnitude bits after the first non-zero magnitude bit to the LSB. The sign bit simply denotes the sign, where a 0 may represent a positive sign and 1 may represent a negative sign. A number, such as $\pm 2^n$, with a non-zero bit as the MSB has only one head bit. A zero coefficient has no tail or sign bits. Table 3 shows all possible values for form bit coefficients ranging from −7 to 8.

TABLE 3

| | Bit Significance Representation for 4 Bit Values | | | | |
|---|---|---|---|---|---|
| Decimal | 2's Complement | Sign Magnitude | Bit-Significance | | |
| −8 | 1000 | | | | |
| −7 | 1001 | 1111 | 11 | 1 | 1 |
| −6 | 1010 | 1110 | 11 | 1 | 0 |
| −5 | 1011 | 1101 | 11 | 0 | 1 |
| −4 | 1100 | 1100 | 11 | 0 | 0 |

TABLE 3-continued

Bit Significance Representation for 4 Bit Values

| Decimal | 2's Complement | Sign Magnitude | Bit-Significance | | |
|---------|----------------|----------------|---|---|---|
| −3 | 1101 | 1011 | 0 | 11 | 1 |
| −2 | 1110 | 1010 | 0 | 11 | 0 |
| −1 | 1111 | 1001 | 0 | 0 | 11 |
| 0 | 0000 | 0000 | 0 | 0 | 0 |
| 1 | 0001 | 0001 | 0 | 0 | 10 |
| 2 | 0010 | 0010 | 0 | 10 | 0 |
| 3 | 0011 | 0011 | 0 | 10 | 1 |
| 4 | 0100 | 0100 | 10 | 0 | 0 |
| 5 | 0101 | 0101 | 10 | 0 | 1 |
| 6 | 0110 | 0110 | 10 | 1 | 0 |
| 7 | 0111 | 0111 | 10 | 1 | 1 |

In Table 3, the bit significance representation shown in each column includes one or two bits. In the case of two bits, the first bit is the first one bit and is followed by the sign bit.

In the case where the values are non-negative integers, such as occurs with respect to the intensity of pixels, the order that may be used is the bitplane order (e.g., from the most significant to the least significant bitplane). In embodiments where two's complement negative integers are also allowed, the embedded order of the sign bit is the same as the first non-zero bit of the absolute value of the integer. Therefore, the sign bit is not considered until a non-zero bit is coded. For example, using sign magnitude notation, the 16-bit number −7 is:

1000000000000111

On a bit-plane basis, the first twelve decisions will be "insignificant" or zero. The first 1-bit occurs at the thirteenth decision. Next, the sign bit ("negative") will be coded. After the sign bit is coded, the tail bits are processed. The fifteenth and sixteenth decisions are both "1".

Since the coefficients are coded from most significant bitplane to least significant bitplane, the number of bitplanes in the data must be determined. In the present invention, this is accomplished by finding an upper bound on the magnitudes of the coefficient values calculated from the data or derived from the depth of the image and the filter coefficients. For example, if the upper bound is 149, then there are 8 bits of significance or 8 bitplanes. For speed in software, bitplane coding may not be used. In an alternate embodiment, a bit-plane is coded only when a coefficient becomes significant as a binary number.

Coefficient Alignment

The present invention aligns coefficients with respect to each other before the bit-plane encoding. This is because the coefficients in the different frequency subbands represent different frequencies similar to the FFT or the DCT. By aligning coefficients, the present invention controls quantization. The less heavily quantized coefficients will be aligned toward the earlier bit-planes (e.g., shifted to the left). Thus, if the stream is truncated, these coefficients will have more bits defining them than the more heavily quantized coefficients.

In one embodiment, the coefficients are aligned for the best rate-distortion performance in terms of SNR or MSE. There are many possible alignments including one that is near-optimal in terms of statistical error metrics such as MSE. Alternately, the alignment could allow a physchovisual quantization of the coefficient data. The alignment has significant impact on the evolution of the image quality (or in other words on the rate-distortion curve), but has negligible impact on the final compression ratio of the lossless system. Other alignments could correspond to specific coefficient quantization, Region of Interest fidelity encoding, or resolution progressive alignment.

The alignment may be signaled in the header of the compressed data or it may be fixed for a particular application or it may be fixed for a particular application (i.e., the system only has one alignment). The alignment of the different sized coefficients is known to both the coder and decoder and has no impact on the entropy coder efficiency.

Figure 11:
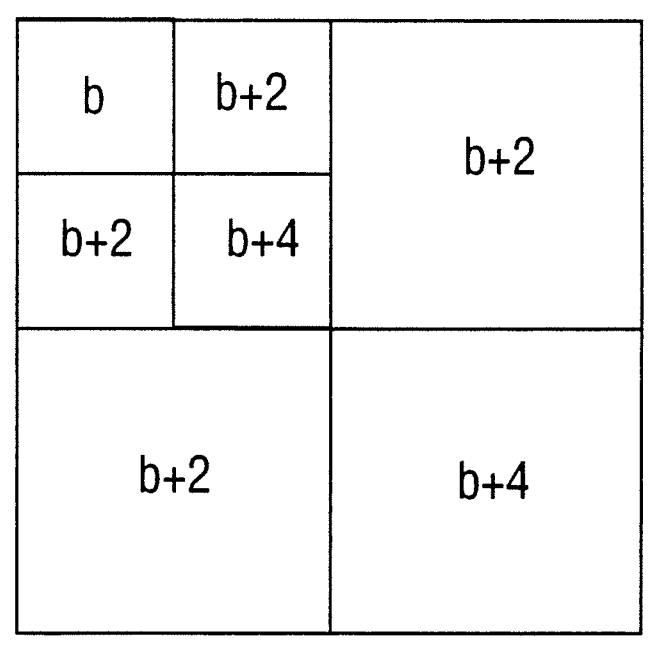
Figure 12:
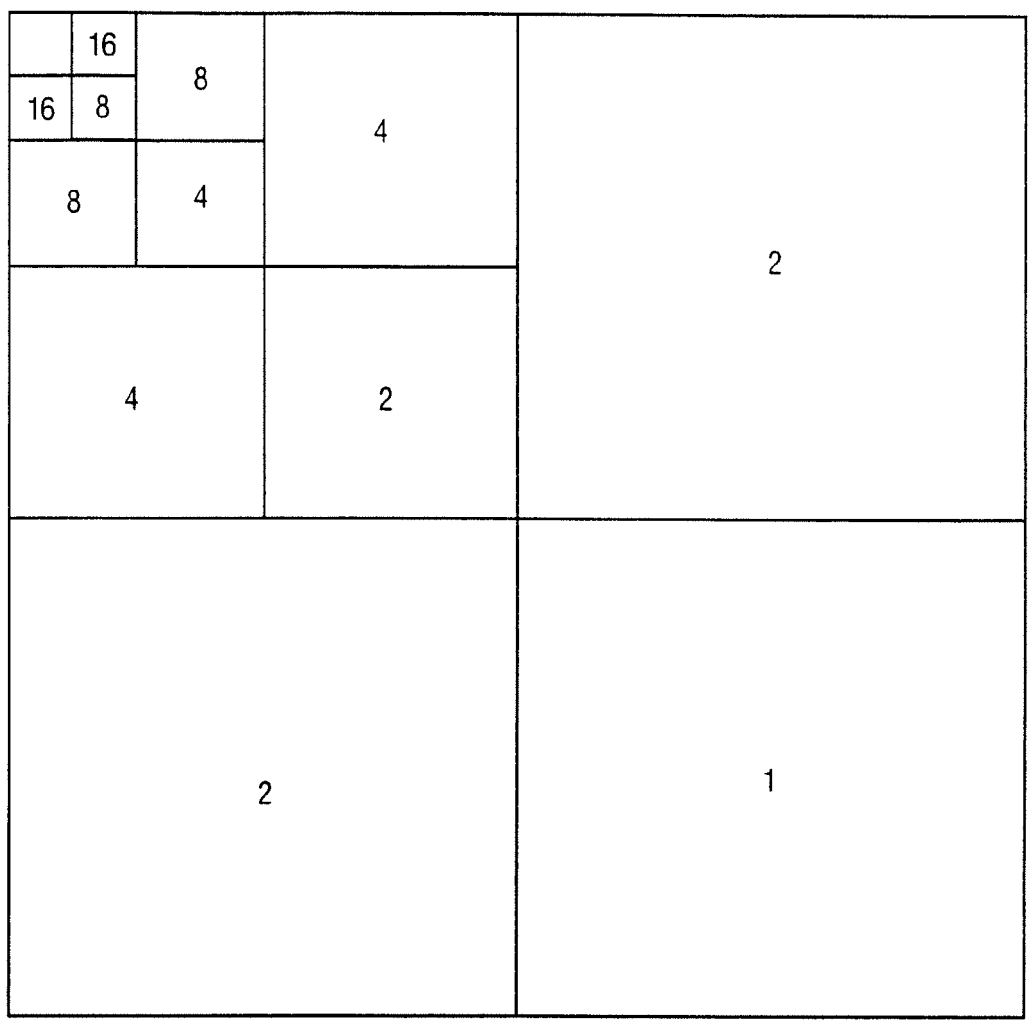
FIG. 12 is one embodiment of the multipliers for the frequency band used for coefficient alignment in the present invention.

The bit depths of the various coefficients in a two-level TS-transform and TT-transform decomposition from an input image with b bits per pixel are shown in FIG. 11. FIG. 12 is one embodiment of the multipliers for the frequency band used for coefficient alignment in the present invention. To align the coefficients, the 1-DD coefficient size is used as a reference, and shifts are given with respect to this size. A shift of n is a multiplication by $2^n$.

In one embodiment, the coefficients are shifted with respect to the magnitude of the largest coefficient to create an alignment of all the coefficients in the image. The aligned coefficients are then handled in bit-planes called importance levels, from the most significant importance level to the least significant importance level. The sign is encoded with the last head bit of each coefficient. The sign bit is in whatever importance level the last head bit is in. It is important to note that the alignment simply controls the order the bits are sent to the entropy coder. Actual padding, shifting, storage, or coding of extra zero bits is not performed.

Table 4 illustrates one embodiment of alignment numbers for aligning coefficients.

TABLE 4

| Coefficient Alignment | | | | | | | | |
|---|---|---|---|---|---|---|---|---|
| 1-DD | 1-DS, 1-SD | 2-DD | 2-DS, 2-SD | 3-DD | 3-DS, 3-SD | 4-DD | 4-DS, 4-SD |
| reference | Left 1 | Left 1 | Left 2 | Left 2 | Left 3 | Left 3 | Left 4 |

The alignment of different sized coefficients is known to both the coder and the decoder and has no impact on the entropy coder efficiency.

Note that coding units of the same data set may have different alignments.

Ordering of the Codestream and the Context Model

Figure 10:
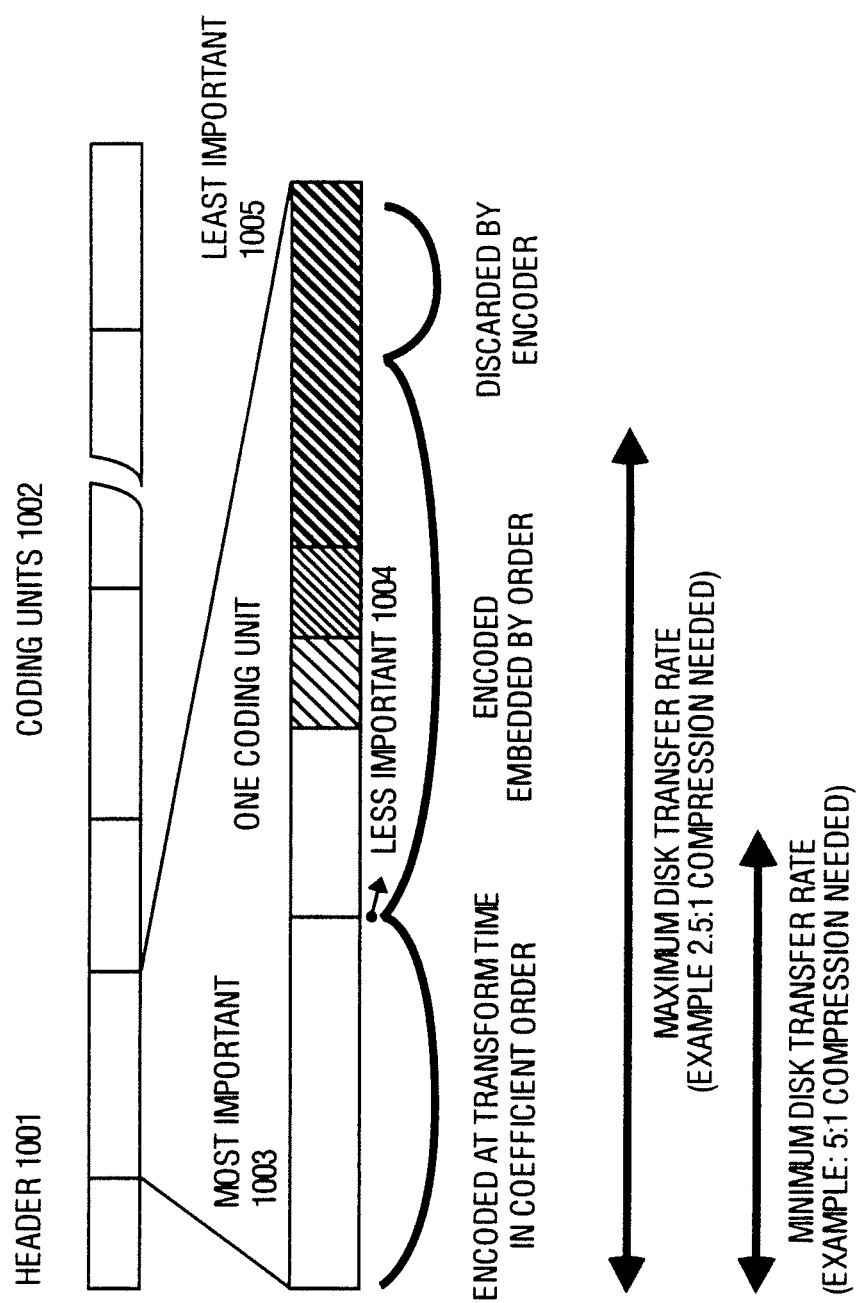
FIG. 10 illustrates the ordering of the codestream and the ordering within a coding unit.

FIG. 10 illustrates the ordering of the codestream and the ordering within a coding unit. Referring to FIG. 10, the header 1001 is followed by the coding units 1002 in order from top band to bottom. (The header 1001 is optional in applications designed for a single image type.) Each coding unit includes most important data 1003, less important data 1004, and least important data 1005.

The context model determines both the order in which data is coded and the conditioning used for specific bits of the data. Ordering will be considered first. The highest level ordering of the data has already been described above. The data is divided into "most important data", referred to interchangeably herein as the most important chunk (MIC), which is coded losslessly in transform order and "less important data" which is referred to interchangeably herein as the least important chunk (LIC) and is coded in an embedded unified lossless/lossy manner.

The order that the coefficients during each bit-plane are processed are from the low resolution to the high resolution (from low frequency to the high frequency). The coefficient subband coder within each bit-plane is from the high level (low resolution, low frequency) to the low level (high resolution, high frequency). Within each frequency subband, the coding is in a defined order. In one embodiment, the order may be raster order, 2×2 block order, serpentine order, Peano scan order, etc.

In the case of a four level decomposition using the codestream of FIG. 3, the order is as follows:

4-SS, 4-DS, 4-SD, 4-DD, 3-DS, 3-SD, 3-DD, 2-DS, 2-SD, 2-DD, 1-DS, 1-SD, 1-DD

One embodiment of the context model used in the present invention is described below. This model uses bits within a coding unit based on the spatial and spectral dependencies of the coefficients. The available binary values of the neighboring coefficients and parent coefficients can be used to create contexts. The contexts, however, are causal for decodability and in small numbers for efficient adaptation.

The present invention provides a context model to model the bitstream created by the coefficients in the embedded bit-significance order for the binary entropy coder.

Figure 37:
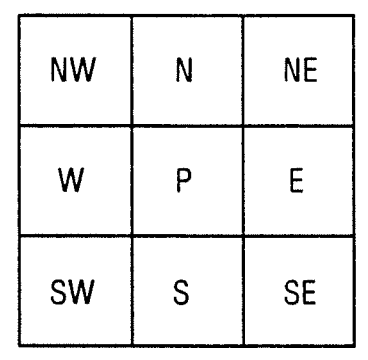

FIG. 37 shows the neighborhood coefficients for every coefficient of a coding unit. Referring to FIG. 37, the neighborhood coefficients are denoted with the obvious geographical notations (e.g., N=north, NE=northeast, etc.). Given a coefficient, such as P in FIG. 37, and a current bit-plane, the context model can use any information from all of the coding unit prior to the given bit-plane. The parent coefficient of the present coefficient is also used for this context model.

The head bits are the most compressible data. Therefore, a large amount of context, or conditioning, is used to enhance compression. Rather than using the neighborhood or parent coefficient values to determine the context for the present bit of the present coefficient, the information is reduced to two signaling bits described in conjunction with FIG. 13A. This information can be stored in memory or calculated dynamically from the neighbor or parent coefficient.

Implementing Embedding for Storage to Disk

One embodiment of the embedding scheme for the present invention is based on the fact that when starting to encode data, the entire band buffer memory is full of data, such that there is no extra space available in the band for use as workspace memory. The present invention writes some of the less important data to memory to be embedded later. In the present invention, the data that is to be embedded is stored in memory and this is the less important data. The more important data is encoded directly. The least important data comprises some number of the least significant bits.

In one embodiment, if a portion of each coefficient is written back to memory for encoding later, the head and tail bits must be known as well as whether the sign bit has been done in order to ensure proper encoding. In one embodiment, two or more signaling bits (e.g., 3, 4, 5, etc.) are used to indicate the head, tail and sign bit information.

In one embodiment, where 8-bit memory locations are used, two signaling bits indicate the head, tail and sign bit information. The use of two signaling bits allows the least important 6 importance levels to be written back to memory with the two signaling bits. One signal bit indicates whether the most significant bit of the 6 importance levels is a head or tail bit. If the first signaling bit indicates that it is a head bit, then the second signaling bit is the sign for the coefficient. On the other hand, if the first signaling bit indicates that the most significant bit of the data written back to memory is a tail bit, then the second signaling bit is a free signaling bit which can indicate additional tail information, such as, for example, whether the most important tail bit is the first tail bit or a later tail bit.

Figure 13A:
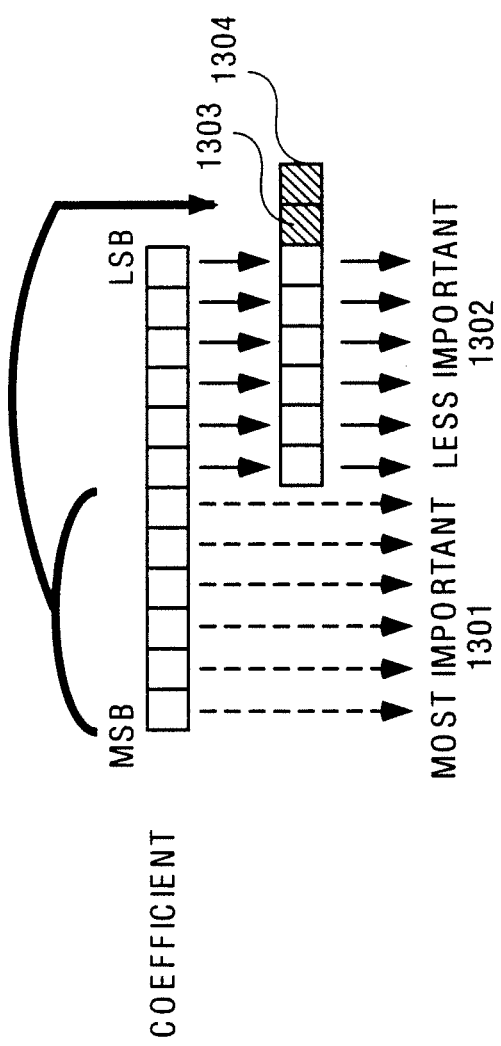
FIG. 13A shows a coefficient divided into most important data and less important data.

FIG. 13A shows a coefficient divided into most important data 1301, referred to as the MIC, and less important data 1302, referred to as the LIC. In one embodiment, the MIC comprises the 6 higher order bits of each coefficient, while the LIC comprises the 6 lower order bits. Most important data 1301 is sent to the context model to be coded immediately in coefficient order. No buffering in external memory is necessary for this data. Less important data 1302 is written to memory (e.g., RAM) to be coded later and embedded by order. In addition, the two signaling bits in the data written to memory. Signaling bit 1303 indicates whether the most significant bit in the data written to memory is a head bit. Signaling bit 1304 gives the sign for the coefficient or indicates if the first tail bit is contained in the data or not. Note that the signaling bits may be stored in a concatenated fashion with less important data 1302 or may be stored in another memory or memory location that is associated with the memory storing less important data 1302 so that the signaling bits associated with each portion of a coefficient may be identified.

Examples in Table 5 show the use of the two signaling bits. The columns of the body of Table 5 are intended to line up with the data types in FIG. 13A. Sign bits are denoted with "S", tail bits are denoted with "T", do not care bits are denoted with "x", the value of the tail-on bit is denoted with "h" or "t". In Table 5, h=0 and t=1 for the signaling bits. In an alternative embodiment, the conventions may be reversed. In one embodiment, a sign bit in Table 5 of 0 indicates a positive sign, while a sign bit in Table 5 of 1 indicates a negative sign. An opposite assignment may be used. Note the sign bit is always kept with the first "on" bit, so it can be coded at the same time for embedding.

TABLE 5

| magnitude | most important (lossless) | | less important (bitplane embedded) | signaling bits |
|---|---|---|---|---|
| 1xxxx | x | 0000000 | 01TTTTT | h s |
| 1xxxxx | x | 0000000 | 1TTTTT | h s |
| 1xxxxxx | S | 0000001 | TTTTTT | t 0 |
| 1xxxxxxx | S | 000001T | TTTTTT | t 1 |
| 1xxxxxxxx | S | 00001TT | TTTTTT | t 1 |
| 1xxxxxxxxx | S | 0001TTT | TTTTTT | t 1 |

In Table 5 above, the "T" refers to the corresponding bit in the coefficient and may be a 0 or 1.

In one embodiment, during decoding, when the most important data is decoded, it is written to memory, and at the same time, the proper two signaling bits are written to memory to initialize the memory for storing the less important data. (Depending on the alignment of the coefficients, some of the most important data may be stored in the second byte also.) With this initialization, decoding the less important data one bitplane at a time only requires reading and then writing one byte (or less in some embodiments) per coefficient. When the coefficients are read to be input to the inverse transform, they are converted into a normal numerical form (e.g., two's complement form).

Figure 13B:
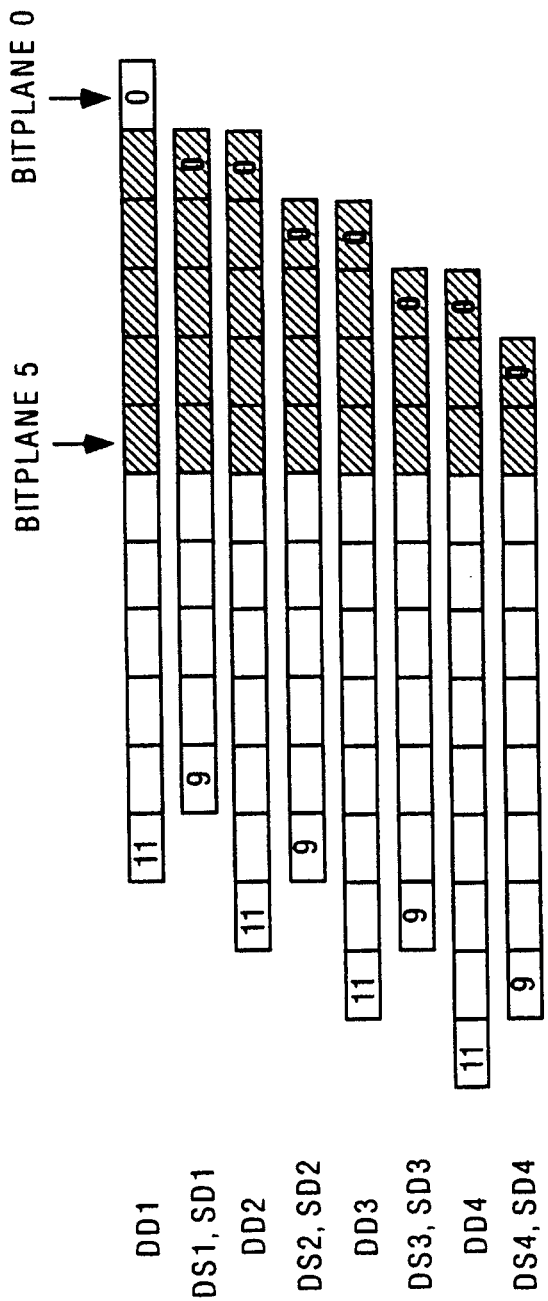
FIG. 13B shows the lossless case where no data is discarded.
Figure 13C:
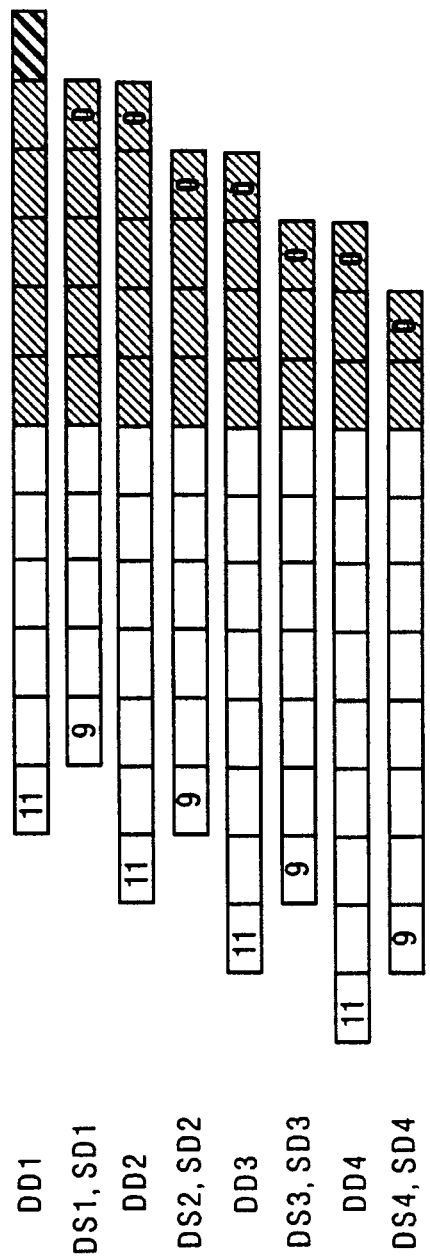
FIG. 13C shows the case where one bitplane of data has been discarded (i.e., Q=2) because discarding a bitplane is equivalent to division by 2.

In addition to having "most important data" and "less important data", there may also be data that is discarded or quantized during encoding. Coefficients are divided by a quantization scale factor $2^{Q-1}$. (Quantization of coefficients is described in the JPEG Standard.) In the present invention, the quantization is a power of two, since division is accomplished by discarding bitplanes. For instance, Q=1 represents division by 1 and, thus, the coefficients don't change, while Q=2 represents division by 2, which means one bit plane is discarded. These divisions may be implemented using shifts (e.g., shift by one bit position for Q=2). FIGS. 13B and 13C illustrate the format of the most important and less important data when both quantization and coefficient alignment for different subbands is taken into account.

FIG. 13B shows the lossless case where no data is discarded. Following the convention of JPEG, this is called quantization Q=1, because the actual coefficient are divided by 1 (lossless). The most important data is indicated without cross-hatching, while the least important data is cross-hatched.

FIG. 13C shows the case where one bitplane of data has been discarded (i.e., Q=2) because discarding a bitplane is equivalent to division by 2. The discarded bitplane is shown in black.

Note that in addition to what is shown in FIGS. 13B and C, the most important data also includes the SS coefficients. Although coefficients are shown for eight-bit data, the use of a reversible color space would require nine-bit data, increasing the size of chrominance coefficients by one bit.

In the present invention, the sign bit context model comprises encoding the sign after the last head bit. There are three contexts for the sign depending on whether the N coefficient is positive, negative or the sign is not yet coded. Alternatively, one context can be used for the sign or the sign can always be coded as 50%.

Order of Coding for Wavelet Coefficients

One embodiment of the ordering of coding for wavelet coefficients is summarized in the following pseudo-code:

```
code the most important data
code the position of the first less important bitplane with data
for each less important data bitplane do
    code a less important data bitplane
```

When the most important data is encoded, the first bitplane in the less important data that is not comprised entirely of zero head bits is determined for each coefficient. This allows the encoder and decoder to look-ahead over entire bitplanes of less important data. This is especially useful for coding units of black and white data where all the information is in the K coefficients and the CMY coefficients are all zero. Not coding bitplanes individually helps compression ratio, particularly if R2(7) is the longest run length code available. (See U.S. Pat. Nos. 5,381,145 and 5,583,500 for a description of "R2" codes.) However, if the four parallel coding cores operate on components synchronously, the speed of processing is determined by the component with the most bitplanes to code; cores assigned to other components are idle during uncoded bitplanes.

Figure 14:
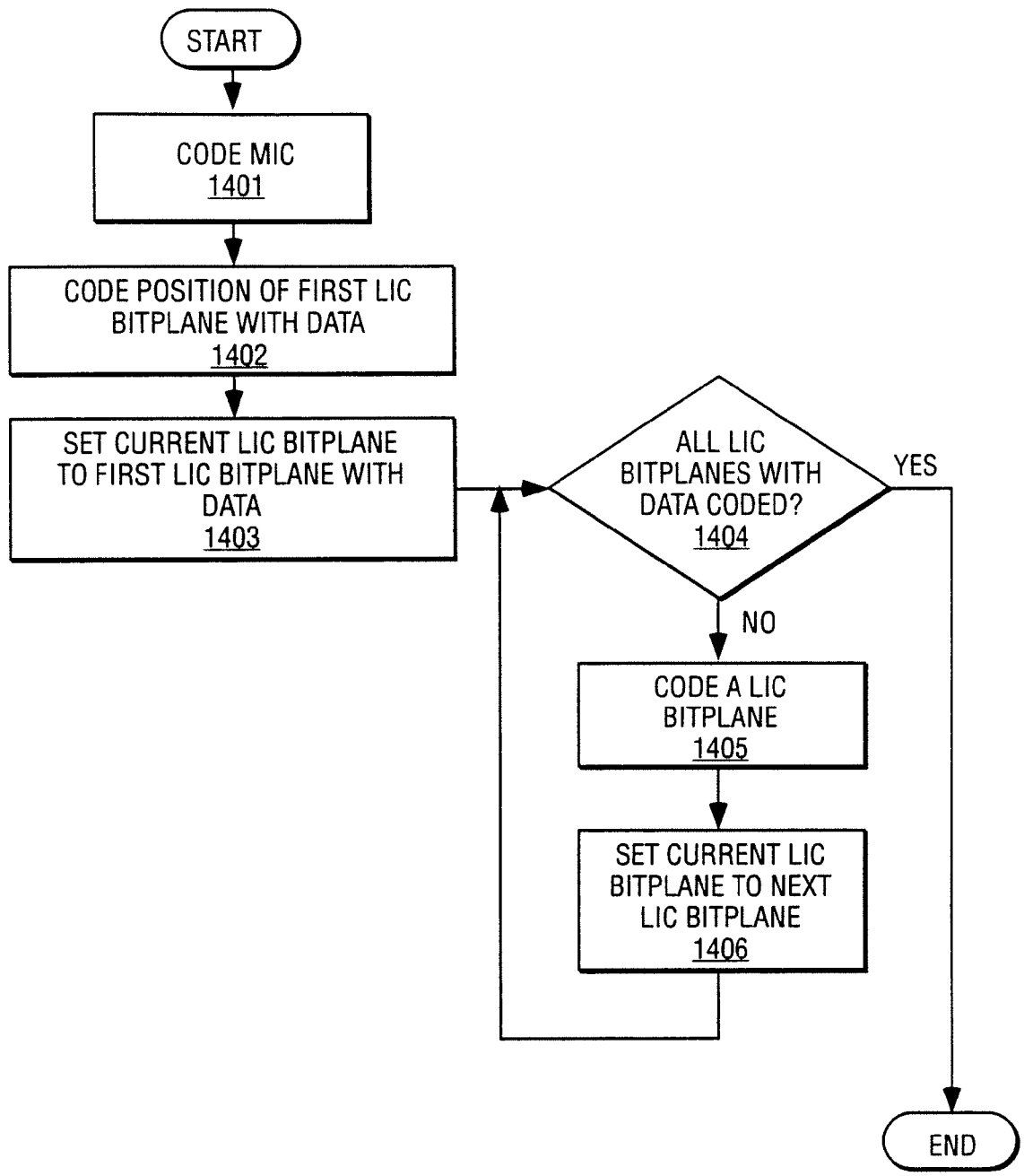
FIG. 14 is a flow chart illustrating one embodiment of the operation of the compression/decompression system.

A flow chart illustrating one embodiment of the operation of the pseudo code above is shown in FIG. 14. Referring to FIG. 14, the context model begins by coding the most important chunk (MIC) (processing block 1401). After coding the MIC, the processing logic codes the position of the first least important chunk (LIC) bitplane with data (processing block 1402). This is for the entire coding unit. Either 0, 1, 2, 3, 4, 5 or 6 bitplanes will contain data if there are 6 bitplanes in the LIC. Then, the processing logic sets a current LIC bitplane variable to the first LIC bitplane with data (processing block 1403).

Next, a test determines if all the LIC bitplanes with data have been coded (processing block 1404). If so, the process ends; if not, the processing logic codes a LIC bitplane (processing block 1405) and sets the current LIC bitplane variable to the next LIC bitplane (processing block 1406). Thereafter, processing loops back to processing block 1404.

Order of Coding for Most Important Data

One embodiment of the order of coding for the most important data is as follows:

```
for each tree do
    code the SS coefficient
    perform MIC lookahead (or perform tree lookahead)
    for each non-SS coefficient
        for each bit (plane) with data do
            code head or tail bit
    if the coefficient is not zero
        code sign bit
```

The most important data is processed one wavelet tree at a time. To reiterate, it is not embedded. An MIC look-ahead determines bitplanes that are all zero head bits for all non-SS coefficients in the wavelet tree. In one embodiment, a four-bit number is sufficient to identify the first bitplane to code individually. In an alternate embodiment shown in FIG. 15, one bit is used to indicate all non-SS coefficients 1501 of the second decomposition (hatched region) are zero and another bit to indicate all non-SS coefficients 1503 of the first decomposition are zero. These two bits are used in addition to the four bits used to specify the first bitplane.

In an alternate embodiment, a tree lookahead may be used where the SS coefficients are coded and then for the whole tree, the first bit plane with non-zero head bits is coded.

To account for context revisit delay if conditioning is used for the SS and first bitplane coding, the actual coding/decoding of bits of the SS coefficient (which is 9 bits if a reversible color space is used) and the look-ahead value can be alternated. If conditioning is not used, alternating is not required.

Figure 15:
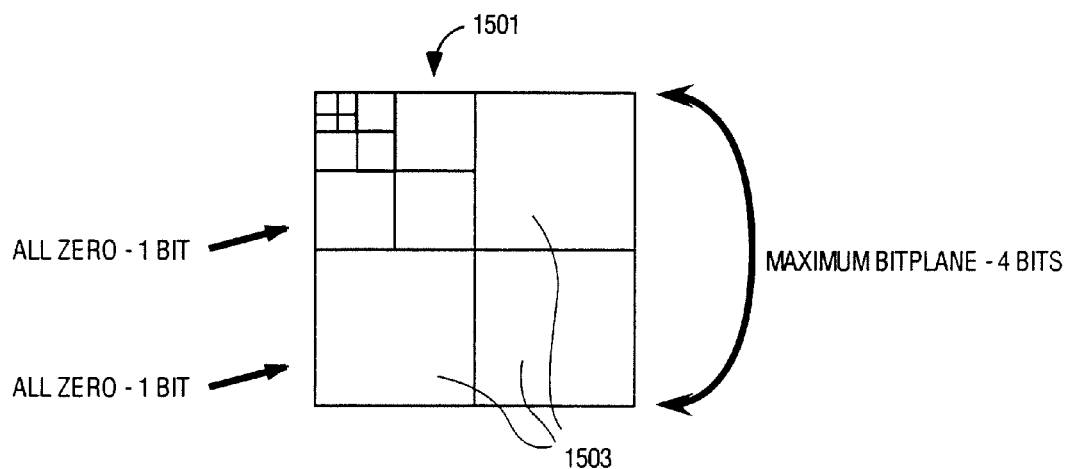
FIG. 15 shows one embodiment where 6 bits are used for each tree.

As discussed previously, the context model of the present invention uses a look-ahead. One embodiment of the look-ahead may be employed for the most important data, i.e. the most important chunk (MIC). In one embodiment, as shown in FIG. 15, for each tree, 6 bits are used: 4 for maximum bit plane, 1 for level 0 all zero, 1 for level 1 all zero. If the maximum bitplane is zero, then the two extra bits are redundant, but this is not important. Otherwise, one adaptive coding decision is used to decide "(isolated) zero/non-zero". For non-zero coefficients, they may be further specified by:

One M-ary operation to determine the value and sign of coefficient. (Total: 2 cycles per coefficient).

One adaptive coding decision is used to decide "±1/not ±1". A second cycle is used to get the sign with the magnitude is 1 and the sign and value for magnitudes greater than 1. (Total: 3 cycles per coefficient)

Similarly, "±1/not ±1", "±2,3/not ±2,3", and so on could be done for a total of 4 cycles per coefficient.

The following procedure:

```
if all bitplanes in the MIC not are zero then
    adaptively code a decision "-1, 0, 1" or "other"
    if "-1, 0, 1" then
        adaptively code a decision "0" or "-1,+1"
        if "-1,+1" then
            specify sign bit
    else
        adaptively code a decision "-3, -2,2,3" or "other"
        if "-3, -2,2,3" then
```

```
        specify "-2,2" or "-3,3" with one bit
        specify sign bit
    else
        specify value with the maximum number of bit that
            was determined for tree
        specify sign bit
```

It should be noted that "specifying" a bit or bits can be coding adaptively, coding at 50% probability or simply copying bits to the coded data stream.

If all or most of the bitplanes are to be individually coded, some levels of the transform may have unused bitplanes due to alignment—unused bitplanes are never coded. There are a number of options for handling bit to context delay for the head and tail bits. One method is to do three coefficients in alternation: a DD, a SD and the a DS. The sign bit for non-zero coefficients can be coded at the end of the coefficient—since all of the most important data is always lossless, exactly following the first "on" bit is not necessary.

Figure 16:
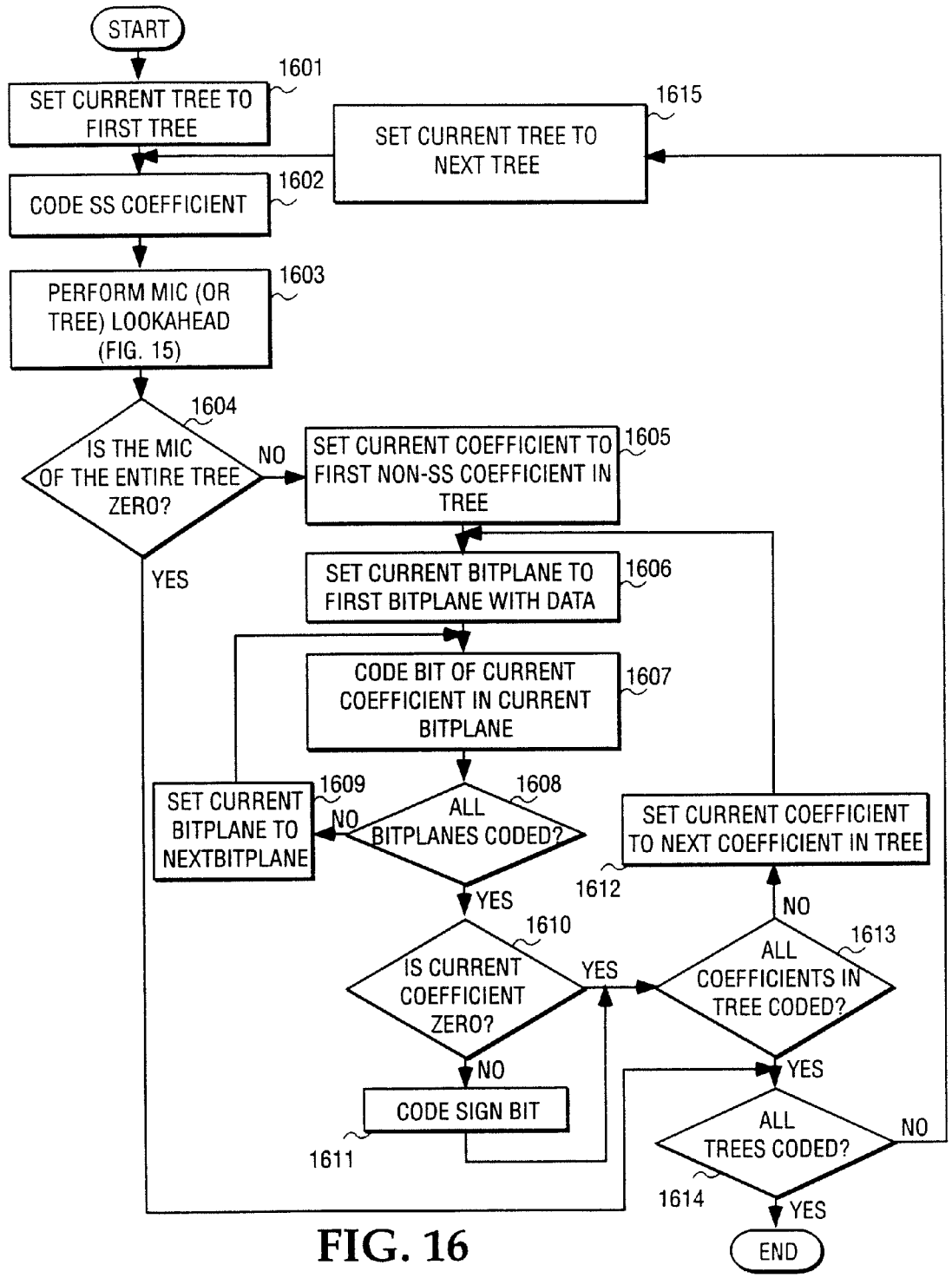
FIG. 16 is a flow chart for coding the most important chunk.

One embodiment of flow chart illustrating the pseudo code for coding the most important chunk is shown in FIG. 16. Referring to FIG. 16, the process begins with the processing logic setting the current tree to the first tree (processing block 1601). Then, the processing logic codes the SS coefficient (processing block 1602). After coding the SS coefficient, the processing logic codes the position of the first bitplane with data in the MIC of the tree (processing block 1603) or performs the MIC lookahead.

Then, the processing logic tests whether the MIC of the entire tree is zero (processing block 1604). If the MIC of the entire tree is zero, the processing continues at processing block 1614; otherwise, processing transitions to processing block 1605 where the processing logic sets the current coefficient to the first non-SS coefficient in the tree.

After setting the current coefficient to the first non-SS coefficient in the tree, the processing logic sets the current bitplane to the first bitplane with data (processing block 1606). Then, the processing logic codes a bit of the current coefficient in the current bitplane (processing block 1607). Afterwards, the processing logic tests whether all the bitplanes have been coded (processing block 1608). If all the bitplanes have not been coded, the processing logic sets the current bitplane to the next bitplane (processing block 1609) and transitions to processing block 1607. If all the bitplanes have been coded, the processing logic tests whether the current coefficient is zero (processing block 1610). If the current coefficient is not zero, the processing logic codes the sign bit (processing block 1611) and processing transitions to processing block 1613. If the current coefficient is zero, then the processing logic transitions to processing block 1613.

At processing block 1613, the processing logic tests whether all coefficients in the tree have been coded. If all the coefficients in the tree have not been coded, then the processing logic sets the current coefficient to the next coefficient in the tree (processing block 1612) and the processing transitions to processing block 1606. If all of the coefficients in the tree have been coded, then the processing logic tests whether all trees have been coded (processing block 1614). If all the tree have been coded, processing ends; otherwise, processing transitions to processing block 1615 where the processing logic sets the current tree to the next tree and the processing transitions to processing block 1602.

Figure 17:
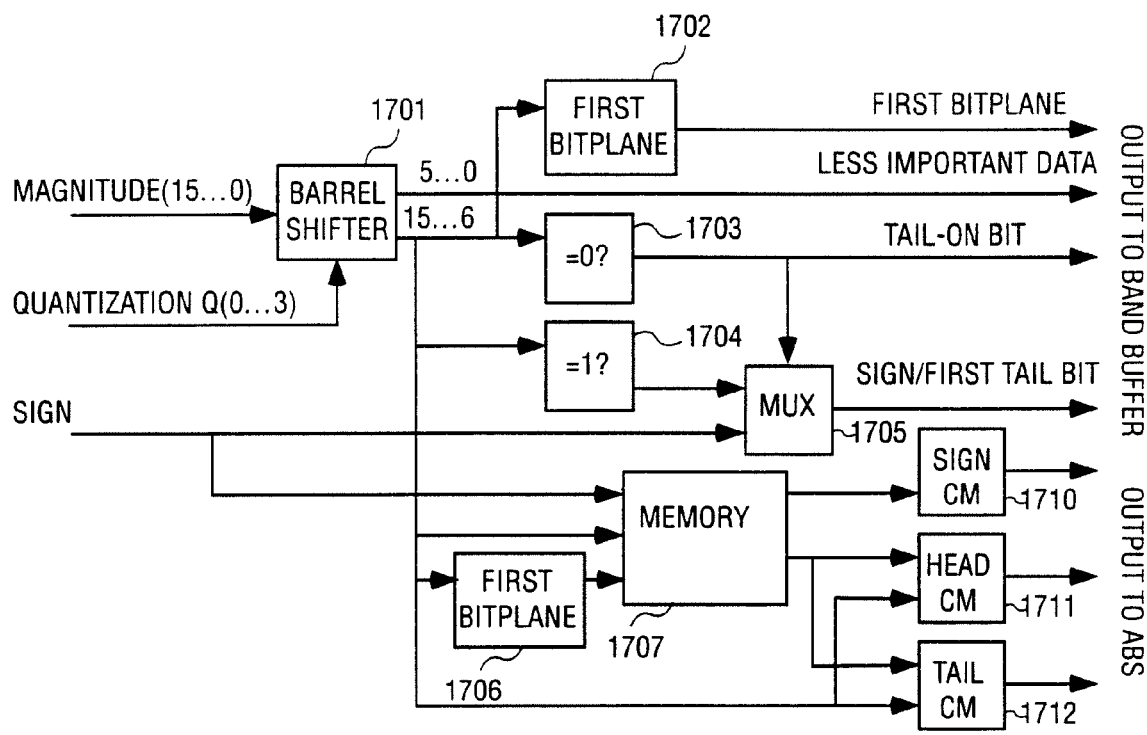
FIG. 17 is a block diagram of one embodiment of the formatting unit and context model used during the most important data coding pass.

FIG. 17 is a block diagram of one embodiment of the formatting unit and context model used during the most important data coding pass. Referring to FIG. 17, a barrel shifter 1701 is coupled to receive the magnitude of the coefficient and a quantization level that was used during encoding to prevent the most important data from exceeding the minimum disk bandwidth, ensuring lossless decompression. Thus, the quantization level controls barrel shifter 1701. In one embodiment, barrel shifter 1701 shifts the magnitude bits by 0, 1, 2 or 3 to support quantizations of 1, 2, 4 or 8. In an alternative embodiment, a lower or higher number of quantizations are supported, such as only two quantizations.

The output of barrel shifter 1701 comprises the lower order six bitplanes which is the less important data and the rest of the higher order bits which is the most important data. In an alternate embodiment, a simple separation mechanism is used to produce these two outputs.

Both outputs of barrel shifter 1701 are input to first bitplane unit 1702, which determines which bit planes have data in them. First bit plane unit 1702 is used to find the bitplane with first "on" bit for the entire coding unit (see FIG. 10) for use when processing the less important data. Another bit plane unit 1706 is coupled to receive the most important data output from barrel shifter 1701 as well. First bitplane unit 1706 is used for each tree when processing the more important data. One embodiment of the first bitplane unit is described below with reference to FIG. 18.

Barrel shifter 1701 is also coupled to comparison units 1703 and 1704, which perform two comparisons on the most important data to generate the two bit signaling information for the less important data. Comparison unit 1703 determines if the most important data is equal to 0, thereby indicating whether a tail bit has occurred already (i.e., whether coding is in the tail yet). The output of comparison unit 1703 is the tail-on bit. Comparison unit 1704 determines whether the most important data is equal to 1. If the most important data is equal to 1, then from Table 5 above the output is 0. The output of comparison unit 1704 is coupled to one input of multiplexer (MUX) 1705. The other input to mux 1705 is coupled to receive the sign bit. A select input of mux 1705 is controlled by the output of comparison unit 1703, such that if the output of comparison unit 1703 indicates that the bit is a tail bit, then the output of mux 1705 is a "first tail" bit 1304. However, if the output of comparison unit 1703 indicates that the bit is the head bit, then mux 1705 is controlled to output the sign.

In one embodiment, the comparison units 1703 and 1704 may be implemented using simple bit comparators.

A memory 1707 is coupled to receive the sign bit, the most important data output from barrel shifter 1701 and the output of bit plane unit 1706. Memory 1707 is used to delay coefficients so that parent and neighboring information is available for the conditioning. The organization of memory 1707 is discussed below.

Context models (CM) 1710-1712 provide conditioning for the sign, head, tail and other bits. Each of these context models is described in below.

Figure 18:
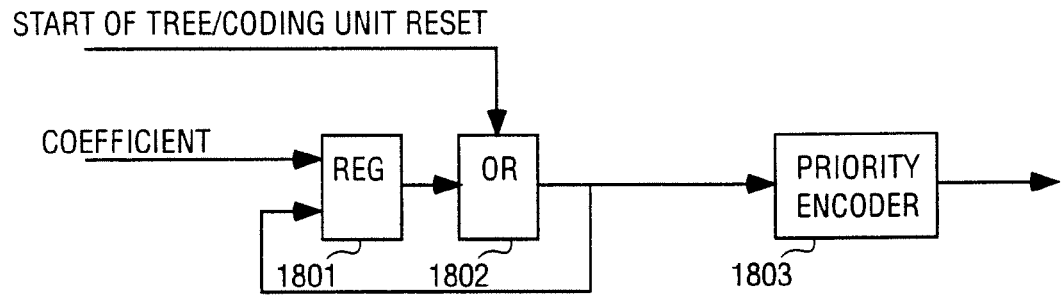
FIG. 18 illustrates one embodiment of a first bitplane unit.

FIG. 18 illustrates one embodiment of a first bitplane unit. Referring to FIG. 18, first bitplane unit 1800 comprises an OR gate 1801 coupled to receive a coefficient and a feedback from the output of a register 1802. The output of OR gate 1801 is coupled to the input of register 1802. Register 1802 is controlled by a start of tree/coding unit reset indication. The output of register 1802 is coupled to a priority encoder 1803. The output of the priority encoder 1803 is the output of first bitplane unit 1800.

At the start, register 1802 is cleared. Each bit of register 1802 is ORed with each bit of the input coefficient using OR gate 1801. For each bit of the coefficient that is 0, the value of register 1802 remains its current value, which is output to priority encoder. For each bit of the coefficient that is a 1 (e.g., the first one), the output of OR gate 1801 to register 1802 is a 1, which is output to the priority encoder 1803. The priority encoder 1803 then locates the first 1, which is the first bitplane of the coefficient that has a 1.

Order of Processing for Less Important Data

Each bit plane for the least important data is processed as follows:

```
for each tree do
    for each coefficient do
        if start of look-ahead interval
            do took-ahead
        if look-ahead not active
            code head or tail bit
            if first "on" bit
                code sign bit
```

Figure 19:
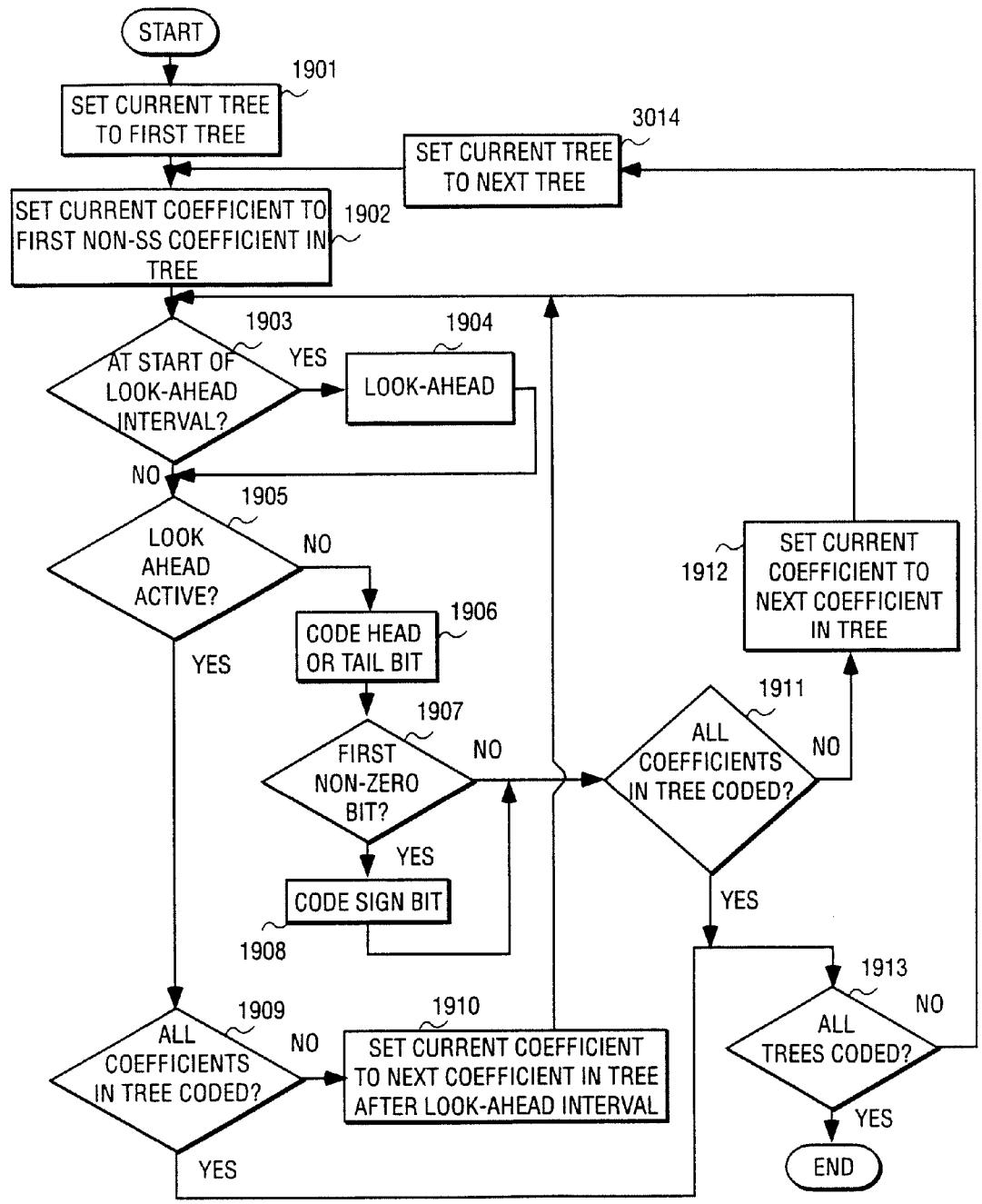
FIG. 19 is a flow chart illustrating one embodiment of the process of coding a LIC bitplane.

One embodiment of the process of coding a LIC bitplane is shown in the flow chart of FIG. 19. The process of coding an LIC bitplane begins with processing logic setting the current tree to the first tree (processing block 1901). Then, the processing logic sets the current coefficient to the first non-SS coefficient in the tree (processing block 1902). After setting the current coefficient to the first non-SS coefficient in the tree, the processing logic tests whether the coding is at the start of a look-ahead interval (processing block 1903). If the coding process is at the start of a look-ahead interval, the processing logic performs a look-ahead (processing 1904) and processing continues at processing block 1905. If the coding process is not at the start of a look-ahead interval, processing logic transitions directly to processing block 1905 and determines is look-ahead is active.

If look-ahead is active, processing continues at processing block 1909 where the processing logic determines if all the coefficients in the tree are coded. If all the coefficients in the tree are coded, processing continues at processing block 1913; otherwise, the processing logic sets the current coefficient to the next coefficient in the tree after the look-ahead interval (processing block 1910) and the processing transitions to processing block 1903.

If the look-ahead is not active, the processing logic codes the head or tail bit (processing block 1906) and then tests whether the first non-zero bit has been received (processing block 1907). If the first non-zero bit has not been received, processing continues at processing block 1911. If the first non-zero bit has been received, processing continues at processing block 1908 where the processing logic codes the sign bit and processing then transitions to processing block 1911.

At processing block 1911, the processing logic determines whether all coefficients in the tree have been coded. If all coefficients in the tree have not been coded, the processing logic sets the current coefficient to the next coefficient in the tree (processing block 1912) and transitions to processing block 1903. If all the coefficients in the tree have been coded, the processing transitions to processing block 1913 where the processing logic tests whether all trees have been coded. If all the trees have not been coded, processing logic sets the current tree to the next tree (processing block 1914) and processing continues at processing block 1902. If all the trees have been coded, the processing ends.

Processing a wavelet tree at a time may not be important, but since the transform causes data to be read and written in that order, it may be convenient. If data is processed by wavelet trees, bit to context delay can be accommodated by alternating between DD, SD and DS coefficients (alternating between sub-trees). Otherwise, one subband at a time can be coded. Regardless of the order chosen, unused head/tail bits due to alignment of different subbands are never coded and do not require idle cycles.

Figure 20:
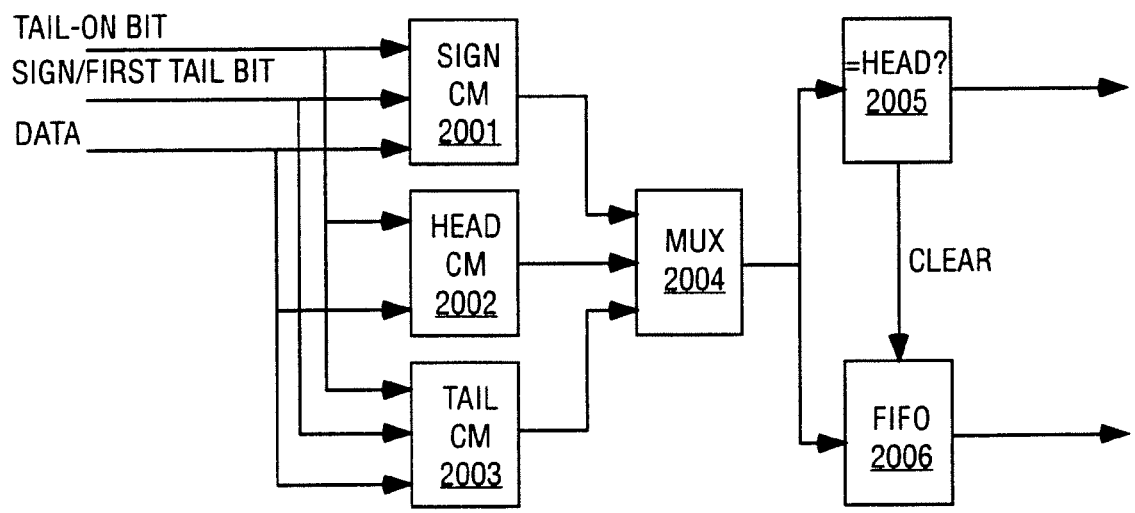
FIG. 20 is a block diagram of one embodiment of the look-ahead and context models for less important data.

FIG. 20 is a block diagram of one embodiment of the look-ahead and context models for less important data. In one embodiment, the most important data and the less important data use the same context models (CM) that provide conditioning for the sign, head and tail bits.

Referring to FIG. 20, context models 2001-2003 are coupled to the input data. A sign context model 2001 is coupled to receive the tail-on bit, a sign/first tail bit signal, and the data. The head bit context model 2002 is coupled to receive the tail-on bit and the data. The tail bit context model 2003 is coupled to receive the tail-on bit, a sign/first tail bit signal, and the data. In response to their inputs, each of context models 2001-2003 generate a context.

The contexts generated by context models 2001-2003 are coupled to inputs of mux 2004. Mux 2004 is controlled by the previous bits and the bit significance representation itself. The head content model 2002 is used until a 1 bit is seen at the data input. The sign content model 2001 is used when the last bit was the first 1 bit of the head. Thereafter, the tail content model 2003 is used.

The output of mux 2004 is coupled to "=head?" unit 2005 and first-in/first-out (FIFO) buffer 2006. The "=head?" unit 2005 tests if the current context is a head bit context with zero head bits in the neighborhood and parent. If all the context are in the head, a signal from "=head?" unit 2005 clears FIFO 2006.

The contexts and results are buffered in FIFO 2006 or other memory for the look-ahead interval. At the end of the interval, if necessary a look-ahead decision and/or individual decisions are coded. If the coefficients are processed one wavelet tree at a time, the FIFO for look-ahead can be a single FIFO used for all subbands or multiple FIFOs can be used, one for each subband.

Note that if it was convenient to reduce multiplexing, the most important data could use look-ahead too. However, it may be somewhat redundant to use both look-ahead and first bitplane for each tree.

If a core assigned to one component codes a sign bit, cores assigned to any other components that do not code a sign bit at the same bitplane will be idle. Therefore, up to four clock cycles could be used for sign bits if each core codes a sign bit on a different bitplane. In one embodiment, there are up to six head or tail bits per coefficient.

One possible timing problem is that the most important chunk compresses sufficiently well that the disk is idle during the decoding of a portion of that data. If there is sufficient memory bandwidth to the band buffer, look-ahead may be used to process the most important data faster. Then the less important data can get a head start. Also, it would be good if the disk had a burst transfer rate that was higher than the maximum sustained rate. Hard disks normally have a significant buffer, and perhaps reading ahead into this buffer would eliminate the idle time.

Conditioning a Portion of the Context Model

The conditioning used in the context model is dependent on hardware cost versus compression trade-offs. Therefore, in the following sections, many options for conditioning are presented for designers to consider.

Context Model for SS Coefficients

In one embodiment of the context model, SS coefficients are not coded. Since they make up only 1/256th of the original data, there is little gain to coding them. If coding them is desired, they could be handled by Gray coding, conditioning on previous bit in the same coefficient, and/or on corresponding bit in the previous coefficient.

Context Model for First Bitplane Information

The four bits of first bitplane information for the most important data each wavelet tree can be treated in a similar fashion to the SS coefficients. The increase the size of the original data by only 1/512th. In one embodiment, they can be uncoded due their small size compared to the original data or undergo gray coding and some conditioning.

Similarly, if six bits are used according to FIG. 15, they can be treated like SS coefficients.

Context Model for Head Bits

Figure 21:
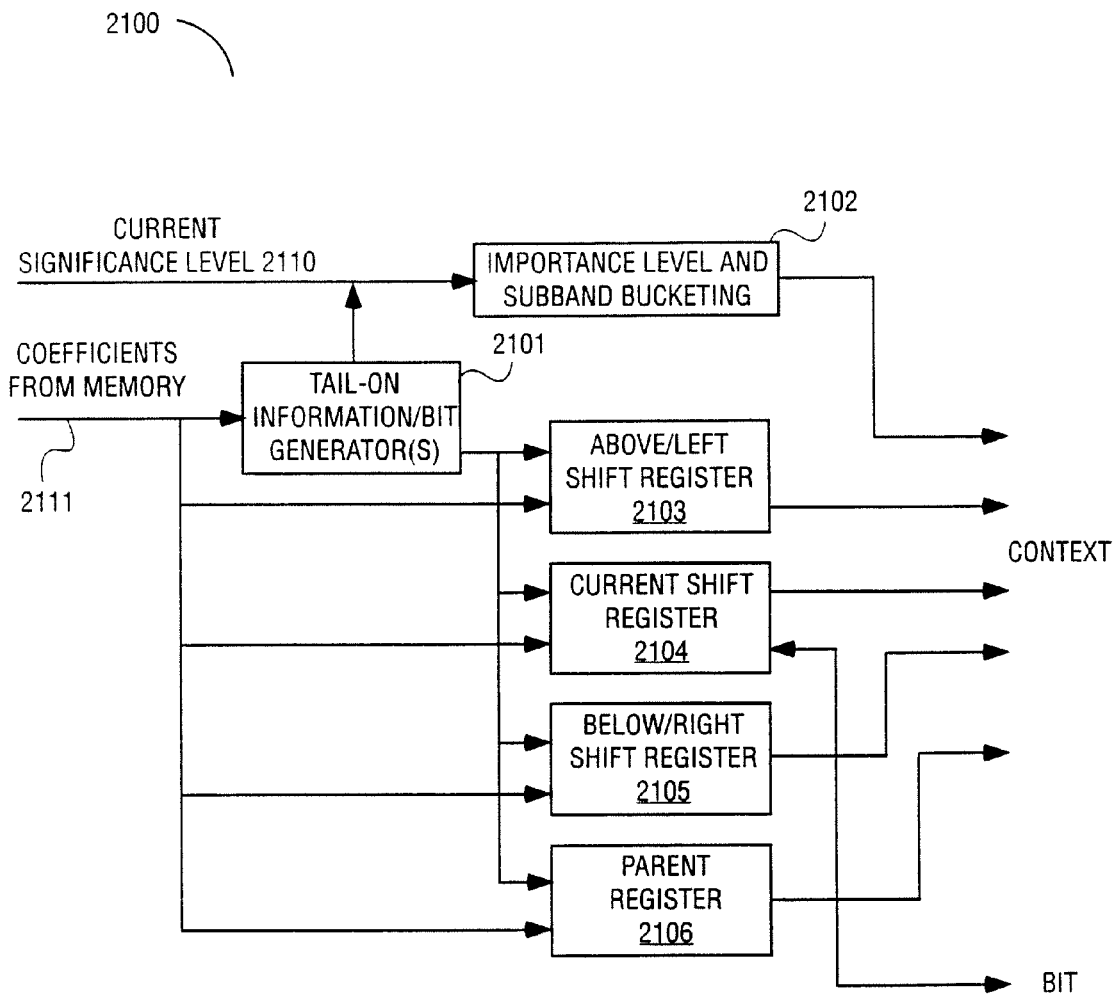
FIG. 21 is a block diagram of one embodiment of the context model which provides the conditioning for head bits.

FIG. 21 is a block diagram of one embodiment of the context model which provides the conditioning for head bits. Referring to FIG. 21, context model 2100 contains shift registers like those found in a bitplane context model. An important difference is that instead of using previous coefficient bits form the current bitplane, conditioning is based on tail-on information which uses all previous bitplanes and previously coded information in the current bitplane. Also, some bits to identify the bitplane coded or the group of bitplanes coded and the subband or group of subbands coded rate generated by the importance level and subband bucketing.

Referring to FIG. 21, the context model comprises two inputs, the current significant level 2110 and the coefficients from memory 2111. The current significance level 2110 is coupled to inputs of the tail-on information/bit generator(s) block 2101 and the importance level and subband bucketing block 2102. The coefficients from memory are also coupled to block 2101 and the registers 2103-2106.

Block 2101 takes the coefficients and determines if there is a one bit or not. In one embodiment, 2101 also determines out where the one bit is. The output of block 2101 is one or two bits based on the tail-on information. In one embodiment, the tail-information relates whether or not the first non-zero magnitude bit has been observed (e.g., whether the first "on-bit" has been observed) and, if so, about how many bit-planes ago. Table 6 describes the tail-information bits.

TABLE 6

Definition of the tail information

| Tail | Definition |
|---|---|
| 0 | no on-bits is observed yet |
| 1 | the first on-bit was on the last bit-plane |
| 2 | the first on-bit was two or three bit-planes ago |
| 3 | the first on-bit was more than three bit-planes ago |

From the 2-bit tail information, a 1-bit "tail-on" value is synthesized to indicate whether the tail information is zero or not. In one embodiment, the tail-information and the tail-on bits are updated immediately after the coefficient has been coded. In another embodiment, updating occurs later to allow parallel context generation.

In addition, the two bits may be used to indicate the importance level being coded. The first two bit planes use value 0, the second two 1, the third two 2, and the remaining bit-planes 3. In addition, there is a run-length encoding of the bits that are all zero head bits.

The 10 bits of context for the head bits includes the 2 bits of information each from the parent and the West coefficients, 1 bit of information from each of the North, East, SouthWest, and South coefficients, and 2 bits of importance level information.

In one embodiment, the tail-information is not used for some or all frequency bands. This allows a frequency band to be decoded without previously decoding its parent.

Figure 38:
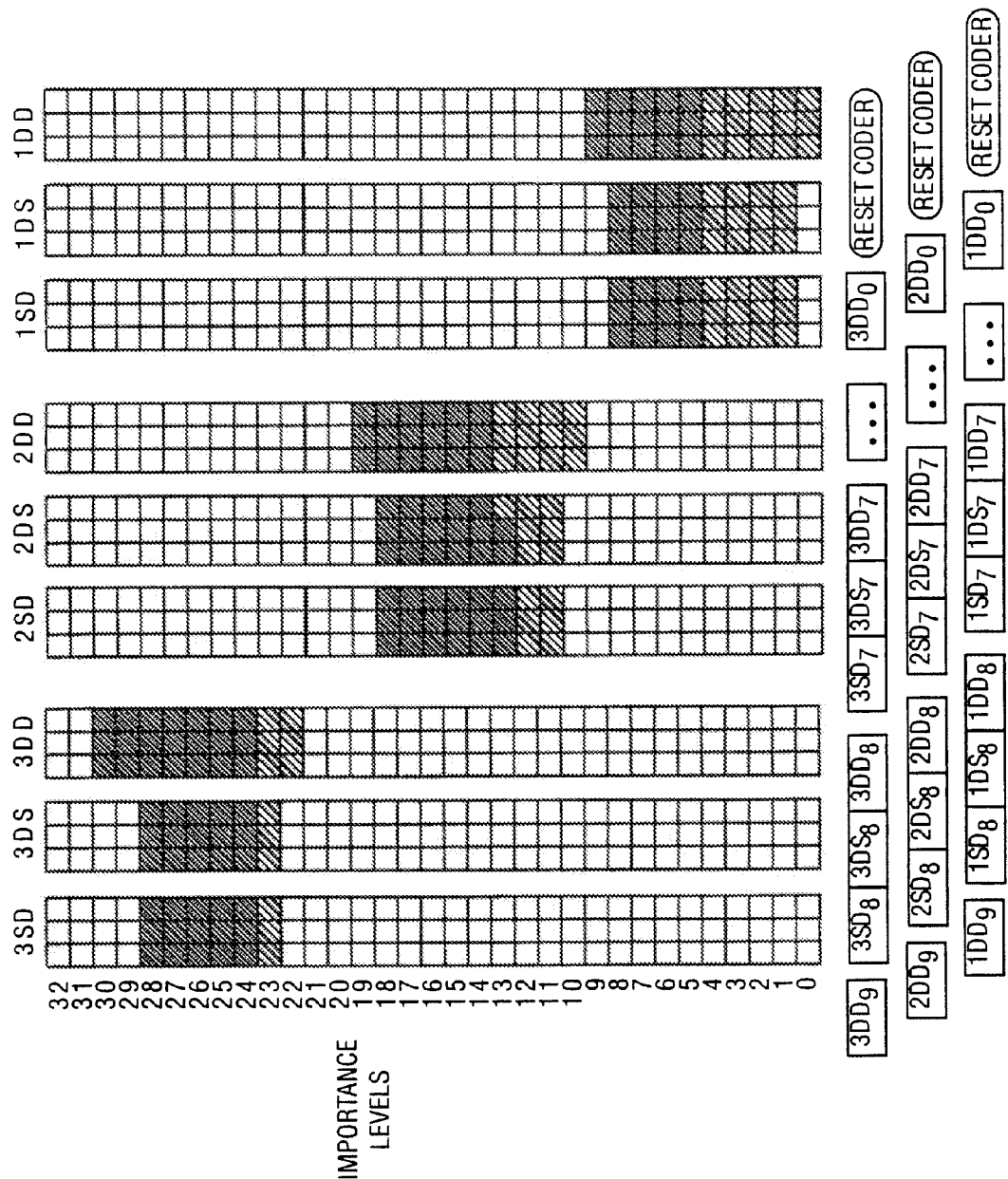
FIG. 38 illustrates pyramidal alignment based on MSE alignment.
Figure 39:
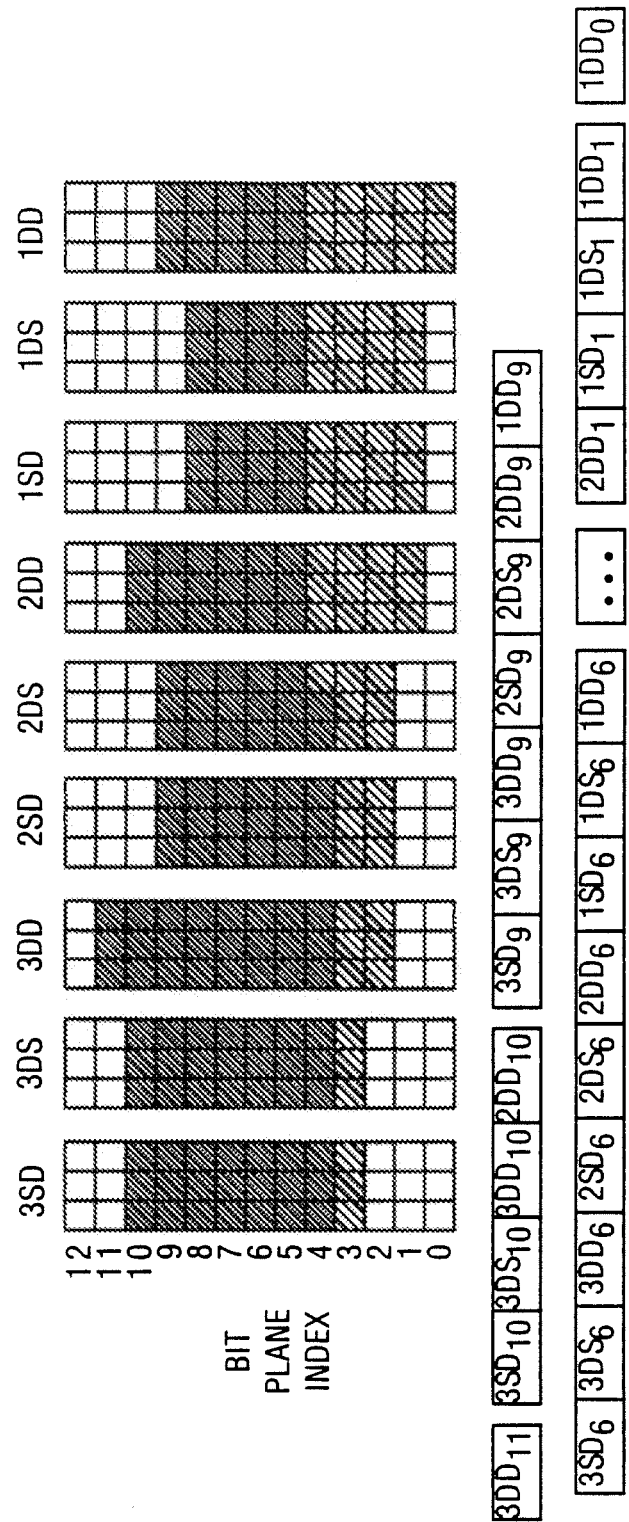
FIG. 39 illustrates MSE alignment of wavelet coefficients.

In another embodiment, the assignment of the bit planes of each frequency band to importance levels uses one alignment. The determination of tail-on information of the parent uses a second alignment, which uses fewer bitplanes of the parent than have actually been coded. This allows some bitplanes of a frequency band to be decoded without decoding the corresponding bitplanes of the parent in the same importance level (see FIG. 38). For example, an image may be encoded with pyramidal alignment, but with parent tail-on information based on MSE alignment (see FIG. 39). This allows the decoder to decode in pyramidal alignment, to simulate MSE alignment, or to simulate any alignment between pyramidal and MSE.

Referring back to FIG. 21, the outputs of block 2101 are coupled to the inputs of registers 2103-2106. Registers 2103-2106 accumulate the neighborhood data. For instance, the above/left shift register maintains bits during the line that is immediately above the current coefficient. The current shift register contains the bits in the current line of coefficients, while the below/right shift register 2105 contains the lines from the line immediate below the shift register. Lastly, parent register 2106 maintains the parent data. The outputs of the shift registers form the context.

The output of importance level and bucketing block 2102 may also be used for a context. Such would be part of the context when the subbands and different levels are to be coded to the same context. If that is the case, the output of block 2102 is combined with the outputs of the registers 2103-2106 to form the context. If not, the context only comprises the outputs of registers 2103-2106.

Also output from the context model 2100 is a bit.

Coding can be done by alternating between DD, SD and DS coefficients to allow for the bit to context delay for use of data from the current bitplane (alternating between sub-trees).

Figure 22:
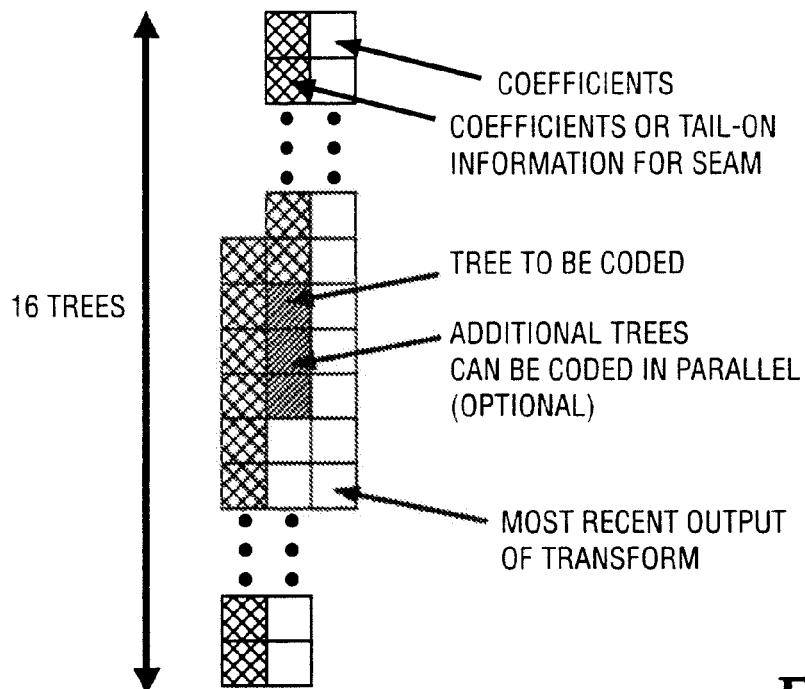
FIG. 22 illustrates the memory usage for one embodiment of the context model with conditioning on all neighbors and parents.

Note that memory is needed to store coefficients needed for conditioning (see FIG. 17). The memory usage for one embodiment of the context model with conditioning on all neighbors and parents is shown in FIG. 22. A short seam transform order is assumed. (External memory could be used to support a long seam transform order. This would require both additional memory storage and bandwidth).

Conditioning on high level parents is especially costly. The level 4 DD coefficient for a given tree is not computed until 16 trees later than most of the level 1 DD coefficients for that tree. Also, storing entire coefficients to be coded later (unshaded in FIG. 22) is much more costly that only storing tail-on information for later use in conditioning (cross hatched in FIG. 22). Conditioning only on "west" information that is in the same tree and on parents that are generated without data from "west" trees would greatly reduce the amount of memory required. When parent or west information was not available, copying the information from the north or east is useful.

Context Model for Sign Bits

The context model that provides conditioning for sign bits is simple. If the sign of the above pixel is known, it is used for conditioning. If the sign bit for the above pixel is unknown, then the bit is uncoded (R2(0) is used. Alternatively, no coding (R2(0)) can be used for all sign bits.)

Figure 23:
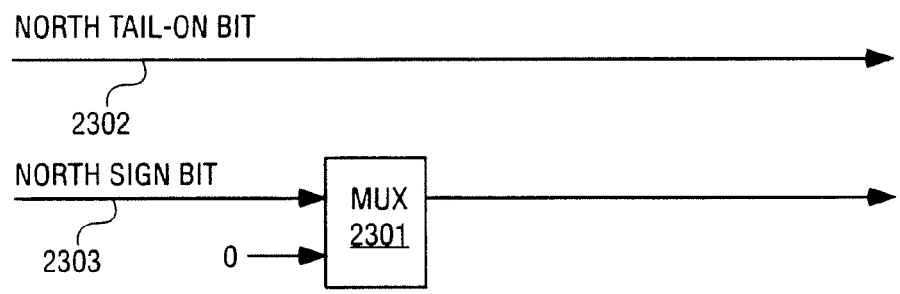
FIG. 23 is a block diagram of one embodiment of the context model for sign bits.

FIG. 23 is a block diagram of one embodiment of the context model for sign bits. Referring to FIG. 23, a mux 2301 receives a north sign bit 2303 and a 0 bit 2304 (hardwired) and is controlled by a north tail-on bit 2302 to output the north sign bit 2303 if the north tail-on bit 2302 is a 1; otherwise, mux 2301 outputs a 0. Thus, the north pixel supplies the north tail-on bit 2302 and north sign bit 2303 to provide a context for the pixel south of the north pixel.

Context Model for Tail Bits

No conditioning is used for tail bits. In one embodiment, a fixed probability state is used, and no probability update is used. Table 7 shows three options for codes to use for tail bits. The second option which uses R2(1) and R2(0) is a good choice.

TABLE 7

Probability states (codes) used for tail bits

| bit of tail | 1 | 2, 3 | 4, ... |
|---|---|---|---|
| Option 1 | R2(1) | golden ratio code | R2(0) |
| Option 2 | R2(1) | R2(0) | R2(0) |
| Option 3 | R2(0) | R2(0) | R2(0) |

In one embodiment, the golden ratio code, which is good for probabilities of $M \cong 60\%$, $L \cong 40\%$ is:

| input | codeword |
|---|---|
| MMM | 00 |
| MML | 110 |
| ML | 01 |
| LM | 10 |
| SS | 111 |

Context Bin Summary

The minimum number of context bins that could be used in the system is as follows. SS, first bitplane for each tree, sign and tail bits all are not coded (the code is used R2(0)). Although no PEM state or most probable symbol (MPS) bit needs to be stored, there must be logic to select the R2(0) code. Therefore, depending on how this is counted, the hardware cost is zero or one context bin. Adaptive coding should be used for head bits. For less important data, since one bitplane at a time is coded, conditioning on the bitplane is not important. For most important data, the first bitplane for each wavelet tree may reduce the number bitplanes sufficiently that conditioning on the bitplane is not important. It is less clear what the usefulness of conditioning on the subband is, but this will also be ignored in this minimum context example. The tail-on bits of three neighbors and one parent could be used for a total of four bits (16 context bins). One additional context bin can be used for look-ahead. (It may be more convenient to map two head context bins together to make room for the look-ahead so the memory size is still a power of 2).

With four cores (requiring replicating contexts four times) and two context memory banks per core, the minimum number of context bins to use would be between 128 and 144 depending on how "not coded" contexts are counted and whether two head context bins were mapped together.

A system with a generous amount of conditioning is as follows:

For SS (9-bit) and first bitplane (4 bit), use 4 context bins per bit, for a total of 52 context bins. (These could be divided into banks, they do not have to be duplicated).

Tail bits are not coded, but both R2(0) and R2(1) are used. Depending on how this is counted, this costs 0, 1, or 2 context bins.

Two adaptive contexts and one "no code" context is used for the sign bits.

The head bits could use 8 bits from neighbors/parent and 2 bits for subband/bitplane information (1024 context bins).

One context is used for look-ahead.

An alternative embodiment of a context model, including an embodiment of a sign/magnitude unit that converts input coefficients into a sign/magnitude format, is described in U.S. patent application Ser. No. 08/498,695, filed Jun. 30, 1995 and entitled "Method and Apparatus For Compression Using Reversible Wavelet Transforms and an Embedded Codestream" and U.S. patent application Ser. No. 08/498,036, filed Jun. 30, 1995 and entitled "Reversible Wavelet Transform and Embedded Codestream Manipulation" and also U.S. patent application Ser. No. 08/642,518, filed May 3, 1996 and entitled "Compression and Decompression with Wavelet Style and Binary Style Including Quantization by Device-Dependent Parser" and U.S. patent application Ser. No. 08/643,268, filed May 3, 1996 and entitled "Compression/Decompression Using Reversible Embedded Wavelets".

The context model provides contexts for entropy coding of the data. In one embodiment, all the entropy coding performed by the present invention is performed by binary entropy coders. A single coder may be used to produce a single output code stream. Alternately, multiple (physical or virtual) coders may be employed to produce multiple (physical or virtual) data streams.

M-ary Coding for LIC

Figure 24:
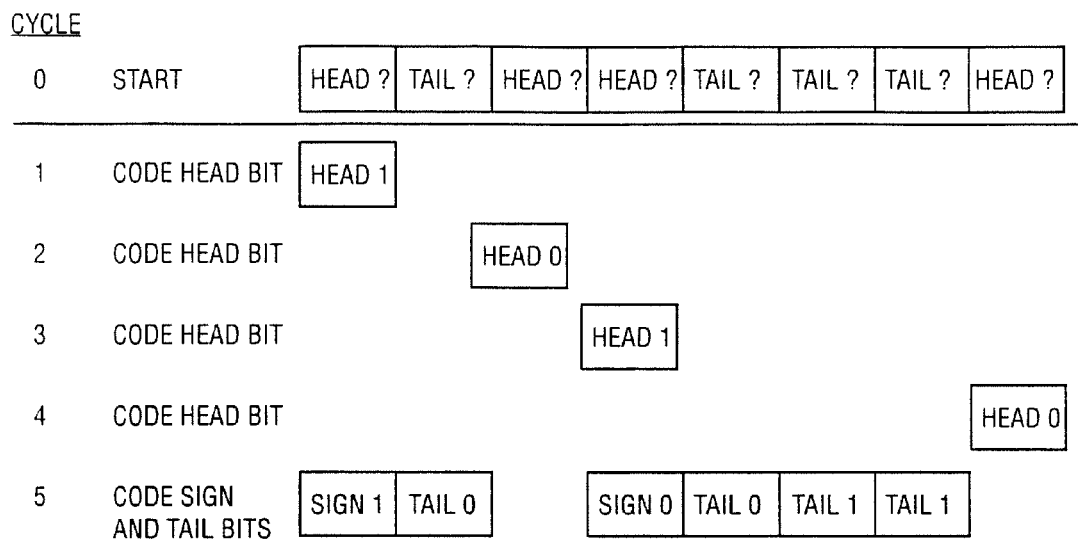
FIG. 24 illustrates one embodiment of parallel coding for the LIC.

FIG. 24 illustrates the use of M-ary coding for the LIC. The use of M-ary for a reduced coding operates as a lookahead (as shown). At first, the state of the next eight coefficients is examined. If there is anything in the head, entropy coding is performed on the head bits, such that all head bits on an entropy coded, one per cycle, until all head bits in the 8 are coded. Referring to FIG. 24, head bits which are 1 are coded in the first and third cycles, while head bits that are 0 are coded in the second and fourth cycles. Once all of the head bits are entropy coded, the sign and tail bits are coded in the same cycle. For example, in FIG. 24, all the sign and tail bits that followed a head bit that is 1 are coded in the fifth cycle. In this manner, the overall number of cycles is reduced.

A Printing System Application of the Present Invention

Figure 25:
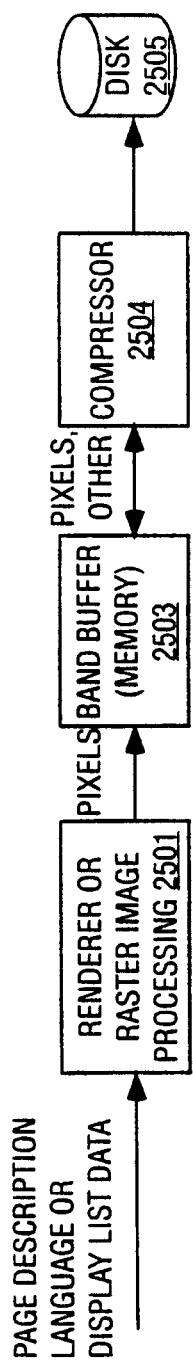
FIG. 25 is a block diagram of one embodiment of the front end of a printer.

FIG. 25 is a block diagram of one embodiment of the front end of a printer. Referring to FIG. 25, a renderer 2501 receives data in the form of a page description language or display list. Renderer 2501 may comprise raster image processing. For each location (e.g., spot), renderer 2501 determines its color (e.g., black/white, 8-bit-RBG values, 8 bit CMYK values depending on the application). The output of renderer 2501 is a set of pixels formatted into bands and stored in band buffer (memory) 2503.

In an alternative embodiment, data from a Page Description Language (PDL) such as Adobe Postscript™ or Microsoft Windows™ GDI is rendered into a display list. The display list is used to generate bands of pixels. In this embodiment, it is assumed that the pixels represent continuous-tone values, and any halftoning or dithering required by the print engine will be performed after decompression.

In the present invention, the memory used for the band buffer 2503 is also used for workspace for compression (without increasing the memory required). This dual use is described in more detail below.

Compressor 2504 compresses each band of pixels is compressed. If the input to compressor 2504 are halftoned or dithered pixels, compressor 2504 would still work but the compression achieved would likely be poor with wavelet processes. A binary context model can be used on halftoned or dithered pixels. Compressor 2504 writes the compressed data to disk 2505. Disk 2505 may be a hard disk. In an alternative embodiment, disk 2505 may be random access memory (RAM), Flash memory, optical disk, tape, any type of storage means, any type of communication channel.

Figure 26:
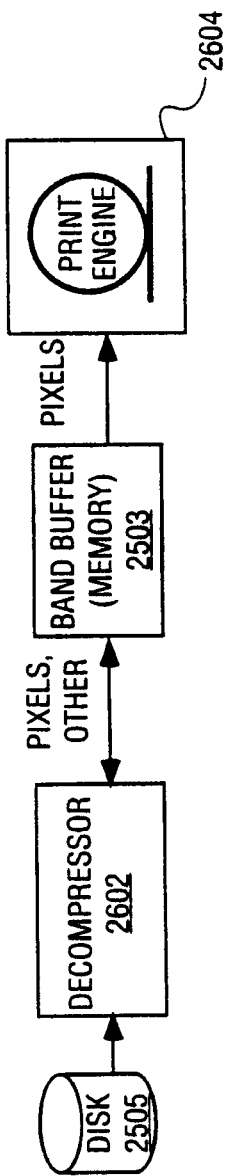
FIG. 26 is a block diagram of one embodiment of the back end of the printer.

FIG. 26 is a block diagram of one embodiment of the back end of the printer. Referring to FIG. 26, the back end of printer 2500 comprises a decompressor 2602 coupled to disk 2505, a band buffer (memory) 2603 and a print engine 2604. The decompressor 2602 reads compressed data from the hard disk 2505 and decompressed. The decompressed data is stored in band buffer (memory) 2603 in the form of pixels. Band buffer 2603 may be same memory as band buffer 2503 to operate as workspace for compressor 2504. Decompressor 2602 keeps band buffer 2603 sufficiently full so that pixels can be sent to print engine 2604 in real-time.

Figure 27:
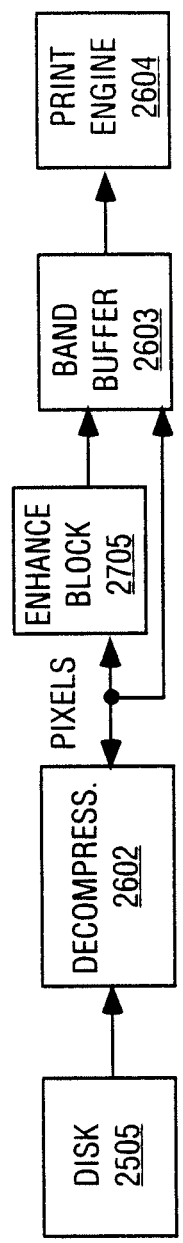
FIG. 27 is a block diagram of an alternate embodiment of the backend of the printer.

FIG. 27 is an alternative embodiment that includes an optional enhancement. Referring to FIG. 27, pixels from decompressor 2602 go to band buffer 2603 via enhancement block 2705, while other information, which is the information that is not yet pixels (partial coefficients), is sent directly to band buffer 2603. Enhancement block 2705 may perform such functions as interpolation, smoothing, error diffusion, halftoning and/or dithering.

The bandwidth needed between decompressor 2602 and band buffer 2603 allows decompressor 2602 to first write transform coefficients to band buffer 2603, access band buffer 2603 to obtain certain coefficients and perform the inverse transform on such coefficients and then write them back to band buffer 2603. Note that band buffer 2603, as a work space memory, may be small. For instance, if a full page image is 64 megabytes and band buffer 2603 is 16 megabytes, it would still be considered a small work space memory.

In one embodiment, A4 images at 400 dpi with 32 bits/pixel (four 8-bit components, CMYK) about 8 pages/minute require a data rate of approximately 8 Mbytes/s from band buffer 2603 to print engine 2604. The transfer rate of an exemplary hard disk is around 2 Mbytes per second (e.g., 1.7-3.5 Mbytes/s). Therefore, a typical compression ratio of about 4:1 is required to match the bandwidth of disk 2601 to the bandwidth of the printer. In one embodiment, compressor 2504 in FIG. 25 and decompressor 2602 in FIG. 26 or 27 are contained a single integrated circuit chip.

Figure 28:
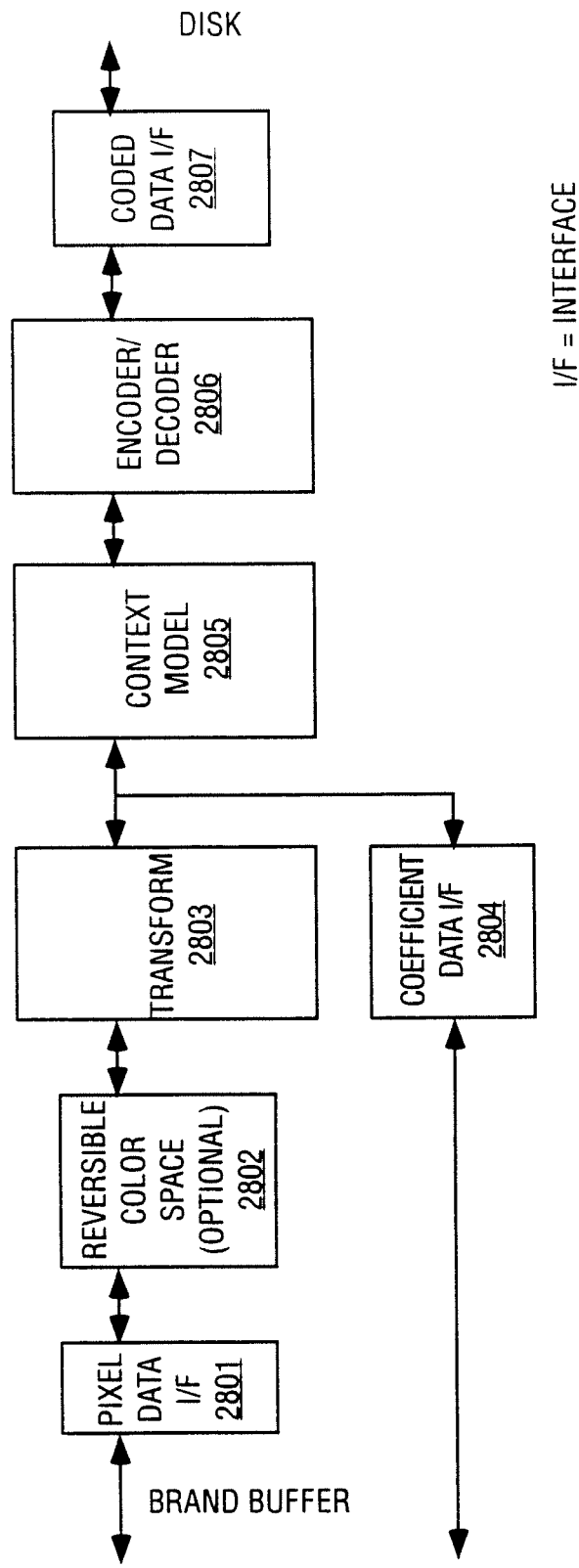
FIG. 28 is a block diagram of one embodiment of an integrated circuit (IC) chip containing the printer compression/decompression.

FIG. 28 is a block diagram of one embodiment of an integrated circuit (IC) chip containing the printer compression/decompression. Referring to FIG. 28, pixel data interface 2801 is coupled to the band buffer (not shown). Pixel data interface 2801 generates addresses for reading and writing pixels from and to the band buffer, respectively. An optional reversible color space 2802 may be included to perform a reversible color space conversion. Coefficient data interface 2804 generates addresses for reading and writing coefficients and properly assembles two byte coefficients. Coefficient data interface 2804, along with pixel data interface 2801, handle any line buffering or coefficient buffering that is required to be in external memory. Coefficient data interface 2804 and the use of a reversible color space is discussed in greater detail below.

It should be noted that the double arrows imply that data may flow in either direction. For instance, in compressing the data, data moves from left to right through different components of the IC chip. On the other hand, when decompressing data, the data moves from right to left generally.

When coding data, pixel data from pixel data interface 2801, or reversible color space 2802 (if included), are received by wavelet transform block 2803 which performs the wavelet transform on the pixel data. In one embodiment, the transform performed by wavelet transform block 2803 is an overlapped wavelet transform. It provides energy compaction for both lossless and lossy image compression. For lossy compression, the block boundary artifacts that plague JPEG are avoided. The filter coefficients, when properly aligned, are normalized so that scalar quantization provides good lossy compression results. In one embodiment, the wavelet transform block 2803 performs a 2,6 transform. In another embodiment, wavelet transform block 2803 performs a 2,10 transform. Wavelet transform block 2803 may perform other well-known transforms. Various implementations of wavelet transform block 2803 are discussed in greater detail below.

The coefficients output from wavelet transform block 2803 may be written back to the memory (e.g., the band buffer) via coefficient data interface 2804 for coding later. In one embodiment, the data that is written back to memory is less important data and will be described in detail below. Such data is later read back into the IC chip and coded.

The coefficients output from wavelet transform block 2803 or received via coefficient data interface 2804 are provided to context model 2805. Context model 2805 provides the context for encoding (and decoding) data using encoder/decoder 2806. In one embodiment, context model 2805 supports sending data directly to coding. In this way, context model 2805 operates as the most important context model. An architecture for implementing various context models has been described above.

In one embodiment, encoder/decoder 2806 comprises a high speed parallel coder. The high-speed parallel coder handles several bits in parallel. In one embodiment, the high speed parallel coder is implemented in VLSI hardware or multi-processor computers without sacrificing compression performance. One embodiment of a high speed parallel coder that may be used in the present invention is described in U.S. Pat. No. 5,381,145, entitled "Method and Apparatus for Parallel Decoding and Encoding of Data", issued Jan. 10, 1995.

In alternative embodiments, the binary entropy coder comprises either a Q-coder, a QM-coder, a finite state machine coder, etc. The Q and QM-coders are well-known and efficient binary entropy coders. The finite state machine (FSM) coder provides the simple conversion from a probability and an outcome to a compressed bit stream. In one embodiment, a finite state machine coder is implemented using table look-ups for both decoder and encoder. A variety of probability estimation methods may be used with such a finite state machine coder. In one embodiment, the finite state machine coder of the present invention comprises a B-coder defined in U.S. Pat. No. 5,272,478, entitled "Method and Apparatus for Entropy Coding", issued Dec. 21, 1993.

The output of encoder/decoder 2806 is coupled to coded data interface 2807 which provides an interface to the disk or other storage medium, or even another channel.

Coded data interface 2807 sends and receives coded data from disk. In one embodiment, if the SCSI controller is included in the chip, it may be implemented at this point. In another embodiment, coded data interface 2807 communicates with an external SCSI controller. Non-SCSI storage or communication may be used.

During decompression, coded data is received by encoder/decoder 2806 from the disk (or other memory storage or channel), via coded data interface 2807, and is decompressed therein using contexts from context model 2805. The coefficients that result from decompression are inverse transformed by wavelet transform block 2803. (Note that although wavelet transform block 2803 performs both forward and inverse transforms in one embodiment, in other embodiments, the two transforms may be performed by separate blocks.) The output of transform block 2803 comprises pixels that undergo any optional color space conversion and are output to the band buffer via pixel data interface 2801.

Figure 29:
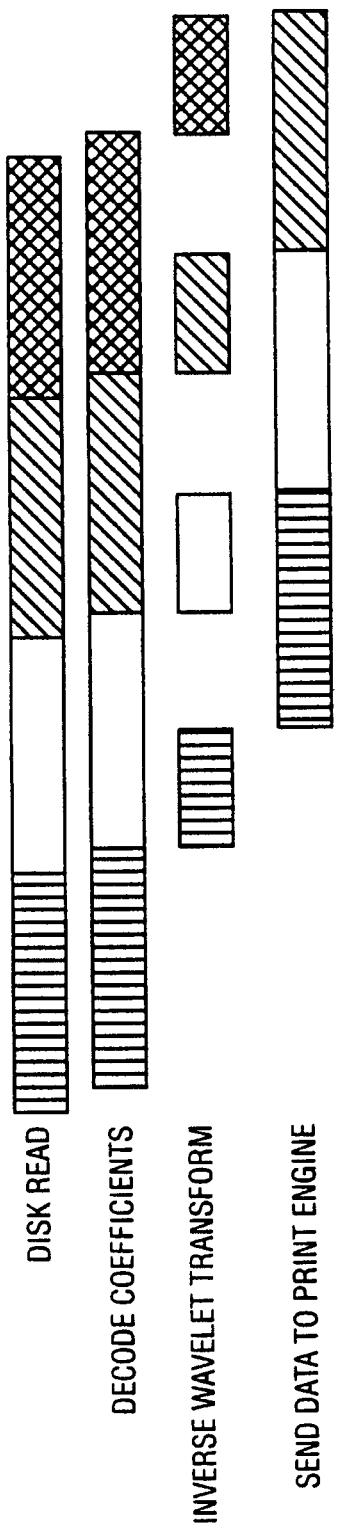
FIG. 29 illustrates the basic timing of the system during printing.

The basic timing of the system during printing is shown in FIG. 29. Referring to FIG. 29, the coded data for each coding unit is read from disk. As much data as possible is read, and after a short delay coefficients are decoded. After decoding is complete, the inverse wavelet transform is computed. After the transform is complete, pixels can be sent to the print engine. Note that the cross-hatching in FIG. 29 indicates when different actions occur for a specific coding unit.

Embedding Coefficients for Storage to Disk

FIG. 10 shows the organization of the coded data in the present invention. Referring to FIG. 10, the most important data 1003 is coded in coefficient order (not embedded) immediately after being transformed. Therefore, this data does not have to be buffered. In one embodiment, the amount of most important data 1003 is limited so that it can always be read from disk.

Some amount of less important data 1004 is buffered, embedded and written to disk in order of importance. The amount of data that may be buffered, embedded and written is determined on the transfer time. That is, the system reads the data until the transfer time from the disk has expired. The transfer rate of the disk determines how much of data is kept. These rates are known and are dependent on physical characteristics of a particular transfer.

For hard to compress images, some data may be discarded during encode time. The data is shown as least important data 1005. In the case that there is no possibility that the least important data can be read given the best case disk transfer rate, there is no reason to store that data on disk. For many and perhaps most images, no data would be discarded.

The ordering of coded data and how it is accomplished is described in greater detail above.

In the following, band buffer management during the compression and decompression is discussed, followed by a description of an embedding scheme for the coded data. Hardware implementations of the transform, the context model, and parallelism with the encoder/decoder are also described.

Pixel and Coefficient Interfaces

Figure 30:
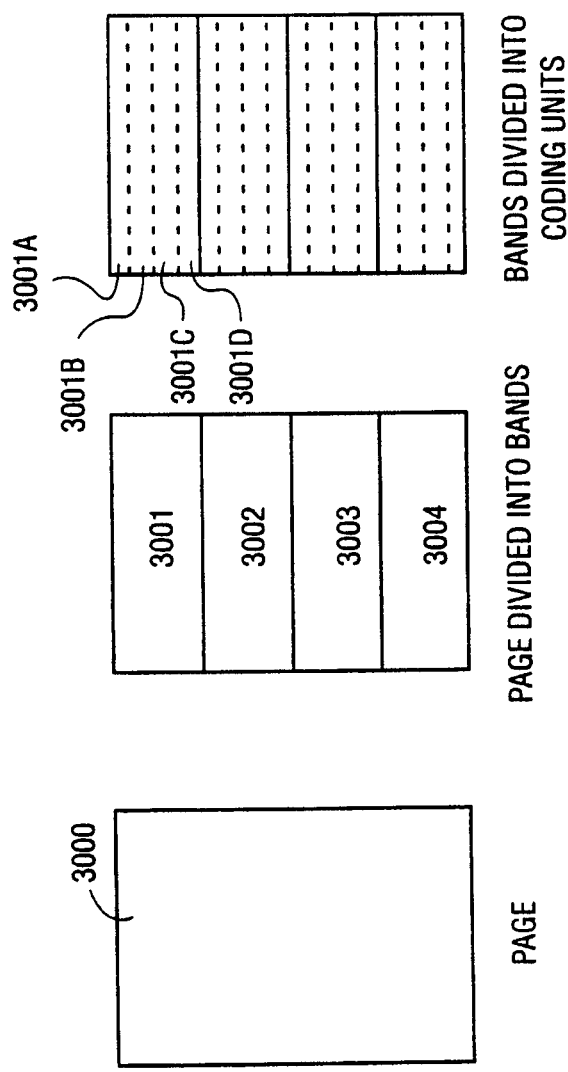
FIG. 30 illustrates one possible embodiment of how pixel data is organized.

FIG. 30 illustrates one possible embodiment of how pixel data is organized. Referring to FIG. 30, a page (image) 3000 is divided into bands 3001-3004. In one embodiment, page 3000 may comprise a page description language or display list description of a page that is used to generate pixels for the individual bands. In one embodiment, each of bands 3001-3004 is individually rasterized using display list technology. Each of bands 3001-3004 is further divided into coding units (e.g., 3001A-D).

An advantage of using multiple coding units per band is that portions of the band buffer can be used in rotation as workspace during decompression (similar to ping-pong buffering). In other words, one portion of the pixels can be decompressed, stored in the band buffer and sent to the printer, while a second portion of the band buffer can be used as workspace to store coefficients while decoding, with a third portion of the buffer being used to store the pixels that correspond to the coefficients.

Figure 31:
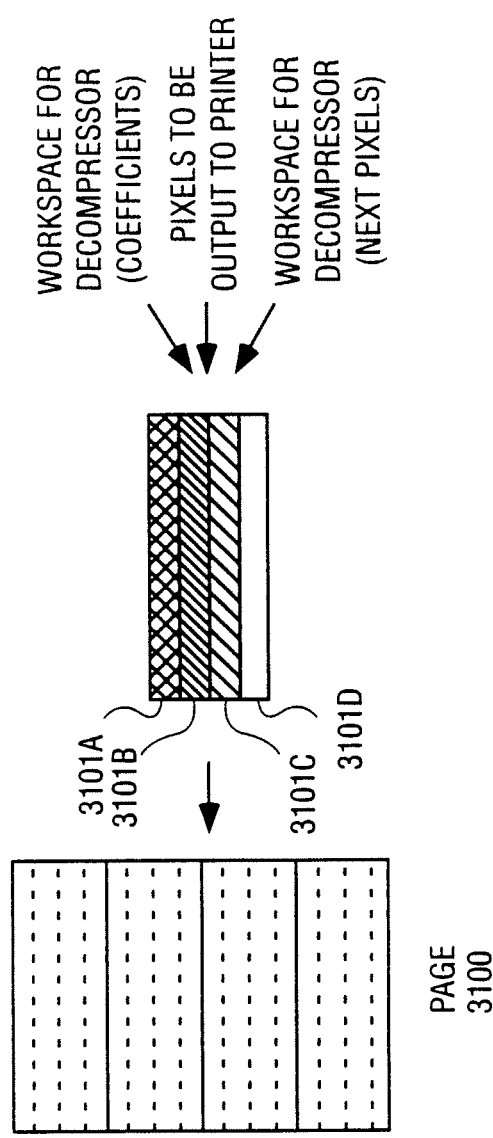
FIG. 31 illustrates a band buffer of a page.

FIG. 31 illustrates a band buffer 3101 of page 3100. Band buffer 3101 comprises coding units 3101A-D. Coding units 3101A and 3101B act as a workspace for the decompressor by storing coefficients. Coding unit 3101C stores pixels to be output to the printer (or channel), while coding unit 3101D acts as workspace for the decompressor by storing the next pixels.

The portions of band buffer 3101 can be used in rotation as the entire page 3100 is printed. For instance, for the next coding unit, the pixels in coding unit 3101D are the pixels to be output to the printer. When that occurs, coding units 3101B and 3101C will be used as workspace for the decompressor to store coefficients. Also at that time, coding unit 3101A will be used as the workspace for the decompressor to store the next pixels to be output to the printer.

In the present invention, the coefficients are bigger than pixels. Therefore, twice as much memory is allocated to the workspace memory. In an alternate embodiment, the bands may be divided into more or less coding units. For instance, in one embodiment, the bands may be divided into eight coding units each.

Memory Bandwidth

Together, the pixel data interface and the coefficient data interface manage the band buffer memory efficiently. If fast page mode DRAM, Extended Data Out (EDO) DRAM, or other memories which favor consecutive accesses is used, then these interfaces transfer data from consecutive addresses in long enough bursts to make efficient use of the potential bandwidth of the memory. Some small buffers may be needed to support burst accesses to consecutive addresses.

Figure 32:
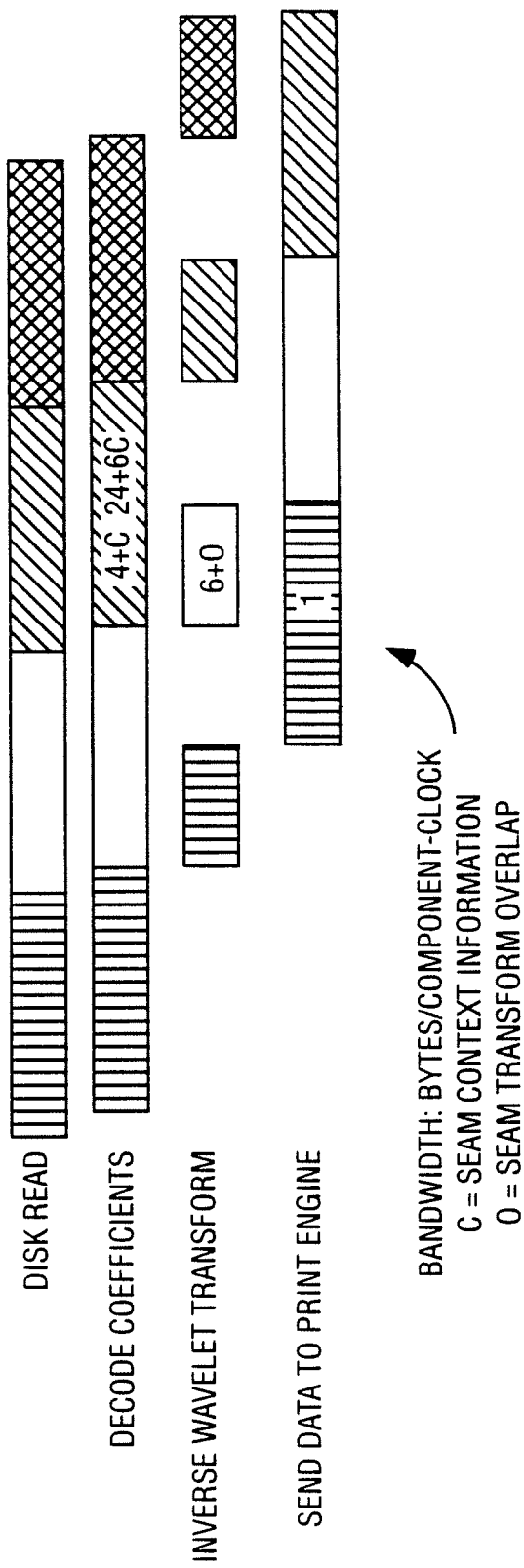
FIG. 32 illustrates a timing diagram of decoding that illustrates concurrent memory access requirements.

FIG. 32 illustrates a timing diagram of decoding that illustrates concurrent memory access requirements. Referring to FIG. 32, the bandwidth required for decoding is as follows. Recall that in one embodiment, a 2 MHz pixel-clock, a 8 MHz component-clock and a 32 MHz decoder clock are used, and that the print engine requires 1 byte/component-clock, the transform reads 2 bytes per coefficient and writes 1 byte per component. If the transform is performed in half the coding unit time, it would require 6 bytes/component-clock. The speed of the transform is limited by memory bandwidth, not computation time. If a bandwidth of 24 bytes/component-clock is available, the transform could be computed in one-eighth of the coding unit time. The transform may require additional bandwidth if external memory is used for seams. In one embodiment, the decoding of coefficients requires writing two bytes per component-clock for the most important part of coded data. Decoding requires a read and a write of one byte per component-clock for each bitplane of the less important part of the coded data. Note this may be less in some embodiments. Bandwidths of 4 bytes per component-clock and 24 bytes per component-clock respectively would be required if both operations took half the coding unit time. Additional bandwidth might required if external memory was used for context seam information.

In one embodiment, the maximum burst mode transfer rate is 4 memory accesses per component-clock (one access per coder-clock). Therefore, with a 32-bit data bus, the maximum transfer rate is somewhat less than 16 bytes/component-clock. With a 64-bit data bus, the maximum transfer rate is somewhat less than 32 bytes/component-clock.

Reduction of LIC Memory Bandwidth Requirements

Each bit of each coefficient in the LIC requires a read and a write of external memory during decoding. (Encoding only requires a read). These memory accesses account for the majority of the memory bandwidth required. In one embodiment, instead of storing each LIC coefficient in 8 bits, the present invention stores the coefficients using less than 8 bits when possible to reduce the bandwidth requirements.

Table 8 shows how much memory is required to store LIC coefficients for the decoding of each bitplane. Referring to Table 8, when doing the MIC, one bit per coefficient is written, which is the tail-on bit. What is written for bit plane 5 is read back for bit plane 4: 2-3 bits that include, the tail-on bit, what bit 5 was and if bit 5 was a 1, then a sign bit. The percentage indicates for each bit planes which percentage of coefficients are participating. This may be made clearer by looking at FIG. 13B. Referring to FIG. 13B, bitplane 5 has coefficients from all subbands participating because all coefficients from the DD1 to the DS4 and SD4 subbands have data in bitplane 5 (as indicated by shading). Bitplane 0 has coefficients only from the DD1 subband. As shown in Table 8, both bitplanes 4 and 5 have coefficients from all subbands, so the percentage is 100%, while bitplane 0 has only 25% of the coefficients (in the DD1 subband). As more decoding occurs, some bitplanes are completed before bitplane 0 is reached.

TABLE 8

Bits Required to Store LIC Coefficients While Decoding

| bitplane write | bits/ read | coefficient | contents | percent of coefficients in MSE alignment (write/read) |
|---|---|---|---|---|
| —* | 5 | 1 | tail-on | —/100% |
| 5 | 4 | 2-3 | tail-on, bit 5, sign? | 100%/100% |
| 4 | 3 | 3-4 | tail-on, bits 4 . . . 5, sign? | 100%/99% |
| 3 | 2 | 4-5 | tail-on, bits 3 . . . 5, sign? | 99%/96% |
| 2 | 1 | 5-6 | tail-on, bits 2 . . . 5, sign? | 96%/82% |
| 1 | 0 | 6-7 | tail-on, bits 1 . . . 5, sign? | 82%/25% |
| 0 | —† | 7-8 | tail-on, bits 0 . . . 5, sign? | 25%/— |

*Written during processing most important chunk (MIC).
†Read during inverse transform.

In Table 8, at the start of decoding, no decoding of bitplanes has occurred; therefore, only one bit (bit/coefficient) of every coefficient is read to determine if its a head or tail. As decoding continues, the number of bits per coefficient increases.

Figure 33:
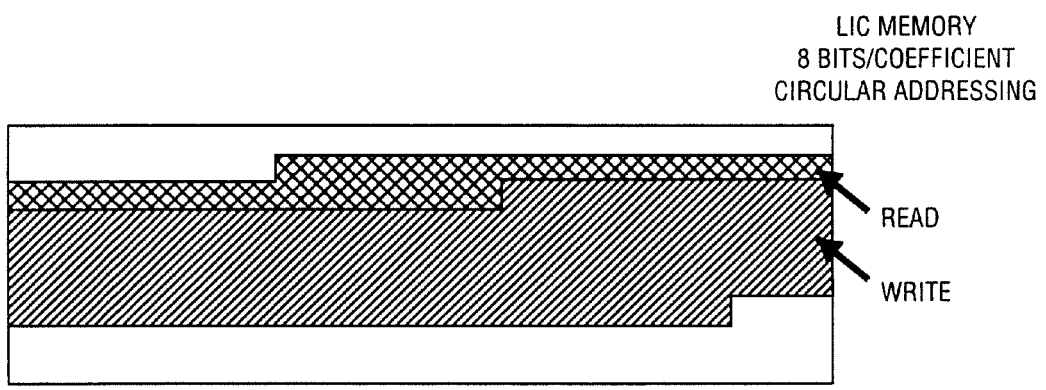
FIG. 33 shows how circular addressing can be used to handle writing data that is larger than the data read.

FIG. 33 shows how circular addressing can be used to handle writing data that is larger than the data read. This occurs because the results of the processing produces more bits to write than were originally read. Referring to FIG. 33, the process begins by writing 1 bit per coefficient which is ⅛ of the memory space. Subsequently, 1 bit per coefficient is read, while 2-3 bits per coefficient are written. Then, the 2-3 bits per coefficient are read, while 3-4 bits per coefficient are written. This continues until all the data is done.

There are some options to simplify the hardware implementation. Instead of always using the minimum number of bits, perhaps only 1, 2, 4, 6 or 8 bits would be used which would cause one bit to be wasted for some sizes. Space for the sign bit could always be used, even if the sign bit was not coded in the LIC or not known yet.

An option that would further reduce memory bandwidth would be to not store the tail-on bit when it was not necessary. For example, when writing bitplane 0, there are 6 bits which are either head or tail bits. If any of these bits are non-zero, the tail-on must be true, and there is no need to store the tail-on value, and the sign bit can be stored as the seventh bit.

Memory bandwidth for the most important chunk (MIC) may also be reduced by variable length storage methods. Just using the minimum number of bits instead of always using 8 bits per coefficient would result in a savings. Storing the 6-bit look ahead values (as in FIG. 15) instead of zero coefficient bits would result in an even more efficient use of memory.

Reversible Color Space

The present invention provides for optionally performing reversible color space conversion that allows converting between two color spaces so as to be completely reversible and implementable in integer arithmetic. That is, the color space data that is converted may be reversed to obtain all of the existing data regardless of any rounding or truncation that occurred during the forward conversion process. Reversible color spaces are described in U.S. patent application Ser. No. 08/436,662, entitled "Method and Apparatus for Reversible Color Conversion" filed May 8, 1995, and assigned to the corporate assignee of the present invention.

Color space conversions allow the advantages of an opponent color space without sacrificing the ability to provide lossless results. For the lossless case, an opponent color space provides decorrelation that improves compression. For the lossy code, an opponent color space allows luminance information to be quantized less than chrominance information, providing for higher visual quality. When a reversible color space is used with the transform of the present invention, properly embedding the luminance and chrominance coefficients is superior to subsampling for lossy compression, while still permitting lossless compression.

If a reversible color space is used, it is desirable to align the coefficients such that the most significant bit of the 8-bit luminance components and the 9-bit chrominance components have the same alignment. For lossy compression, this alignment causes chrominance data to be quantized twice as much as luminance data, and also allows for the possibility of lossless compression for luminance and lossy (but very high quality) compression for chrominance. Both of these results take advantage of characteristics of the Human Visual System.

Other Pixel Operations

Often a printer will have documents that are mostly or entirely non-continuous. For example, text images with black and white only (0 and 255 values only) may be common.

In one embodiment, the histogram of bands is completed. For example, 0, 255 black/white only images (the K component) can be remapped to 0, 1 images. Similar compactions can be made for spot color images. Note if compaction is used, compression must be lossless. However, the lossless compression achieved is improved substantially when the compaction is performed.

Alternatively, instead of using the overlapped wavelet transforms described herein, binary and spot color images could be handled by a lossless, bitplane based, JBIG-like context model.

Figure 35:
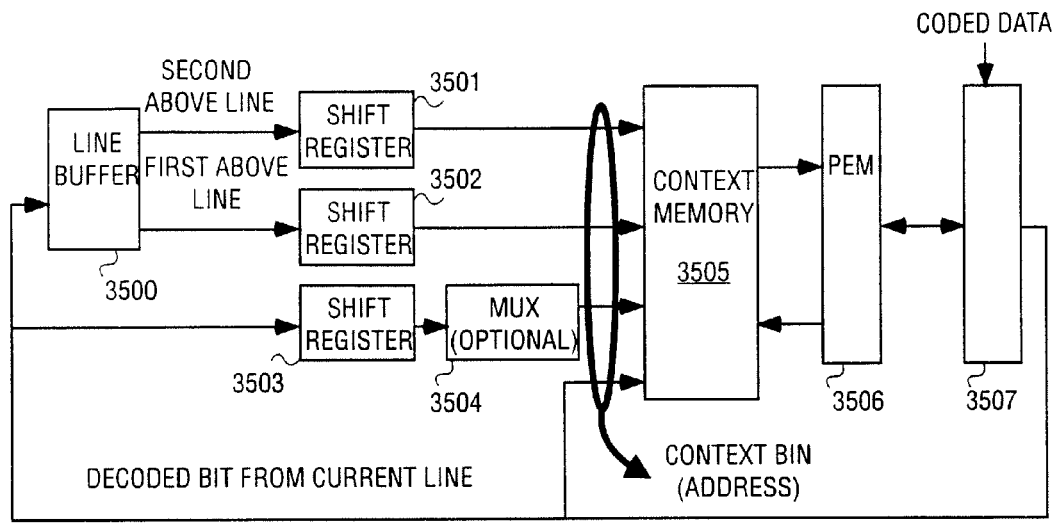
FIG. 35 shows illustrates one embodiment of a binary context model.

In another alternate embodiment, the system may be designed to include a binary mode. FIG. 35 illustrate one embodiment of a binary context model that is similar to JBIG style context model template. Referring to FIG. 35, shift registers 3501-3503 provide multiple bits per the JBIG standard. Shift registers 3501 and 3502 receive second and first above lines from line buffer 3500. The "above" lines provide the bits corresponding to pixels in the northwest (NW), north (N), and northeast (NE) positions of the template, such as shown in FIG. 37. The outputs of shift registers 3501 and 3502 are provided directly to context model 3505. The output of shift register 3503 is provided to an optional mux 3504 which can implement the adaptive template of the JBIG Standard. Context model 3505 is coupled to probability estimation machine 3506, which is in turn coupled to bit generator 3507. Context model 3505, probability estimation machine 3506, and bit generator 3507 operate in a manner well known in the art with respect to each other.

The output of mux 3504 in conjunction with the outputs of shift register 3501 and 3502 and a feedback from the bit generator form the context bin address used to address the context memory. In one embodiment, context memory 3505 includes 1,024 contexts with six bits to describe each probability state. This requires a context memory of 1,024 times six bits.

Because the bit generator provides a decoded bit from the current line as part of the context address, there is a large "bit to context" delay including the access time for the context memory.

Figure 36:
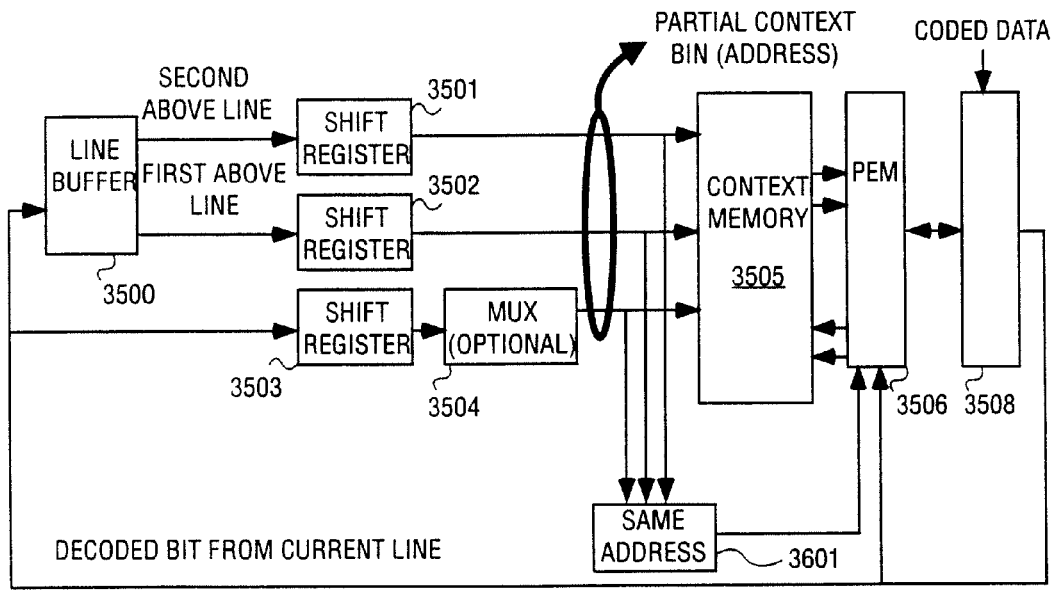
FIG. 36 illustrates an alternate embodiment of a binary context model.

FIG. 36 illustrates an alternative embodiment which utilizes the decoded bit from the current line to access the probability estimation machine in conjunction with a same address block 3601 which receives the outputs of shift register 3501 and 3502 and the output of multiplexor 3504. The PEM 3506 receives the previous bit and uses it to select the proper one out of the pair of context used. The selected context is updated, and both contexts are written back to memory. The same address block 3601 detects addresses that have already been read so that the data is already in the probability estimation machine. The same address block 3801 also sends the signal to use the data already in the PEM (which may be updated data) instead of the stale information in memory.

In one embodiment, the decoder includes 1024 context bins with six bits to describe each probability state. This requires the context memory of 512 times 12 bits. The outputs of shift register 3501 and 3502 along with the output of multiplexor 3504 provide a partial context bin address which only lacks the use of the previous bit. This results in a selection of a pair of context bins from context memory 3505. More than one bit of a context bin can be excluded from the partial context. Each memory location contains $2^n$ probability states, where n is the number of excluded bits.

It should be noted that the "bit to context" delay is reduced. The context memory access can occur before the previous bit is decoded. The processing of the PEM state for both states in a pair can begin in parallel before the previous bit is decoded. High speed operation can be achieved.

Encoder Rate Control

In addition to having the ability to quantize data, performing rate control in the encoder also requires measuring the rate so that decisions on quantization can be made. If the rate indicates that compression is not good (i.e., not at a desired level), quantization may be increased. On the other hand, if the rate indicates that compression is too high, quantization may be decreased. Rate control decisions must be made identically in the encoder and the decoder.

One method of assuring that the encoder and decoder make the same decisions is to use signaling. The encoder measures the rate at predetermined internals and stores the quantization, Q, in memory for future use in the next interval. The decoder simply recalls the quantization from memory for each interval. This would require extra memory. For example, an on-chip SRAM with 256 locations of 2 bits (for indicating a change in Q by +2, +1, 0, −1 or for storing Q as 1, 2, 3, 4) would be enough for changing quantization, Q, for every 16 lines for a 4096 line image.

Figure 34:
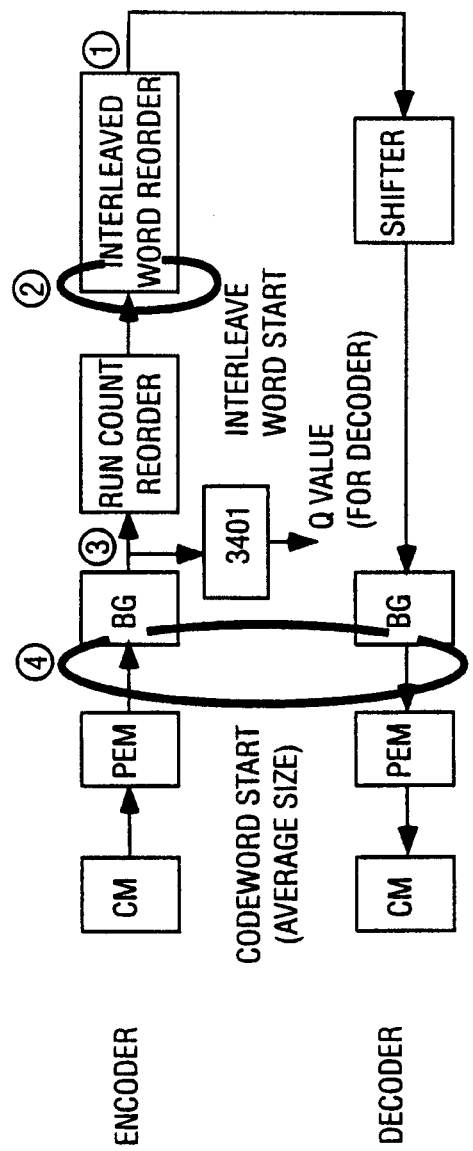
FIG. 34 illustrates an encoder and decoder pair.

There are many options for rate measurement. FIG. 34 illustrates an encoder and decoder pair. Referring to FIG. 34, an encoder/decoder pair is shown containing context models (CM), probability estimation models/machines (PEM) and bit generators (BG), along with a run count reorder unit, interleaved word reorder unit and a shifter. Each of these is well-known in the art. For a description, see U.S. Pat. Nos. 5,381,145 and 5,583,500, assigned to the corporate assignees of the present invention and incorporated herein by reference.

The rate measurement must be explicit if the decoder cannot measure it at the same place. For instance, the rate measurement is provided to the decoder as part of the compressed code stream, for example.

Another option for rate management illustrated as the smaller circle (position 2 in FIG. 34) is to count the start of interleaved words in the encoder. In another embodiment, this is performed after the bit generation stage (position 4 in FIG. 34). Because the encoder and decoder start a codeword at the same time, implicit signaling of the rate may be used. The counting may be performed with counting hardware that comprises a register and an adder that adds the codeword lengths and determines the average codeword length. Hardware to perform the counting and determining average numbers of bits is well-known in the art and is shown in FIG. 34 as block 3401. It would be apparent that this block may be used to take similar measurements at other locations in the system (e.g., positions 1, 2, 3, 4, on both encoder and decoder).

Other options would be to count the size of completed codewords after the bit generator, and before the interleaved word reorder unit (position 3 in FIG. 34), or to determine the amount of data actually written to disk (position 1 in FIG. 34).

Rate measurement can be implicit: both the encoder and decoder perform the same rate determination calculation. For example, the encoder and decoder could accumulate the average size of a codeword each time a new codeword is started. This is represented by position 4 in FIG. 34. (The actual size cannot be used, since the encoder does not know the size until the end of the codeword). If the R-codes used in the core vary in size from R2(0) through R2(7), the average codeword size varies from 1 to 4.5 bits. If probability estimation works well, using the average should be very accurate. In other cases, the differences between the minimum and the maximum codeword lengths versus the average are typically not so great, so the estimate should still be useful. The average size of a Rz(k) codeword is k/2+1 bits.

The goal may be that in almost all cases the most important data will compress well, and no quantization (Q=1) will be required. Only "pathological" images will require quantization (Q>1). Including the quantization feature, however, can guarantee that the system will not break on pathological images.

Another benefit of encoder rate control is that the encoding of less important data can be stopped when the maximum bandwidth is exceeded. This increases the speed of encoding, and decreases the total time to output data (e.g., decrease the total time to print).

Keeping track of the effects of quantization changes (the value of Q) is important. For example, the definition of the largest coefficient in a group of coefficients needs to be consistent when the quantization changes. Also, the reconstruction of quantized coefficients (when bitplanes are discarded) needs to take into account the number of discarded bitplanes for best results.

High-Speed Parallel Coding and Context Model

The entropy coding portion of the present invention comprises two parts. First, high-speed coding cores, operating in parallel, provide probability estimation and bit generation. Second, a context model provides the contexts used for coding.

The number of cores required to achieve the desired speed is application dependent.

The other part of the entropy coding system is the context model for the coefficients of the present invention. There are a large number of trade-offs possible in implementing the context model. In one embodiment, the present invention provides a context model with low hardware cost that provides parallelism to support the use of the high-speed parallel coders of the present invention. Embodiments of the context model are described above.

Although only the context model for wavelet coefficients is described herein, the present invention is not limited to context models that only support wavelet coefficients. For instance, if a bitplane coding mode is desired for binary or spot color images, an additional context model, such as described in U.S. patent application Ser. No. 08/642,518, filed May 3, 1996 and entitled "Compression and Decompression with Wavelet Style and Binary Style Including Quantization by Device-Dependent Parser" and U.S. patent application Ser. No. 08/643,268, filed May 3, 1996 and entitled "Compression/Decompression Using Reversible Embedded Wavelets", can be used.

Parallelism

In one embodiment, four high-speed coding cores are used to encode/decode eight bits per coefficient where coefficients range from 8 to 12 bits (13 if a reversible color space is used). In one embodiment, a core is assigned to each of the four components, simplifying parallelism and data flow. Each coefficient can use up to 16 cycles for encoding/encoding bits (including decisions for look-ahead, etc.).

The present invention maintains the cores for each component in sync, even if some cores are idle because of their successful look-ahead or another core is handling a sign bit after a first "on" bit. The total time for running the context model will vary depending on the data, specifically the effectiveness of look-ahead, and to a lessor extent, the locations of first "on" bits.

Whereas many alterations and modifications of the present invention will no doubt become apparent to a person of ordinary skill in the art after having read the foregoing description, it is to be understood that the particular embodiment shown and described by way of illustration is in no way intended to be considered limiting. Therefore, references to details of the various embodiment are not intended to limit the scope of the claims which in themselves recite only those features regarded as essential to the invention.

I claim:

1. A system comprising:
    a context model to provide context information corresponding to one or more bits to be encoded,
    wherein the context information provides historical information about the one or more bits to be encoded;
    a probability estimation machine coupled to the context model to estimate best representations of the one or more bits from the context model based at least in part on the context information provided by the context model;
    a bit generator coupled to the probability estimation machine to output one or more encoded bits that represent the one or more bits based at least in part on the estimated representations;
    an encoder rate control coupled to an output of the bit generator to control an encoding rate of the one or more bits by determining average codeword length; and
    a signaling block coupled to the encoder rate control to signal a decoder regarding a new quantization level for the one or more bits using header data that is part of a compressed data stream output of an encoder.

2. The system defined in claim 1 wherein the encoder rate control adjusts quantization.

3. The system defined in claim 1 wherein the signaling block generates the header data for the compressed data stream output of the encoder which is concatenated onto the compressed bit stream to indicate to the decoder the new level of quantization.

4. The system defined in claim 1 wherein the encoder rate control stores
    an indication of the quantization level is necessary for subsequent use by the decoder.

5. The system of claim 1, further comprising:
    a counter coupled to the encoder rate control to determine the average codeword length, wherein
    the counter comprises a register and an adder to add codeword lengths and determine the average codeword length from results of the addition.

6. The system of claim 1, wherein the determined average codeword length identifies an encoding rate, and wherein the encoder rate control determines whether the encoding rate indicates that compression is at a desired level and adjusts a compression rate based on the desired level.

7. A method comprising:
    providing, with a context model, information corresponding to one or more bits to be encoded,
    wherein the information provided by the context model provides historical information about the one or more bits to be encoded;
    estimating, with a probability estimation machine coupled with the context model, best representations of the one or more bits based at least in part on the information provided by the context model;
    providing, with a probability estimation machine coupled with the context model, one or more encoded bits that represent the one or more bits based at least in part on the estimated best representations;
    controlling, with an encoder rate control coupled with the probability estimation machine, the encoding rate of the one or more bits by determining average codeword length, and
    signaling, with a signaling block coupled with the encoder rate control, a decoder regarding a new quantization level for the one or more bits using header data that is part of a compressed data stream output of an encoder.

8. The method defined in claim 7 wherein the control of the encoding rate adjusts quantization.

9. The method defined in claim 7 further comprising:
    generating the header data for the compressed data stream output of the encoder which is concatenated onto the compressed bit stream to indicate to the decoder the new level of quantization.

10. The method defined in claim 7 further comprising: storing an indication of the quantization level that is necessary for subsequent use by the decoder.

11. The method defined in claim 7, wherein the encoder codes bit planes of wavelet transformed pixels from the reversible wavelet transform and stored bit planes of wavelet transform pixels.

12. The method defined in claim 7 wherein the encoder codes the most important data of coefficients in a set of coefficients immediately in coefficient order and then codes the less important data and embeds the less important data by order based, in part, on a plurality of signaling bits.

* * * * *